(12) United States Patent
Cheng et al.

(10) Patent No.: US 10,855,043 B2
(45) Date of Patent: Dec. 1, 2020

(54) SYSTEM AND DEVICE WITH LASER ARRAY ILLUMINATION

(71) Applicant: Xiamen Chaoxuan Photoelectric Technology Co., Ltd., Fujian (CN)

(72) Inventors: Siyang Cheng, Fuijan (CN); Peijin Wang, Fuijan (CN); Xiaoyu Wang, Fuijan (CN); Qian Cheng, Fuijan (CN)

(73) Assignee: XIAMEN CHAOXUAN PHOTOELECTRIC TECHNOLOGY CO., LTD., Xiamen (CN)

( * ) Notice: Subject to any disclaimer, the term of this patent is extended or adjusted under 35 U.S.C. 154(b) by 87 days.

(21) Appl. No.: 16/299,047

(22) Filed: Mar. 11, 2019

(65) Prior Publication Data

US 2019/0207357 A1 Jul. 4, 2019

Related U.S. Application Data

(63) Continuation of application No. PCT/CN2016/098763, filed on Sep. 12, 2016.

(51) Int. Cl.
*H01S 3/042* (2006.01)
*H01S 5/024* (2006.01)
(Continued)

(52) U.S. Cl.
CPC ........... *H01S 3/042* (2013.01); *F21V 5/04* (2013.01); *F21V 29/503* (2015.01);
(Continued)

(58) Field of Classification Search
CPC ...... H01S 3/025; H01S 3/042; H01S 5/02236; H01S 5/02476; F21V 29/503; F21V 29/54; F21V 29/56
See application file for complete search history.

(56) References Cited

U.S. PATENT DOCUMENTS

| | | | |
|---|---|---|---|
| 6,517,221 B1 | 2/2003 | Xie | |
| 2008/0157112 A1* | 7/2008 | He | F21K 9/233 |
| | | | 257/98 |
| 2014/0029637 A1* | 1/2014 | Schmidt | H01S 5/02212 |
| | | | 372/44.01 |

FOREIGN PATENT DOCUMENTS

| | | |
|---|---|---|
| CN | 1367555 A | 9/2002 |
| CN | 1185767 C | 2/2003 |

(Continued)

*Primary Examiner* — Karabi Guharay
(74) *Attorney, Agent, or Firm* — Morgan, Lewis & Bockius LLP

(57) ABSTRACT

A system includes: a heat sink module with a plurality of first through-holes linking its top and bottom surfaces and a plurality of grooves on the bottom surface, wherein each groove passes through a respective sequence of the first through-holes; and a driving circuit module with a plurality of conductive connectors and electrical driving surfaces that are disposed substantially perpendicular to the top and bottom surfaces of the heat sink module, wherein each conductive connector lies partially within a respective groove in the bottom surface of the heat sink module, the conductive connectors include internal connectors that each links at least two of the first through-holes in a respective sequence of first through-holes, and external connectors that each links at least one of the first through-holes in a respective sequence of first through-holes to an electrical driving surfaces of the driving circuit module.

22 Claims, 61 Drawing Sheets

(51) Int. Cl.
  *F21V 29/503* (2015.01)
  *F21V 29/508* (2015.01)
  *F21V 29/56* (2015.01)
  *H01S 3/0941* (2006.01)
  *H01S 5/022* (2006.01)
  *H01S 5/40* (2006.01)
  *H01S 3/02* (2006.01)
  *F21V 29/504* (2015.01)
  *F21V 5/04* (2006.01)
  *H01S 3/04* (2006.01)
  *H01S 5/02* (2006.01)
  *H01S 3/06* (2006.01)
  *H01S 3/07* (2006.01)
  *H01S 3/109* (2006.01)
  *F21Y 115/30* (2016.01)
  *F21Y 105/10* (2016.01)

(52) U.S. Cl.
  CPC .......... *F21V 29/504* (2015.01); *F21V 29/508* (2015.01); *F21V 29/56* (2015.01); *H01S 3/025* (2013.01); *H01S 3/0407* (2013.01); *H01S 3/09415* (2013.01); *H01S 5/02236* (2013.01); *H01S 5/02248* (2013.01); *H01S 5/02423* (2013.01); *H01S 5/02438* (2013.01); *H01S 5/02469* (2013.01); *H01S 5/4025* (2013.01); *F21Y 2105/10* (2016.08); *F21Y 2115/30* (2016.08); *H01S 3/0405* (2013.01); *H01S 3/0606* (2013.01); *H01S 3/07* (2013.01); *H01S 3/109* (2013.01); *H01S 5/02* (2013.01); *H01S 5/02212* (2013.01); *H01S 5/02415* (2013.01)

(56) References Cited

FOREIGN PATENT DOCUMENTS

| | | |
|---|---|---|
| CN | 101009418 A | 8/2007 |
| CN | 201174500 Y | 12/2008 |
| CN | 103887687 B | 6/2016 |
| CN | 109690884 A | 4/2019 |
| DE | 8908049 U1 | 8/1989 |
| JP | 2008300596 A | 12/2008 |
| TW | 201824670 A | 7/2018 |
| WO | WO 2018/045597 A1 | 3/2018 |

\* cited by examiner (1)     (2)

(3)

62 Obtain a heat sink module, wherein the heat sink module includes a first surface, a second surface opposite to the first surface, and at least a first through-hole linking the first surface and the second surface 64 Bond the second surface of the heat sink module onto a cooling surface, wherein the cooling surface and the first through-hole form a first cavity with a top opening in the first surface of the heat sink module and a bottom seal in the cooling surface 66 Bond at least a first component of the diode-pumped solid state laser module to the first surface of the heat sink module such that the first component is in thermal contact with the first surface of the heat sink module 68 After bonding the second surface of the heat sink module onto the cooling surface to form the first cavity, partially fill a thermal conductive medium into the first cavity such that the thermal conductive medium is in thermal contact with the cooling surface in the first cavity 70 Insert a second component of the diode-pumped solid state laser module into the first cavity, wherein the second component includes a upper portion and a lower portion supporting the upper portion, and wherein after the insertion, the lower portion of the second component deforms the thermal conductive medium inside the first cavity and achieves thermal contact with the cooling surface through the deformed thermal conductive medium 72 Affix the second component to the heat sink module

Top View (1)

Bottom View (2)

(1)

(2)

(1)

(2)

(1)

(2)

(1)

(2)

(1)

(2)

(1)

(2)

(1)

(2)

(1)

(2)

(1)

(2)

(1)

(2)

(1)

(2)

(1)

(2)

(1)

(2)

(1)

(2)

(1)

(2)

SYSTEM AND DEVICE WITH LASER ARRAY ILLUMINATION

RELATED APPLICATIONS

This application is a continuation of PCT Application No. PCT/CN2016/098763, filed Sep. 12, 2016, the content of which is incorporated by reference herein in its entirety.

FIELD

The present disclosure relates to illumination systems, in particular, illumination systems that include laser arrays as light sources.

BACKGROUND

Systems and devices with laser array illumination are widely applicable, e.g., in image projection, lighting, advertisement display, etc. in both large scale public viewing settings and in medium or small indoor settings.

When constructing systems and devices with laser array illumination, special attention is required to ensure optical alignment, sufficient illumination power, and proper device cooling during normal operation. In addition, electronic driving circuit control of the individual laser components is also needed. When a relatively low cost and compact system is desired, meeting such design requirements becomes particularly challenging.

In general, many systems and devices that use laser array illumination employ laser arrays of semiconductor diode lasers or diode-pumped solid state lasers (DPSSLs) as their light sources. The semiconductor diode lasers are typically in a TO-CAN packaged form and are arranged in a grid pattern within a support substrate structure that includes integrated driving and cooling layers. The diode-pumped solid state lasers may be packaged in individual enclosures with independent cooling and driving systems and then mounted onto a common support structure according to a desired grid pattern. The two types of lasers have different characteristics and advantages, and individualized designs are needed to better utilize them in systems and devices for laser array illumination.

SUMMARY

A method of assembling a diode-pumped solid state laser module, includes: obtaining a heat sink module, wherein the heat sink module includes a first surface, a second surface opposite to the first surface, and at least a first through-hole linking the first surface and the second surface; bonding the second surface of the heat sink module onto a cooling surface, wherein the cooling surface and the first through-hole form a first cavity with a top opening in the first surface of the heat sink module and a bottom seal in the cooling surface; bonding at least a first component of the diode-pumped solid state laser module to the first surface of the heat sink module such that the first component is in thermal contact with the first surface of the heat sink module; after bonding the second surface of the heat sink module onto the cooling surface to form the first cavity, partially filling a thermal conductive medium into the first cavity such that the thermal conductive medium is in thermal contact with the cooling surface in the first cavity; inserting a second component of the diode-pumped solid state laser module into the first cavity, wherein the second component includes a upper portion and a lower portion supporting the upper portion, and wherein after the insertion, the lower portion of the second component deforms the thermal conductive medium inside the first cavity and achieves thermal contact with the cooling surface through the deformed thermal conductive medium; and affixing the second component to the heat sink module.

A diode-pumped solid state laser module includes: a heat sink module, wherein the heat sink module includes a first surface, a second surface opposite to the first surface, and at least a first through-hole linking the first surface and the second surface; a cooling module, wherein the cooling module includes a cooling surface and a thermoelectric cooling system, and a heat dissipater, wherein the second surface of the heat sink module is bonded onto the cooling surface of the cooling module, and wherein the cooling surface of the cooling module and the first through-hole in the heat sink module form a first cavity with a top opening in the first surface of the heat sink module and a bottom seal in the cooling surface of the cooling module; thermal conductive medium partially filled within the first cavity formed by the cooling surface of the cooling module and the first through-hole in the heat sink module; a first component of the diode-pumped solid state laser module, wherein the first component of the diode-pumped solid state laser is bonded to the first surface of the heat sink module such that the first component is in thermal contact with the first surface of the heat sink module; and a second component of the diode-pumped solid state laser module, wherein the second component of the diode-pumped solid state laser module is partially inserted into the first cavity formed by the cooling surface of the cooling module and the first through-hole in the heat sink module, wherein the second component includes a upper portion and a lower portion supporting the upper portion, wherein the lower portion of the second component deforms the thermal conductive medium inside the first cavity and achieves thermal contact with the cooling surface through the deformed thermal conductive medium, and wherein the second component is affixed to the heat sink module.

A system (e.g., a laser diode array module or a component thereof) includes: a heat sink module, wherein: the heat sink module includes a respective top surface, a respective bottom surface opposite to the respective top surface of the heat sink module, and a plurality of first stepped through-holes linking the respective top surface and the respective bottom surface of the heat sink module, each first stepped through-hole has a respective cylindrical upper portion and a respective cylindrical lower portion that is narrower than the respective cylindrical upper portion of said each first stepped through-hole, the respective cylindrical upper portion and the respective cylindrical lower portion of said each first stepped through-hole are joined by a respective first ring-shaped surface, and the respective bottom surface of heat sink module includes a plurality of grooves, wherein each groove passes through the respective lower portions of a respective sequence of first stepped through-holes among the plurality of first stepped through-holes in the heat-sink module; and a driving circuit module, wherein: the driving circuit module includes a plurality of conductive lead connectors, and one or more electrical driving surfaces that are disposed substantially perpendicular to the respective top and bottom surfaces of the heat sink module, each conductive lead connector lies at least partially within a respective one of the plurality of grooves in the respective bottom surface of the heat sink module, the plurality of conductive lead connectors includes a set of internal lead connectors and a set of external lead connectors, each of the set of internal lead connectors links at least two of the first stepped through-holes in the respective sequence of first stepped through-holes passed by the respective one of the plurality of grooves in the respective bottom surface of the heat sink module, and each of the set of external lead connectors links at least one of the first stepped through-holes in the respective sequence of first stepped through-holes passed by the respective one of the plurality of grooves in the respective bottom surface of the heat sink module to at least one of the one or more electrical driving surfaces of the driving circuit module that are disposed substantially perpendicular to the respective top and bottom surfaces of the heat sink module.

A system (e.g., a double-sided laser diode array module or a component thereof) comprises: a cooling module having a first side and a second side opposite the first side, and a cooling mechanism disposed between the first side and the second side of the cooling module; a first heat sink module having a respective top surface, a respective bottom surface opposite the respective top surface of the first heat sink module, and a respective plurality of first through-holes linking the respective top and bottom surfaces of the first heat sink module, wherein the respective bottom surface of the heat sink module is disposed next to the first side of the cooling module; a first plurality of laser diodes, wherein each of the first plurality of laser diodes includes a respective diode body, a respective set of conductive leads, and a respective support plate between the respective diode body and the respective set of conductive leads, wherein each of the first plurality of laser diodes is disposed at least partially within a respective one of the respective plurality of first through-holes in the first heat sink module with the respective diode body disposed next to the respective top surface of the first heat sink module and the respective set of conductive leads disposed next to the bottom surface of the first heat sink module; a first driving circuit module including a respective plurality of conductive lead connectors and respective one or more electrical driving surfaces, wherein the respective one or more electrical driving surfaces of the first driving circuit module are disposed substantially perpendicular to the respective top and bottom surfaces of the first heat sink module, and wherein the respective plurality of conductive lead connectors of the first driving circuit module connect the respective set of conductive leads of the first plurality of laser diodes to the respective one or more electrical driving surfaces of the first driving circuit module; a second heat sink module having a respective top surface, a respective bottom surface opposite the respective top surface of the second heat sink module, and a respective plurality of second through-holes linking the respective top and bottom surfaces of the second heat sink module, wherein the respective bottom surface of the heat sink module is disposed next to the second side of the cooling module; a second plurality of laser diodes, wherein each of the second plurality of laser diodes includes a respective diode body, a respective set of conductive leads, and a respective support plate between the respective diode body and the respective set of conductive leads, wherein each of the second plurality of laser diodes is disposed at least partially within a respective one of the respective plurality of second through-holes in the second heat sink module with the respective diode body disposed next to the respective top surface of the second heat sink module and the respective set of conductive leads disposed next to the bottom surface of the second heat sink module; and a second driving circuit module including a respective plurality of conductive lead connectors and respective one or more electrical driving surfaces, wherein the respective one or more electrical driving surfaces of the second driving circuit module are disposed substantially perpendicular to the respective top and bottom surfaces of the second heat sink module, and wherein the respective plurality of conductive lead connectors of the second driving circuit module connect the respective set of conductive leads of the second plurality of laser diodes to the respective one or more electrical driving surfaces of the second driving circuit module.

A system comprises: a heat sink module having a respective top surface, a respective bottom surface opposite the respective top surface of the heat sink module, a first plurality of first through-holes linking the respective top and bottom surfaces of the heat sink module, a second plurality of second through-holes linking the respective top and bottom surfaces of the heat sink module, wherein the first plurality of first through-holes are arranged according to a first grid pattern and the second plurality of second through-holes are arranged according to a second grid pattern, and wherein the first grid pattern and the second grid pattern are offset from each other; a first plurality of laser diodes, wherein each of the first plurality of laser diodes includes a respective diode body, a respective set of conductive leads, and a respective support plate between the respective diode body and the respective set of conductive leads, wherein each of the first plurality of laser diodes is disposed at least partially within a respective one of the first plurality of first through-holes in the heat sink module with the respective diode body disposed next to the respective top surface of the heat sink module and the respective set of conductive leads disposed next to the respective bottom surface of the heat sink module; a second plurality of laser diodes, wherein each of the second plurality of laser diodes includes a respective diode body, a respective set of conductive leads, and a respective support plate between the respective diode body and the respective set of conductive leads, wherein each of the second plurality of laser diodes is disposed at least partially within a respective one of the second plurality of second through-holes in the heat sink module with the respective diode body disposed next to the respective bottom surface of the heat sink module and the respective set of conductive leads disposed next to the respective top surface of the heat sink module; and a driving circuit module including a respective plurality of conductive lead connectors and respective one or more electrical driving surfaces, wherein the respective one or more electrical driving surfaces of the driving circuit module are disposed substantially perpendicular to the respective top and bottom surfaces of the heat sink module, wherein a first subset of conductive lead connectors among the respective plurality of conductive lead connectors of the driving circuit module connect the respective set of conductive leads of the first plurality of laser diodes to the respective one or more electrical driving surfaces of the driving circuit module, and wherein a second subset of conductive lead connectors among the respective plurality of conductive lead connectors of the driving circuit module connect the respective set of conductive leads of the second plurality of laser diodes to the respective one or more electrical driving surfaces of the driving circuit module.

A system comprises: a heat sink module, wherein: the heat sink module includes a respective top surface, a respective bottom surface opposite to the respective top surface of the heat sink module, and a plurality of first through-holes linking the respective top surface and the respective bottom surface of the heat sink module, and the respective bottom surface of heat sink module includes a plurality of grooves, wherein each groove passes through the respective lower portions of a respective sequence of first through-holes among the plurality of first through-holes in the heat-sink module; and a driving circuit module, wherein: the driving circuit module includes a plurality of conductive lead connectors, and one or more electrical driving surfaces that are disposed substantially perpendicular to the respective top and bottom surfaces of the heat sink module, each conductive lead connector lies at least partially within a respective one of the plurality of grooves in the respective bottom surface of the heat sink module, the plurality of conductive lead connectors include a set of internal lead connectors and a set of external lead connectors, each of the set of internal lead connectors links at least two of the first through-holes in the respective sequence of first through-holes passed by the respective one of the plurality of grooves in the respective bottom surface of the heat sink module, and each of the set of external lead connectors links at least one of the first through-holes in the respective sequence of first through-holes passed by the respective one of the plurality of grooves in the respective bottom surface of the heat sink module to at least one of the one or more electrical driving surfaces of the driving circuit module that are disposed substantially perpendicular to the respective top and bottom surfaces of the heat sink module.

Other embodiments and advantages are apparent to those skilled in the art in light of the descriptions and drawings in this specification.

BRIEF DESCRIPTION OF THE DRAWINGS

FIG. 1F is a flowchart of an exemplary method 60 for assembling a diode-pumped solid state laser module (e.g., the diode-pumped solid state lasers 20 and 30 in FIGS. 1B and 1E), in accordance with some embodiments.

FIGS. 2AA-2AB illustrate components of the exemplary heat sink module shown in FIG. 2Z in accordance with some embodiments.

FIG. 2AC illustrates the top and bottom views of another exemplary heat sink module in accordance with some embodiments.

FIG. 2AD illustrates the top and bottom views of another exemplary heat sink module in accordance with some embodiments.

FIGS. 2AE-2AG illustrate components and internal structures of the exemplary heat sink module shown in FIG. 2AD in accordance with some embodiments.

FIGS. 2AH-2AI illustrate exploded views of two exemplary laser array modules that are variations of the laser array module shown in FIG. 2C, in accordance with some embodiments.

FIGS. 2AJ-2AK illustrate an exemplary lens array substrate layer that is a variation of the lens array substrate layer shown in FIG. 2D, in accordance with some embodiments.

FIG. 2AL illustrates an exemplary heat sink module that is a variation of the exemplary heat sink module shown in FIG. 2E, in accordance with some embodiments.

FIGS. 2AM-2AS illustrate exemplary laser array modules that are variations of the laser array module shown in FIG. 2H-(2), in accordance with some embodiments.

FIGS. 2AT-2AU illustrate exploded views of two exemplary laser array modules that are variations of the laser array module shown in FIG. 2M, in accordance with some embodiments.

FIG. 2AV illustrates an exemplary integrated heat sink/cooling module that is a variation of the integrated heat sink/cooling module shown in FIG. 2N, in accordance with some embodiments.

FIG. 2AW illustrates an exemplary integrated heat sink/cooling module that is a variation of the integrated heat sink/cooling module shown in FIG. 2O, in accordance with some embodiments.

FIG. 2AX illustrates an exemplary integrated heat sink/cooling module that is a variation of the integrated heat sink/cooling module shown in FIG. 2P, in accordance with some embodiments.

FIG. 2AY illustrates an exemplary lens array module that is a variation of the lens array module shown in FIG. 2X, in accordance with some embodiments.

FIG. 2AZ illustrates an exemplary heat sink/cooling module that is a variation of the integrated heat sink/cooling module shown in FIG. 2Z, in accordance with some embodiments.

FIG. 2BA illustrates an exemplary integrated heat sink/cooling module that is a variation of the integrated heat sink/cooling module shown in FIG. 2AA, in accordance with some embodiments.

FIG. 2BB illustrates an exemplary integrated heat sink/cooling module that is a variation of the integrated heat sink/cooling module shown in FIG. 2AC, in accordance with some embodiments.

FIG. 2BC illustrates an exemplary integrated heat sink/cooling module that is a variation of the integrated heat sink/cooling module shown in FIG. 2AD, in accordance with some embodiments.

FIG. 2BD illustrates an exemplary heat sink element that is a variation of the heat sink element shown in FIG. 2AF-(2), in accordance with some embodiments.

FIG. 2BE illustrates an exemplary integrated heat sink/cooling module that is a variation of the integrated heat sink/cooling module shown in FIG. 2AG, in accordance with some embodiments.

Like reference numerals refer to corresponding parts throughout the drawings.

DETAILED DESCRIPTION

As introduced in the Background section, in addition to diode lasers, diode-pumped solid state lasers can also be used in laser lighting, laser imaging, and laser display applications. Typically, a diode-pumped solid state laser has a much higher power output than a semiconductor diode laser. For example, the output of a typical diode-pumped solid state laser may be a few times to dozens of times that of a typical semiconductor diode laser. The higher output of diode-pumped solid state laser can sometimes lead to a reduction in the number of lasers required in a device, and possibly a smaller device footprint and simpler driving controls. In addition, diode-pumped solid state lasers also enjoy a higher electricity-to-light conversion efficiency among different types of solid state lasers.

In general, a diode-pumped solid state laser includes a diode laser chip, and one or more laser crystals (e.g., including one or more lasing crystals, and/or one or more non-linear frequency conversion crystals). Common examples of lasing crystals (also referred to as lasing medium) include Neodymium-doped Yttrium Aluminium Garnet (Nd:YAG), Neodymium-doped Yttrium Orthovanadate (Nd:YVO4), Neodymium:Gadolinium Vanadate (Nd:GdVO4), etc. Common examples of the non-linear frequency conversion crystals include Lithium Triborate (LBO), Potassium Titanyl Phosphate (KTP), Magnesium-doped Periodically Poled Lithium Niobate (MgO:PPLN), Periodically Poled Lithium Tantalate (PPLT) and Periodically Poled Stoichiometric Lithium Tantalate (PPSLT).

Figure 1A:
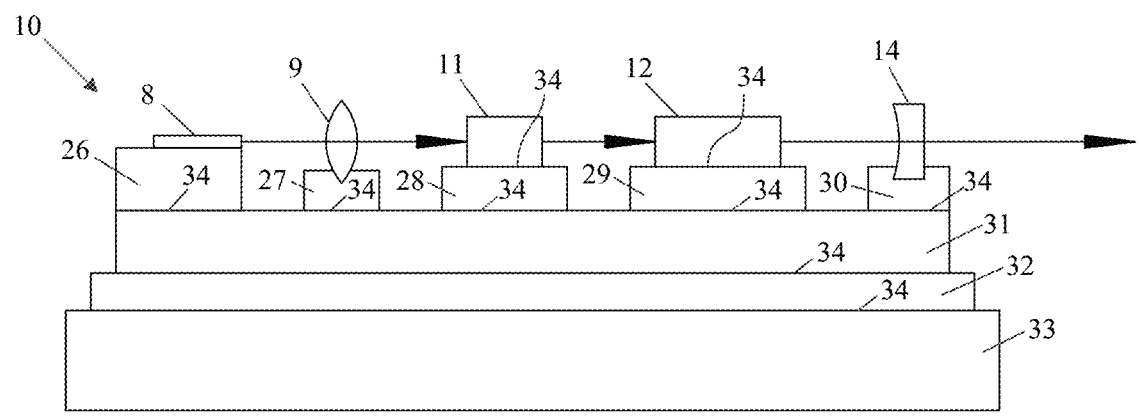
FIG. 1A is a side view schematic of an exemplary conventional diode-pumped solid state laser module.

FIG. 1A is a side view schematic of an exemplary conventional diode-pumped solid state laser 10. The diode-pumped solid state laser 10 includes a resonance cavity. Typically, the output wavelengths of the diode-pumped solid state laser 10 can be 671 nm, 532 nm, 456 nm, etc. As shown in FIG. 1A, the diode-pumped solid state laser 10 includes a diode laser chip 8, a convergent lens 9, a lasing crystal 11, a non-linear frequency conversion crystal 12, an output mirror 14, and various support structures for the above components. For example, the diode laser chip 8 is affixed onto an onboard heat sink 26, forming a respective laser component. The heat created during the operation of the diode laser chip 8 is transmitted to the onboard heat sink 26. In some embodiments, the convergent lens 9 is affixed to a lens seat 27, forming a respective laser component. The lasing crystal 11 is affixed to a crystal seat 28, forming a respective laser component (e.g., a laser crystal module). Thermal conductive medium 34 is filled between the lasing crystal 11 and the crystal seat 28 to improve thermal contact between the lasing crystal 11 and the crystal seat 28. The heat created during the operation of the lasing crystal 11 is transmitted to the crystal seat 28 through the thermal conductive medium 34. The non-linear frequency conversion crystal 12 is affixed to the crystal seat 29, forming a respective laser component. Thermal conductive medium 34 is filled between the non-linear frequency conversion crystal 12 and the crystal seat 29 to improve thermal contact between the non-linear frequency conversion crystal 12 and the crystal seat 29. The heat created during the operation of the non-linear frequency conversion crystal 12 is transmitted to the crystal seat 29 through the thermal conductive medium 34. The output mirror 14 of the resonance cavity for the laser 10 is affixed to a mirror seat 30, forming a respective laser component. Other laser components that have respective upper portions affixed to respective lower portions are possible, where the upper portions generate heat during operation, and the heat is transmitted to the respective lower portions.

In the conventional diode-pumped solid state laser 10, the onboard heat sink 26, the lens seat 27, the crystal seat 28, the crystal seat 29, and the mirror seat 30 are affixed to a common laser heat sink module 31 (e.g., to the top surface of the laser heat sink module 31), with thermal conductive medium 34 filled between the top surface of the common laser heat sink module 31 and the various laser components that are affixed to the laser heat sink 31. During operation, the heat created in the various laser components are transmitted to the laser heat sink module 31 from the lower portions of the various laser components (e.g., from the onboard heat sink 26, the lens seat 27, the crystal seat 28, the crystal seat 29, and the mirror seat 30 to the laser heat sink module 31). In addition, the laser heat sink module 31 is rigid and maintains the relative positions of the various components that are affixed to the top surface of the laser heat sink module 31, thereby maintaining the stability of the optical path within the diode-pumped solid state laser 10 and ensuring the stable operation thereof.

On the other side (e.g., the bottom surface) of the laser heat sink module 31, the laser heat sink module 31 is in thermal contact with the cooling surface of a thermoelectric cooling device 32 (e.g., a thermoelectric cooler (TEC)). The heating surface of the thermoelectric cooling device 32 is opposite to the cooling surface of the thermoelectric cooling device 32, and is connected to a heat dissipater 33. Thermal conductive medium 34 is filled between the bottom surface of the laser heat sink module 31 and the cooling surface of the thermoelectric cooling device 32, and between the heating surface of the thermoelectric cooling device 32 and the heat dissipater 33.

The onboard heat sink 26, the crystal seat 28, the crystal seat 29, the laser heat sink module 31 can be made from conductive or insulating thermal conductive materials, such as copper, aluminum nitrate ceramics, etc. The lens seat 27 and the mirror seat 30 can be made from conductors or insulators, such as glass, metals, etc. The heat dissipater 33 can utilize gas or liquid cooling. The thermal conductive medium 34 can be made from conductors or insulators, such as indium foil, conductive silicone, conductive silver adhesive, and/or phase change thermal conducting materials, etc.

In a conventional diode-pumped solid state laser, such as the diode-pumped solid state laser 10 shown in FIG. 1A, the laser chip, the various laser crystals, lenses, and mirrors individually transmit heat to one or more respective heat sinks and seats, and realize thermal exchange with the TEC through these respective heat sinks and seats. In addition, the heat sinks and seats are used to affix the laser chip and the various laser crystals, lenses, and mirrors in order to maintain stability of the optical path in the laser. Some drawbacks involved in this conventional configuration include thermal interference of the various components of the laser, and inefficient heat transfer due to the thermal resistance existing between the various component interfaces.

An improved diode-pumped solid state laser as disclosed herein allows some components (e.g., the laser component including the laser chip and its onboard heat sink, and the laser components including various crystals with their respective crystal seats, etc.) of the laser to be affixed directly on the cooling surface of the TEC to achieve direct thermal contact with the TEC and exchange heat directly with the TEC, thereby reducing the thermal interference between these components and other laser components that are not directly affixed to the TEC, and improving the efficiency of the heat dissipation.

In the example diode-pumped solid state laser 10 shown in FIG. 1A, the onboard heat sink 26, the crystal seat 28 and the crystal seat 29 are in thermal contact with the same laser heat sink module 31. Because the diode laser chip 8 is the component that produces the most heat in the laser 10, most of the heat transmitted to the laser heat sink 31 is from the onboard heat sink 26. Consequently, the lasing crystal 11 and the non-linear frequency conversion crystal 12 will be thermally affected by the heat generated by the diode laser chip 8. The operation stability of the laser chip 8 greatly depends on the operation temperature. The optical properties of the lasing crystal 11 and the non-linear frequency conversion crystal 12 also depend on efficient thermal exchange with the TEC 32.

Figure 1B:
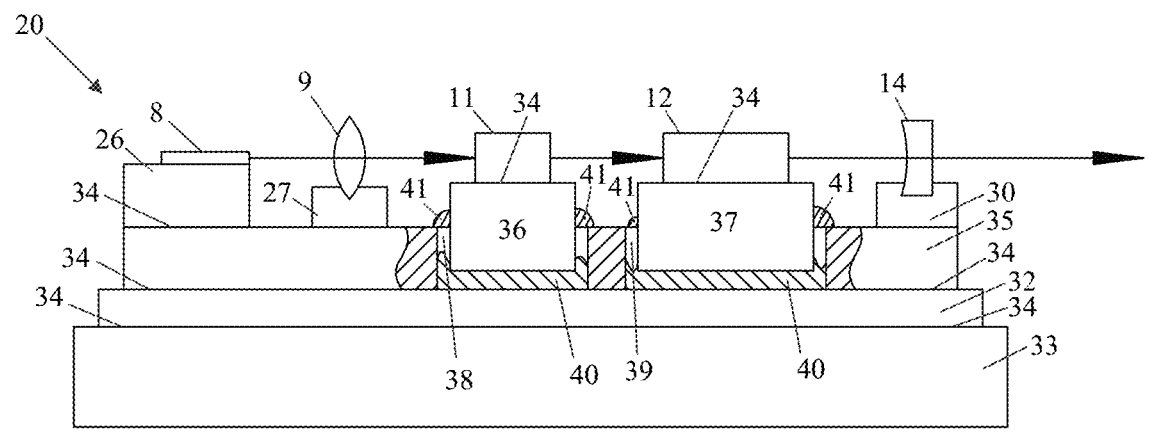
FIG. 1B is a side view schematic of an exemplary diode-pumped solid state laser module in accordance with some embodiments.

As shown in FIG. 1B, an exemplary diode-pumped solid state laser 20 is an improvement over the conventional diode-pumped solid state laser 10, in accordance with some embodiments. For easy illustration, the diode-pumped solid state laser 20 is substantially similar to the conventional diode-pumped solid state laser 10, except for the configuration of the common laser heat sink and the positions of the laser crystal modules relative to the common laser heat sink. As shown in FIG. 1B, instead of the common laser heat sink 31, a new laser heat sink 35 is used between the various laser components (e.g., laser chip 8 with the onboard heat sink 26, the lens 9 with the lens seat 27, the lasing crystal 11 with its crystal seat, the non-linear frequency conversion crystal 12 with its crystal seat, and the output mirror 14 with the mirror seat 30) and the TEC 32. In some embodiments, the new laser heat sink module 35 is substantially similar to the conventional laser heat sink module 31, but with at least one through-hole (e.g., two through-holes 38 and 39) created between its top surface and its bottom surface, as shown in FIG. 1B.

As shown in the FIG. 1B, a crystal seat 36 (e.g., a cylindrical crystal seat) and a crystal seat 37 are placed within the through-holes 38 and 39, respectively. The crystal seats 36 and 37 are placed as close to the cooling surface of the TEC 32 as possible, with thermal conductive medium 40 (e.g., thermal conductive medium 40 can be the same as thermal conductive medium 34 or different from thermal conductive medium 34) applied between the cooling surface of the TEC 32 and the bottom surfaces of the crystal seats 36 and 37. In addition, the crystal seats 36 and 37 are affixed to the laser heat sink 35 (e.g., the crystal seats 36 and 37 are glued to the top surface of the laser heat sink 35 with glue dots 41 around one or more points around the gap between the sides of the crystal seats 36 and 37 and the inner surfaces of the through-holes 38 and 39 or the top surface of the laser heat sink module 35). Other methods of affixing the crystal seats to the laser heat sink (e.g., using screws or other mechanical fastening mechanisms) are possible. During operation, heat is transmitted from the lasing crystal 11 to the crystal seat 36 (e.g., through the thermal conductive medium 34), and then to the cooling surface of the TEC 32 (e.g., through the thermal conductive medium 40); and heat is transmitted from the non-linear frequency conversion crystal 12 to the crystal seat 37 (e.g., through the thermal conductive medium 34), and then to the cooling surface of the TEC 32 (e.g., through the thermal conductive medium 40). The heat generated by the laser chip 8 is transmitted to the onboard heat sink 26 and then from the onboard heat sink 26 to the laser heat sink 35. Since the crystal seats 36 and 37 are not in direct thermal contact with the laser heat sink module 35, the heat generated by the laser chip 8 does not greatly impact the operating temperatures of the lasing crystal 11 and the non-linear frequency conversion crystal 12, thereby improving the operation stability of these laser crystals.

Figure 1C:
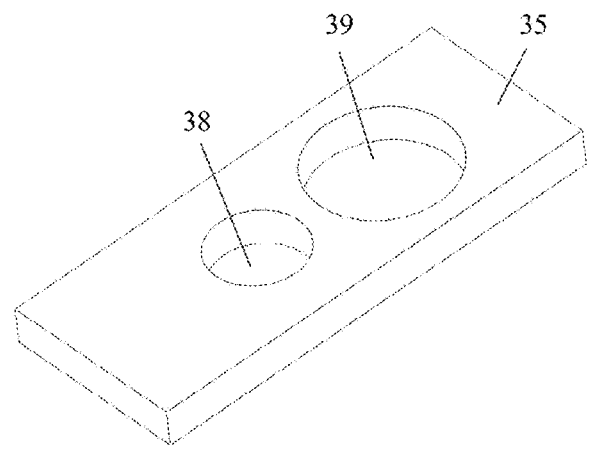
FIG. 1C illustrates an exemplary heat sink module in accordance with some embodiments.

FIG. 1C illustrates an exemplary laser heat sink 35 with two cylindrical through-holes 38 and 39 going from the top surface to the bottom surface of the laser heat sink module 35 in accordance with some embodiments. In some embodiments, additional through-holes may be present in the laser heat sink module 35 to accommodate additional laser components (e.g., one or more additional mirrors, lenses, and crystals, with respective seats and/or heat sinks thereof) in the diode-pumped solid state laser 20.

Figure 1D:
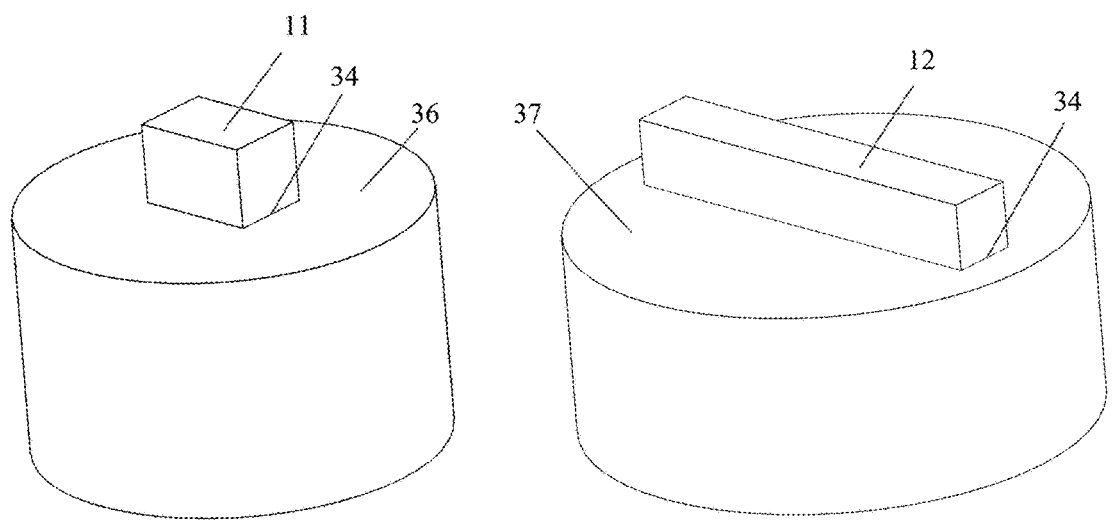
FIG. 1D illustrates three exemplary laser crystal components in accordance with some embodiments.
Figure 1D:
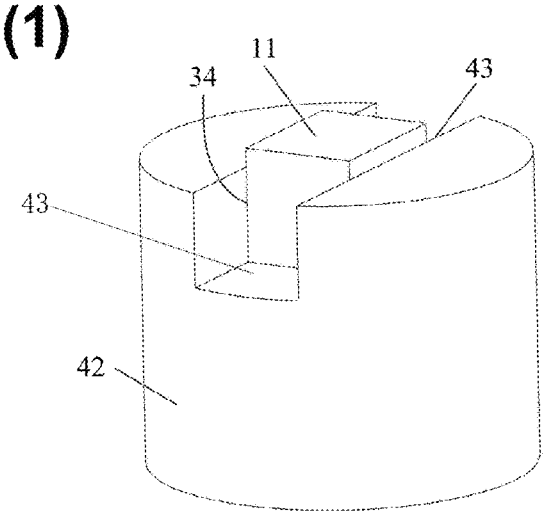

FIG. 1D-(1) illustrates an exemplary lasing crystal 11 affixed to a cylindrical laser crystal seat 36, with thermal conductive medium 34 applied between the lasing crystal 11 and the laser crystal seat 36, in accordance with some embodiments. FIG. 1D-(2) illustrates an exemplary non-linear frequency conversion crystal 12 affixed to a cylindrical laser crystal seat 37, with thermal conductive medium 34 applied between the non-linear frequency conversion crystal 12 and the crystal seat 37, in accordance with some embodiments.

Although the crystal seats 36 and 37 and the through-holes 38 and 39 are shown to be cylindrical with circular cross-sections in FIGS. 1D-(1) and 1D-(2), other cross-sectional shapes (e.g., oval, square, rectangular, customized, etc.) are possible in accordance with various embodiments. In general, the cross-sectional shapes of the crystal seats and the cross-sectional shapes of the through-holes are geometrically similar, such that the placement of the crystal seats within the through-holes can be centered easily. In addition, although crystal seats are used in the examples shown in FIGS. 1B, 1D-(1) and 1D-(2) as the lower portions of the laser components that are placed in direct contact with the cooling surface of the TEC, a person skilled in the art would understand that the lower portions of the other types of laser components (e.g., an onboard heat sink of a laser chip, a mirror seat of a mirror, and/or a lens seat of a lens, etc.) can also be placed in direct contact with the TEC through respective through-holes created in the common laser heat sink module placed above the TEC. The key is that some laser components are placed in indirect thermal contact with the TEC through a common heat sink module (e.g., the heat sink module 35), while other laser components are placed in direct thermal contact with the TEC through respective through-holes created in the common heat sink module. This way, thermal interference between the two groups of laser components can be reduced. In some embodiments, a laser component may be an integrated component with no apparent structural division between its upper and lower portions, and in such cases, the points of affixation to the walls or upper edges of the through-hole may be considered to be the start of the lower portion of the laser component.

In some embodiments, in order to improve the thermal contact between the upper portion (e.g., the lasing crystal 11) and the lower portion (e.g., the crystal seat 36) of a laser component, and to reduce the thermal resistance between the upper and the lower portions of the laser component, a linear recess is created within the lower portion of the laser component (e.g., the crystal seat 36) to hold its corresponding upper portion (e.g., the lasing crystal 11). The linear recess runs along the direction of the optical path in the laser, and the cross-sectional shape of the linear recess matches the shape of the upper portion that would fit within the linear recess. For example, FIG. 1D-(3) shows an exemplary crystal seat 42 with a linear recess 43 created in its top surface. The linear recess 43 runs through the top portion of the crystal seat 42, such that when a laser crystal (e.g., the lasing crystal 11) is placed within the recess 43, the optical path that passes through the laser crystal runs through the recess 43 without being blocked by the crystal seat 42. As shown in FIG. 1D-(3), the linear recess 43 is shaped and sized such that its inner surfaces are in thermal contact with the laser crystal not only on the bottom side of the laser crystal, but also on two sidewalls of the laser crystal 11, thereby increasing thermal contact area and reducing thermal resistance between the lasing crystal 11 and the crystal seat 42.

Although the design in FIG. 1D shows that the upper portion (e.g., the lasing crystal 11) of the laser component within the through-hole (e.g., the through-hole 38) remains outside of the through-hole, in some embodiments, the entire component can be located within the through-hole. For example, in some embodiments, the crystal seat 42 shown in FIG. 1D may have a linear recess that is sufficiently deep such that the top of the crystal 11 is below the upper surface of the crystal seat 42. In some embodiments, the crystal 11 is still located above the top surface of the heat sink module (e.g., heat sink module 35), while in other embodiments, the crystal 11 may optionally be below the top surface of the heat sink module, provided that the structure of the heat sink module is such that it does not block the optical path of the crystal 11.

Figure 1E:
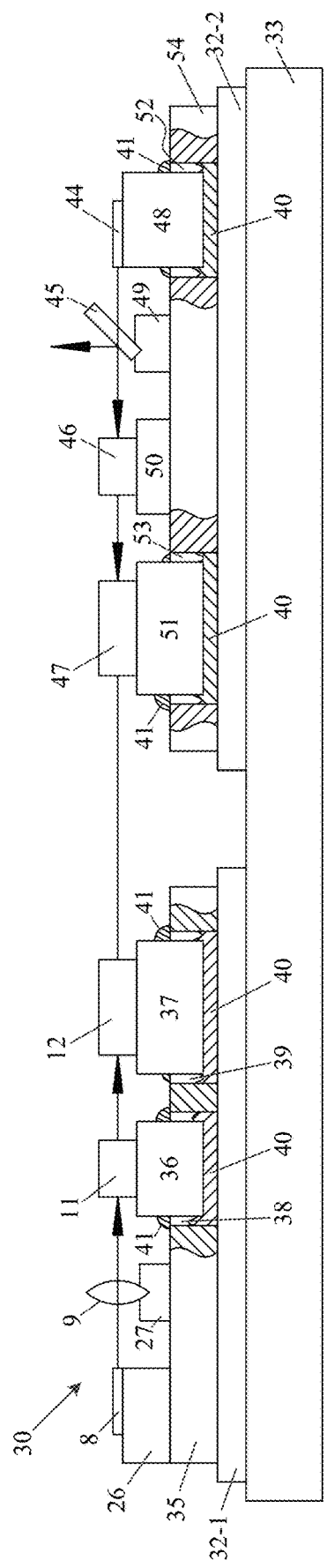
FIG. 1E is a side view schematic of a diode-pumped solid state laser module in accordance with some embodiments.

The above designs of the laser heat sink and the crystal seats shown in FIGS. 1B-1D are merely illustrative. In some embodiments, the same principles illustrated through the embodiments shown in FIGS. 1B-1D also apply to additional components, such as lenses, lens seats, mirrors, mirror seats, diode chips, and their respective support structures and/or onboard heat sinks. Furthermore, the number of the different types of components may be more than one in a single laser. For example, there may be more than one laser crystal, non-linear frequency conversion crystal, lens, mirror, diode chip, etc. in the optical path of a single laser. In some embodiments, more than one of the laser heat sink modules with through-holes may be used in a laser. For example, FIG. 1E illustrates an exemplary diode-pumped solid state laser 30 in accordance with some embodiments. The diode-pumped solid state laser 30 includes two separate TECs, namely TEC 32-1, and TEC 32-2, where TEC 32-1 is in thermal contact with the laser heat sink module 35 and TEC 32-2 is in thermal contact with a laser heat sink module 54. As shown in FIG. 1E, both TEC 32-1 and TEC 32-2 are in thermal contact with a heat dissipater 33.

As shown in FIG. 1E, the laser heat sink module 35 includes two through-holes 38 and 39, with the crystal seat 36 and the crystal seat 37 respectively occupying each of the through-holes 38 and 39 in the laser heat sink module 35. Similarly, the laser heat sink module 54 also includes two through-holes 52 and 53, with a crystal seat 51 (e.g., supporting a non-linear frequency conversion crystal 47) and an onboard heat sink 48 (e.g., supporting a diode laser chip 44) respectively occupying each of the through-holes 53 and 52 in the laser heat sink module 54. Other components of the laser, e.g., the laser chip 8 with its onboard heat sink 26, the lens 9 with its lens seat 27, the lasing crystal 46 with its crystal seat 50, the beam splitter 45 with its seat 49 are affixed to the laser heat sink modules 35 and 54, respectively. Other configurations of the diode-pumped solid state lasers are possible.

FIG. 1F is a flowchart of a method 60 for assembling a diode-pumped solid state laser module (e.g., the diode-pumped solid state lasers 20 and 30 in FIGS. 1B and 1E), in accordance with some embodiments.

In some embodiments, a heat sink module (e.g., the laser heat sink module 35 in FIGS. 1B, 1C, and 1E, and the laser heat sink module 54 in FIG. 1E) is (62) obtained, where the heat sink module includes a first surface (e.g., a top surface), a second surface (e.g., a bottom surface) opposite to the first surface, and at least a first through-hole (e.g., the through-hole 38 or 39 in FIGS. 1B, 1C, and 1E, and the through-holes 52 or 53 in FIG. 1E) linking the first surface and the second surface.

The second surface (e.g., the bottom surface) of the heat sink module (e.g., laser heat sink 35 in FIGS. 1B and 1E, or the laser heat sink 54 in FIG. 1E) is (64) bonded onto a cooling surface (e.g., the cooling surface of the TEC 32 in FIGS. 1B and 1E), where the cooling surface and the first through-hole form a first cavity (e.g., a cylindrical cavity)

with a top opening in the first surface (e.g., top surface) of the heat sink module and a bottom seal in the cooling surface (e.g., the cooling surface of TEC 32 in FIGS. 1B and 1E).

At least a first component (e.g., the onboard heat sink 26 supporting the laser chip 8 in FIGS. 1B and 1E, the lens 9 with the lens seat 27 in FIGS. 1B and 1E, the crystal seat 54 supporting the laser crystal 46 in FIG. 1E, and mirror seat 49 supporting the beam splitter 45 in FIG. 1E) of the diode-pumped solid state laser module is bonded (66) to the first surface (e.g., top surface) of the heat sink module (e.g., the laser heat sink module 35 in FIG. 1B or 1E, or the laser heat sink 54 in FIG. 1E) such that the first component is in thermal contact with the first surface of the heat sink module. For example, there is at least one component in the laser that is in direct thermal contact with the top surface of the laser heat sink, and not in direct thermal contact with the cooling surface of the TEC.

In some embodiments, the second surface (e.g., the bottom surface) of the heat sink module is bonded to the cooling surface of the TEC after at least the first component (e.g., after some or all of the components that would not be placed into direct contact with the TEC(s) via the through-holes created in the heat sink module) is bonded to the first surface (e.g., the top surface) of the heat sink module.

After bonding the second surface (e.g., bottom surface) of the heat sink module onto the cooling surface (e.g., the cooling surface of the TEC 32 in FIG. 1B or 1E) to form the first cavity (e.g., a cylindrical cavity), a thermal conductive medium (e.g., thermal conductive medium 40) is (68) partially filled into the first cavity such that the thermal conductive medium is in thermal contact with the cooling surface of the TEC in the first cavity.

A second component (e.g., the crystal seat 36 holding the lasing crystal 11, the crystal seat 37 holding the non-linear frequency conversion crystal 12 in FIGS. 1B and 1E, the crystal seat 51 holding the non-linear frequency conversion crystal 47 in FIG. 1E, or the onboard heat sink 48 holding the diode chip 44 in FIG. 1E) of the diode-pumped solid state laser module is (70) inserted into the first cavity, where the second component includes a upper portion and a lower portion supporting the upper portion, and where after the insertion, the lower portion of the second component deforms the thermal conductive medium (e.g., thermal conductive medium 40) inside the first cavity and achieves thermal contact with the cooling surface of the TEC through the deformed thermal conductive medium.

The second component (e.g., the lower portion (e.g., the crystal seat 36, the crystal seat 37 in FIGS. 1B and 1E, the crystal seat 51 in FIG. 1E, or the onboard heat sink 48 in FIG. 1E) of the second component) is affixed (72) (e.g., glued) to the heat sink module (e.g., the first surface (e.g., top surface) of the heat sink module (e.g., the laser heat sink module 35 in FIGS. 1B and 1E, or the laser heat sink module 54 in FIG. 1E)).

In some embodiments, after the insertion, the upper portion and at least a part of the lower portion of the second component remain outside of the first cavity, and affixing the second component to the heat sink module includes affixing the lower portion of the second component to the first surface of the heat sink module.

In some embodiments, the second component of the diode-pumped solid state laser module includes a laser chip (e.g., the laser chip 44 in FIG. 1E) and an onboard heat sink (e.g., the onboard heat sink 48 in FIG. 1E) that supports the laser chip and that is in thermal contact with the laser chip, and where the first component of the diode-pumped solid state laser module includes a first laser crystal (e.g., the non-linear frequency conversion crystal 47 in FIG. 1E) and a first laser crystal seat (e.g., the crystal seat 51 in FIG. 1E) that supports the first laser crystal and is in thermal contact with the first laser crystal. This is illustrated by the right portion of the laser 30 shown in FIG. 1E, for example.

In some embodiments, the first component of the diode-pumped solid state laser module includes a laser chip (e.g., the laser chip 8 in FIGS. 1B and 1E) and an onboard heat sink (e.g., the onboard heat sink 26 in FIGS. 1B and 1E) that supports the laser chip and that is in thermal contact with the laser chip, and where the second component of the diode-pumped solid state laser module includes a first laser crystal (e.g., the lasing crystal 11 in FIGS. 1B and 1E, the non-linear frequency conversion crystals 12 in FIGS. 1B and 1E) and a first laser crystal seat (e.g., the crystal seat 36 in FIGS. 1B and 1E, the crystal seat 37 in FIGS. 1B and 1E) that supports the first laser crystal and is in thermal contact with the first laser crystal. This is illustrated in FIG. 1B and the left portion of the laser 30 in FIG. 1E, for example.

In some embodiments, the first laser crystal seat (e.g., crystal seat 42 in FIG. 1D-(3)) includes a top surface, a bottom surface, and a body between the top surface and bottom surface of the first laser crystal seat, the first laser crystal seat further includes a recess (e.g., a linear recess 43 in FIG. 1D-(3)) in the top surface of the first laser crystal seat that runs completely through the top surface of the first laser crystal seat in a first direction (e.g., the direction of the optical path in the laser), and where the first laser crystal (e.g., lasing crystal 11) is disposed within the recess of the first laser crystal seat and is in thermal contact with two or more inner surfaces of the recess. This is illustrated in FIG. 1D-(3), for example.

In some embodiments, the first cavity is a cylindrical through-hole, and the first laser crystal seat is a cylindrical body with a linear recess that runs through the top surface of the cylindrical body. This is illustrated in FIGS. 1C and 1D-(3), for example.

In some embodiments, in accordance with a first optical alignment requirement for the first component relative to the second component of the diode-pumped solid state laser module, a vertical position by which the second component is inserted into the first cavity is adjusted, while the lower portion of the second component remains in thermal contact with the cooling surface through the deformed thermal conductive medium, where the adjusting is performed prior to affixing the second component to the heat sink module.

In some embodiments, the lower portion of the second component is affixed around the top opening of the first cavity.

In some embodiments, affixing the second component to the heat sink module includes gluing the lower portion of the second component to the first surface of the heat sink module around the top opening of the first cavity in the first surface of the heat sink module.

In some embodiments, in accordance with a second optical alignment requirement for the first component relative to the second component of the diode-pumped solid state laser module, a lateral position by which the second component is inserted into the first cavity is adjusted, while the lower portion of the second component remains in thermal contact with the cooling surface through the deformed thermal conductive medium, where the adjusting is performed prior to affixing the second component to the heat sink module.

In some embodiments, in accordance with a third optical alignment requirement for the first component relative to the second component of the diode-pumped solid state laser module, an angle by which the second component is inserted into the first cavity is adjusted, while the lower portion of the second component remains in thermal contact with the cooling surface through the deformed thermal conductive medium, where the adjusting is performed prior to affixing the second component to the heat sink module.

In some embodiments, the first component of the diode-pumped solid state laser module includes a laser diode module, where the laser diode module includes an onboard heat sink and a laser chip, wherein the onboard heat sink includes a first side that is affixed to the laser chip and a second side that is opposite to the first side, and where bonding the first component of the diode-pumped solid state laser module to the first surface of the heat sink module further includes bonding the second side of the onboard heat sink to the first surface of the heat sink module.

In some embodiments, the heat sink module further includes a second through-hole linking the first surface and the second surface, where the cooling surface and the second through-hole form a second cavity with a top opening in the first surface of the heat sink module and a bottom seal in the cooling surface. After bonding the second surface of the heat sink module onto the cooling surface to form the second cavity, the thermal conductive medium is partially filled into the second cavity such that the thermal conductive medium is in thermal contact with the cooling surface in the second cavity. A third component of the diode-pumped solid state laser module is inserted into the second cavity, where the third component includes an upper portion and a lower portion supporting the upper portion, and where after the insertion, the lower portion of the third component deforms the thermal conductive medium inside the second cavity and achieves thermal contact with the cooling surface through the deformed thermal conductive medium. The third component is affixed to the heat sink module.

In some embodiments, the second component is a laser crystal module including a lasing crystal and a respective crystal seat supporting the lasing crystal, and the third component is a non-linear crystal and a respective crystal seat supporting the non-linear crystal.

The above process 60 allows adjustment of the optical alignment of the various components when placing the components in the through-holes of the laser heat sink module(s) in one or more directions, before solidly affixing the components to the laser heat sink module(s), thereby reducing the defect rate of the laser assembly.

In some embodiments, a diode-pumped solid state laser module (e.g., the diode-pumped solid state lasers 20 and 30 in FIGS. 1B and 1E) includes a heat sink module, a cooling module, thermal conductive medium, a first component of the diode-pumped solid state laser module, and a second component of the diode-pumped solid state laser module. The diode-pumped solid state laser module may be assembled using the process 60 shown in FIG. 1F and accompanying descriptions in accordance with some embodiments.

In some embodiments, the heat sink module includes a first surface, a second surface opposite to the first surface, and at least a first through-hole linking the first surface and the second surface. The cooling module includes a cooling surface and a thermoelectric cooling system (e.g., a thermoelectric cooler (TEC)), and a heat dissipater, where the second surface of the heat sink module is bonded onto the cooling surface of the cooling module, and where the cooling surface of the cooling module and the first through-hole in the heat sink module form a first cavity with a top opening in the first surface of the heat sink module and a bottom seal in the cooling surface of the cooling module. The thermal conductive medium is partially filled within the first cavity formed by the cooling surface of the cooling module and the first through-hole in the heat sink module. The first component of the diode-pumped solid state laser module is bonded to the first surface of the heat sink module such that the first component is in thermal contact with the first surface of the heat sink module. The second component of the diode-pumped solid state laser module is partially inserted into the first cavity formed by the cooling surface of the cooling module and the first through-hole in the heat sink module, where the second component includes a upper portion and a lower portion supporting the upper portion, where the lower portion of the second component deforms the thermal conductive medium inside the first cavity and achieves thermal contact with the cooling surface through the deformed thermal conductive medium, and where the second component is affixed to the heat sink module.

In some embodiments, the upper portion and at least a part of the lower portion of the second component remain outside of the first cavity, and the lower portion of the second component is affixed to the first surface of the heat sink module.

In some embodiments, the second component of the diode-pumped solid state laser module includes a laser chip and an onboard heat sink that supports the laser chip and that is in thermal contact with the laser chip, and where the first component of the diode-pumped solid state laser module includes a first laser crystal and a first laser crystal seat that supports the first laser crystal and is in thermal contact with the first laser crystal. This is illustrated by the right portion of the laser 30 in FIG. 1E, for example.

In some embodiments, the first component of the diode-pumped solid state laser module includes a laser chip and an onboard heat sink that supports the laser chip and that is in thermal contact with the laser chip, and where the second component of the diode-pumped solid state laser module includes a first laser crystal and a first laser crystal seat that supports the first laser crystal and is in thermal contact with the first laser crystal. This is illustrated in FIG. 1B and by the left portion of the laser 30 in FIG. 1E, for example.

In some embodiments, the first laser crystal seat includes a top surface, a bottom surface, and a body between the top surface and bottom surface of the first laser crystal seat, the first laser crystal seat further includes a recess in the top surface of the first laser crystal seat that runs completely through the top surface of the first laser crystal seat in a first direction, and wherein the first laser crystal is disposed within the recess of the first laser crystal seat and is in thermal contact with two or more inner surfaces of the recess. This is illustrated in FIG. 1D-(3), for example.

In some embodiments, the first cavity is a cylindrical through-hole, and the first laser crystal seat is a cylindrical body with a linear recess that runs through the top surface of the cylindrical body. This is illustrated in FIGS. 1C and 1D-(3), for example.

In some embodiments, a vertical position by which the second component is inserted into the first cavity is adjusted in accordance with a first optical alignment requirement for the first component relative to the second component of the diode-pumped solid state laser module.

In some embodiments, the lower portion of the second component is affixed (e.g., by glue dots 41 or other fastening mechanisms, such as screws or clamps) around the top opening of the first cavity.

In some embodiments, the lower portion of the second component is glued to the first surface of the heat sink module around the top opening of the first cavity in the first surface of the heat sink module.

In some embodiments, a lateral position by which the second component is inserted into the first cavity is adjusted in accordance with a second optical alignment requirement for the first component relative to the second component of the diode-pumped solid state laser module.

In some embodiments, an angle by which the second component is inserted into the first cavity is adjusted in accordance with a second optical alignment requirement for the first component relative to the second component of the diode-pumped solid state laser module.

In some embodiments, the first component of the diode-pumped solid state laser module includes a laser diode module, wherein the laser diode module includes an onboard heat sink and a laser chip, where the onboard heat sink includes a first side that is affixed to the laser chip and a second side that is opposite to the first side, and the second side of the onboard heat sink is bonded to the first surface of the heat sink module.

In some embodiments, the heat sink module further includes a second through-hole linking the first surface and the second surface, where the cooling surface and the second through-hole form a second cavity with a top opening in the first surface of the heat sink module and a bottom seal in the cooling surface, and where the thermal conductive medium partially fills the second cavity such that the thermal conductive medium is in thermal contact with the cooling surface in the second cavity, where the diode-pumped solid state laser module further includes a third component, where the third component of the diode-pumped solid state laser module is partially inserted into the second cavity formed by the cooling surface of the cooling module and the second through-hole in the heat sink module, where the third component includes a upper portion and a lower portion supporting the upper portion, where the lower portion of the third component deforms the thermal conductive medium inside the second cavity and achieves thermal contact with the cooling surface through the deformed thermal conductive medium, and where the third component is affixed to the heat sink module.

In some embodiments, the second component is a laser crystal module including a lasing crystal and a respective crystal seat supporting the lasing crystal, and the third component is a non-linear crystal and a respective crystal seat supporting the non-linear crystal. This is illustrated in FIG. 1B or the left portion of the laser 30 in FIG. 1E, for example.

Figure 2A:
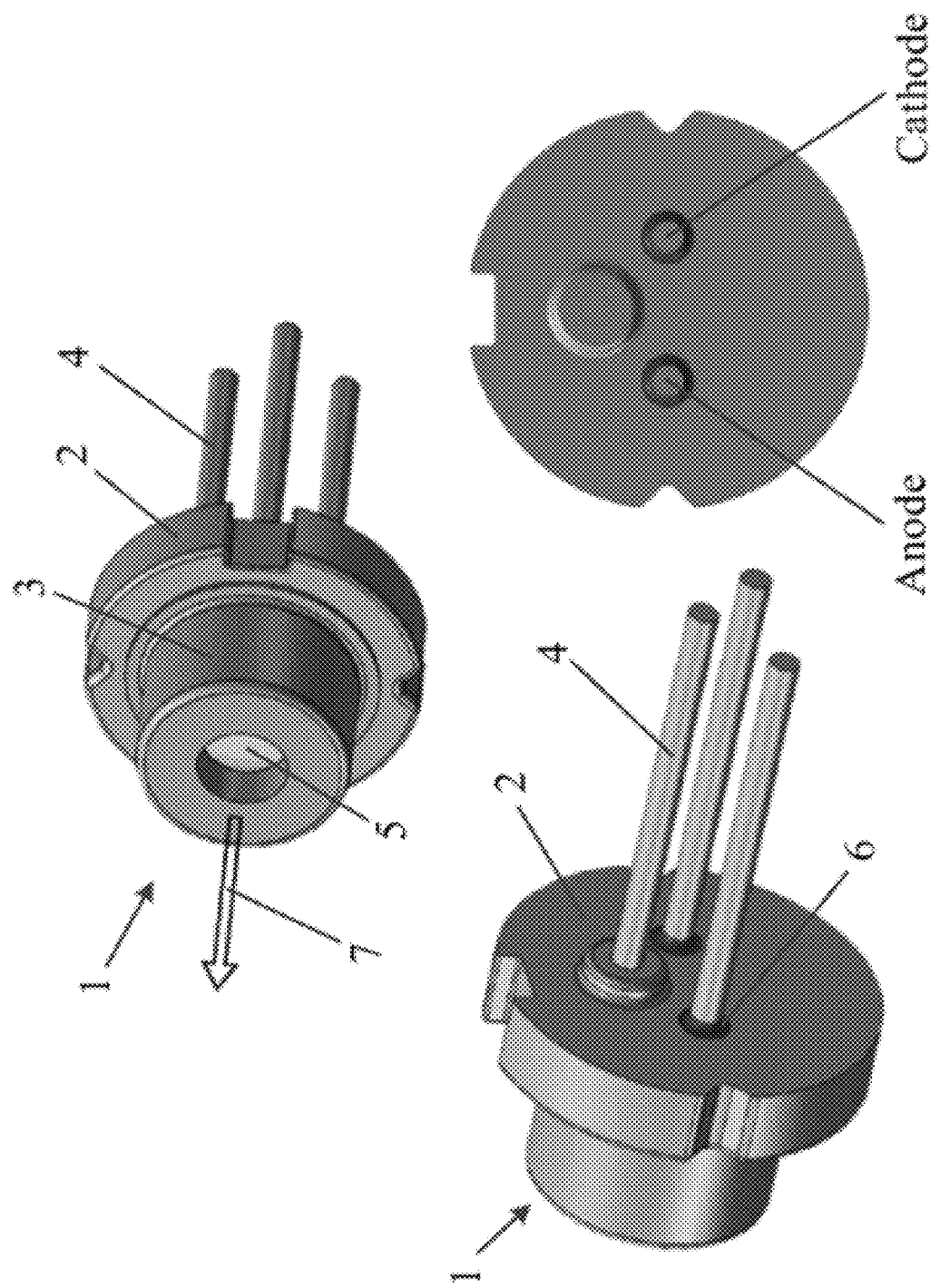
FIG. 2A illustrates schematics of an exemplary laser diode.

FIG. 2A shows schematics of an exemplary laser diode (e.g., a laser diode 1). Typically, a laser diode includes a diode laser chip that is packaged in TO-CAN packaging. Common TO-CAN packaging includes TO-38, TO-56, TO-9, etc. Sometimes, other types of packaging may be used to make a laser diode, such as SOT-01, SOT-02, CMT-02, etc. A laser diode with TO-CAN-56 packaging is shown in FIG. 2A for illustrative purposes. The laser diode 1 shown in FIG. 2A includes a metal support plate 2, a metal enclosure 3, conductive leads 4, an output window 5, and an insulating layer 6. The diode laser chip is installed on the metal support plate 2. The metal support plate 2 is used for dissipating heat generated by the diode laser chip. The metal enclosure 3, the output window 5, and the metal support plate 2, together form a sealed space to protect the diode laser chip. In general, there are several conductive leads 4 coming out of the backside of the metal support plate 2. The conductive leads 4 are used to supply electric current to drive the diode laser chip or used for diagnostic purposes. Each of the conductive leads 4 is insulated from the metal support plate 2 using an insulating layer 6.

During operation, a laser beam 7 generated by the diode laser chip leaves the laser diode 1 by passing through the output window 5. In general, the path of the laser beam 7 is perpendicular to the plane of the metal support plate 2. The conductive leads 4 include at least a cathode lead and an anode lead, used for supplying electric current to drive the diode laser chip, and an optional ground lead.

As set forth in the Background section, many systems and devices that use laser array illumination use laser arrays of semiconductor diode lasers (e.g., such as diode laser 1 in FIG. 2A). When using diode laser array modules, issues such as optical collimation (e.g., adjustment of divergence angles of the diode lasers), heat dissipation, and electric driving efficiency, etc., need to be addressed. Typically, the heat dissipation/cooling require exposure and contact of heat conductors (or other efficient heat transfer media), while electric driving requires proper insulation between electric conductors. Since medium used for heat conduction/transfer are typically also good electric conductors and medium used for electric insulation are typically poor heat conductors, the requirements for cooling and electric driving in diode laser arrays present a unique challenge.

To address the above challenge, heat transfer requirements and electric driving functions of the laser diode module are physically separated into different surfaces of the laser array module, such that each can be implemented without interfering with the other.

In some embodiments, in a single-sided diode laser array, by utilizing a heat sink module with embedded through-holes (stepped or straight through-holes), the laser diodes can be placed at least partially within the through-holes and the thermal contact area between the laser diodes and the heat sink module can be increased (e.g., due to the increased contact area/exposure between the side walls of the through-holes and the laser diodes), thereby improving the heat dissipation efficiency of the heat sink module.

In addition to ensuring sufficient heat dissipation, the driving circuit for the laser array also needs to be reasonably accommodated. Conventionally, a PCB circuit or a flexible circuit layer is connected to the laser diodes, and disposed between the laser diode layer and a liquid cooling layer. In general, the size of the driving circuit layer is constrained by the circuit density, and cannot be made very small. As a result, the driving circuit layer can hinder the heat transfer between the laser diode layer and liquid cooling layer. By utilizing a heat sink module with grooves in the bottom surface to link the through-holes, conductive leads can be placed within the grooves to link the laser diodes placed within the through-holes in the heat sink module, and the conductive leads can therefore be connected to the driving circuit that is placed on the side(s) of the heat sink module. This way, the physical separation of the driving circuit layer and the heat transfer interface is realized, and heat dissipation is no longer hindered by the existence of the driving circuit layer. The conductive leads can be insulated from the rest of the heat sink module, thus the heat sink module does not significantly impact the driving efficiency of the electric driving circuit. In addition, being good heat conductors in general, the electrical conductive leads may also facilitate the heat conduction from the laser diodes and the heat sink module and/or the liquid cooling layer. In some embodiments, in order to further reduce the number of interfaces and improving heat transfer efficiency, the heat sink module can be omitted or integrated with the liquid cooling module, to allow the laser diodes be in direct thermal contact with the liquid cooling mechanism, and allowing the driving circuit to be disposed on the back side or vertical sides of the liquid cooling module. This configuration also serves to physically separate the heat conduction layer and the driving circuit layer. Exemplary embodiments of the single-sided laser diode array are described below with respect to FIGS. 2B-2Q and 2X-2BE, for example.

In some embodiments, in a double-sided diode laser array module, in order to maximize the use of the liquid cooling means, the liquid cooling layer is used to cool the laser diodes on both sides of the laser array module. The diode laser array on each side of the laser array module is in direct contact with the liquid cooling layer. The liquid cooling layer is sandwiched between the two laser diode layers of the double-sided diode laser array module, while the driving circuit layers are disposed on the sides of the laser array module. This configuration allows the physical separation of the heat transfer interface and the driving circuit layer.

The configurations of the laser diode array modules can include laser diodes of different types and wavelengths. The diode lasers in each array may be pointed to different directions in accordance with some embodiments. In some embodiments, the lens used to collimate the laser beams from the laser diodes may also be placed at least partially within the through-holes in the heat sink module, thereby further improving the heat dissipation efficiency. In some embodiments, different types of cooling mechanisms may be used in the laser array module as needed in different application scenarios. In some embodiments, the lenses used to collimate the laser beams from the laser diode array may be fabricated as an integrated sheet with lens domes built-in, or as individual lenses. One advantage of using individual lenses is that defective lenses may be replaced separately without impacting other lenses. One advantage of using an integrated sheet with built-in lens domes is the ease of assembly of the laser array module.

Figure 2B:
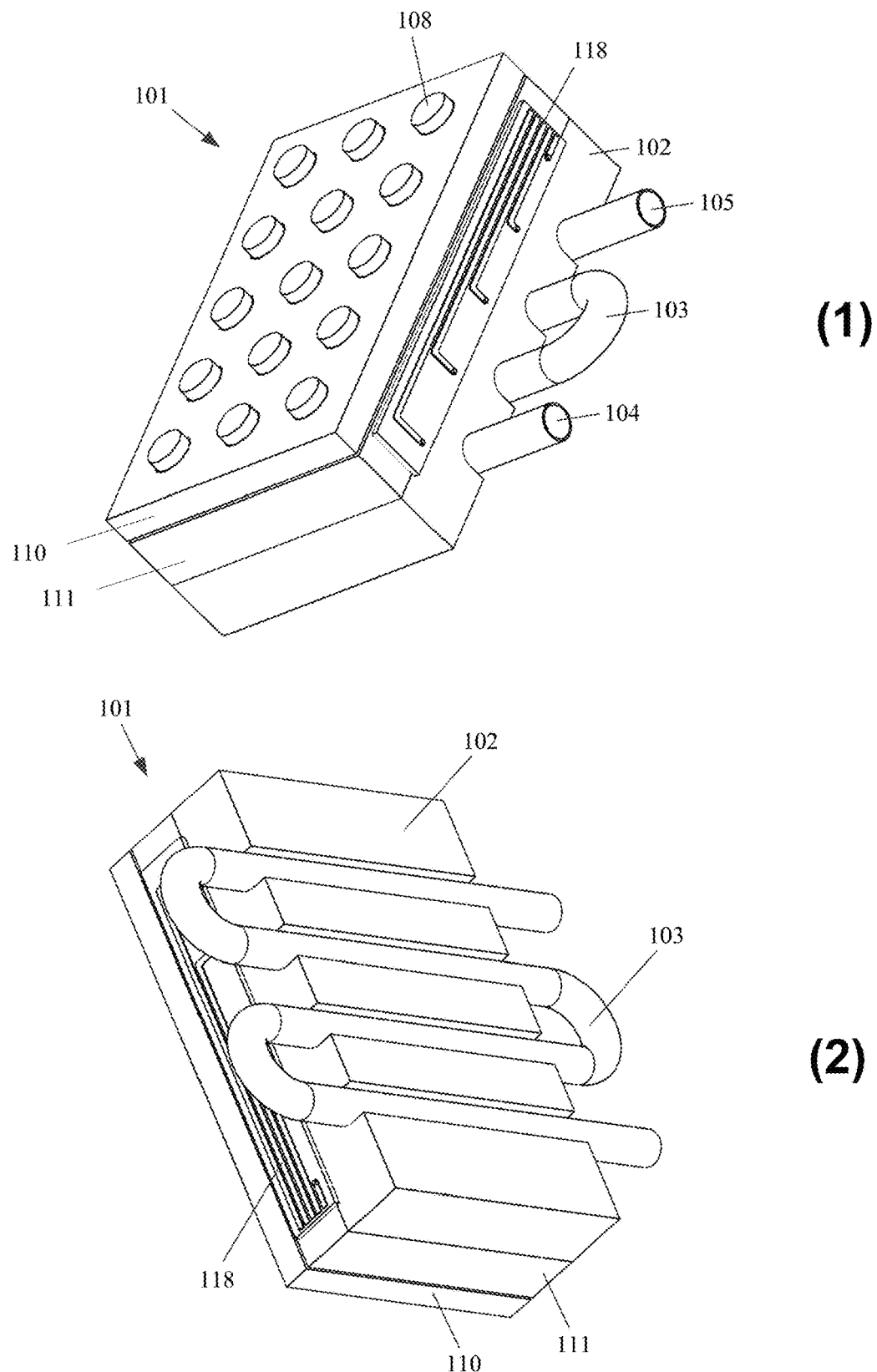
FIG. 2B illustrates the top and bottom views of an exemplary laser array module in accordance with some embodiments.

FIG. 2B shows the schematics of an exemplary single-sided diode laser array module 101 with a heat sink module 111 in accordance with some embodiments. FIG. 2B-(1) shows a perspective view of the laser array module 101 from above, and FIG. 2B-(2) shows a perspective view of the laser array module 101 from below. As shown in FIG. 2B, the laser array module 101 includes a liquid cooling module 102 that cools the laser diodes during operation. The liquid cooling module 102 includes a liquid cooling tube 103 embedded in a planar substrate layer. During operation, a cooling liquid enters the liquid cooling tube 103 from an inlet 104, and exits the liquid cooling tube 103 from an outlet 105. The cooling liquid can be water or alcohol, in some embodiments. The laser array module 101 further includes a lens array layer (with an array of lenses 108 embedded in or resting on a lens array substrate layer 110) above the heat sink module 111, and one or more driving circuit layers 118 that are disposed perpendicularly relative to the planar heat transfer interface between the heat sink module 111 and the liquid cooling module 102.

Figure 2C:
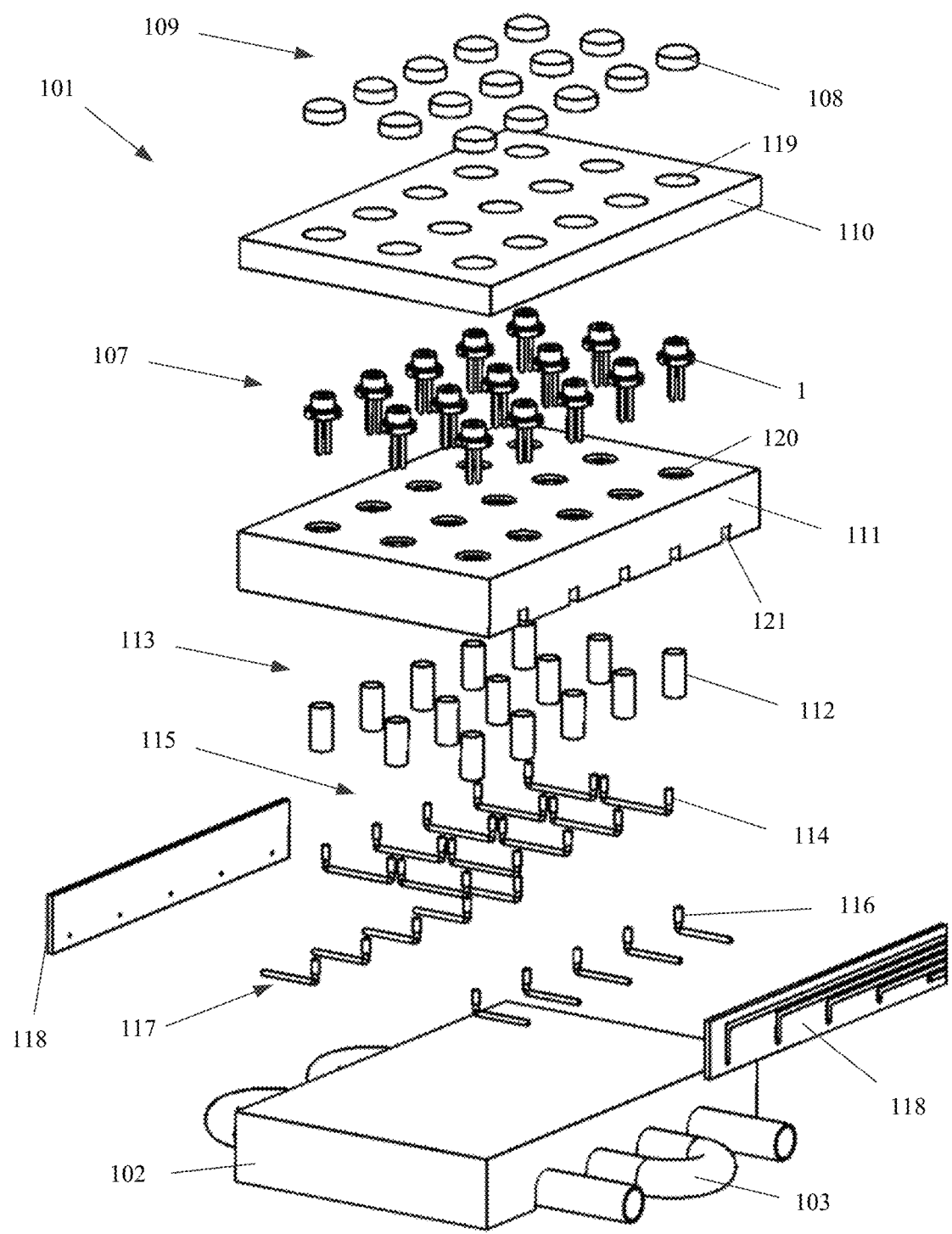
FIG. 2C illustrates an exploded view of the exemplary laser array module in FIG. 2B.

FIG. 2C is an exploded view of the laser array module 101 showing various components of the laser array module 101 and the relative positions thereof in accordance with some embodiments. As shown in FIG. 2C, the laser array module 101 includes a laser diode array 107 that includes an array of diode lasers (e.g., an array of diode lasers 1) arranged in a grid pattern (e.g., a rectangular lattice pattern with orthogonal rows and columns). The laser array module 101 further includes a lens array 109 that include an array of lenses 108 at locations corresponding to the diode lasers 1 in the diode laser array 107 (e.g., also in the rectangular lattice pattern over the diode lasers). In some embodiments, the lenses 108 are individual lenses that are placed within an array of through-holes 119 in a lens array substrate layer 110. In some embodiments, the lenses 108 are integrated with the lens array substrate layer 110 as a single homogeneous body made from a mold, e.g., as an array of lens domes formed on the surface of a planar body. In some embodiments, the lenses 108 are disposed above the lens array substrate layer 110, e.g., are not disposed within the through-holes 119.

As shown in FIG. 2C, the laser array module 101 further includes the heat sink module 111, and the heat sink module 111 includes an array of through-holes (e.g., stepped through-holes 120) at locations corresponding to the laser diodes 1 in the diode laser array 107. The back side of the heat sink module 111 includes grooves 121 (e.g., as also shown in FIG. 2E-(2)).

As shown in FIG. 2C, the laser array module 101 further includes an insulation array 113, and the insulation array 113 includes an array of insulation tubes 112 at locations corresponding to the laser diodes 1 (and the locations of the through-holes (e.g., stepped through-holes 120)). When the laser array module 101 is assembled, the insulation tubes 112 are inserted within corresponding through-holes (e.g., stepped through-holes 120), insulating the conductive leads 4 of the diode lasers 1 from the walls of the through-holes (e.g., the stepped through-holes 120) in the heat sink module 111.

As shown in FIG. 2C, the laser array module 101 further includes an internal array 115 of U-shaped conductive lead connectors 114 and an external array 117 of L-shaped conductive lead connectors 116. The internal array of U-shaped conductive lead connectors 114 have respective connectors (aka. legs or arms of the U-shape) that reach within the insulator tubes 112 and link the conductive leads 4 of the laser diodes 1 into a network, and the external array of L-shaped conductive lead connectors 116 have respective connectors (aka. legs or arm of the L-shape) that reach within the insulator tubes 112 and link the leads 4 of the outer most layer of laser diodes 1 to the external driving circuit layers 118. As shown in FIGS. 2B and 2C, in some embodiments, the driving circuit layers 118 includes driving circuit PCB boards that are affixed to the sides of the heat sink module 111, where the sides of the heat sink module 111 (and the driving circuit layers 118) are perpendicular to the top and bottom surfaces of the heat sink module 111. As shown in FIG. 2C, the laser array module 101 further includes the liquid cooling module 102 attached to the bottom side of the heat sink module 111. The grooves in the bottom side of the heat sink module 111 accommodate the horizontal portions of U-shaped conductive lead connectors 114 and horizontal portions of the L-shaped conductive lead connectors 116, such that the bottom surface of the heat sink module 111 and the top surface of the liquid cooling layer 102 are in close thermal contact with each other for efficient heat exchange.

Figure 2D:
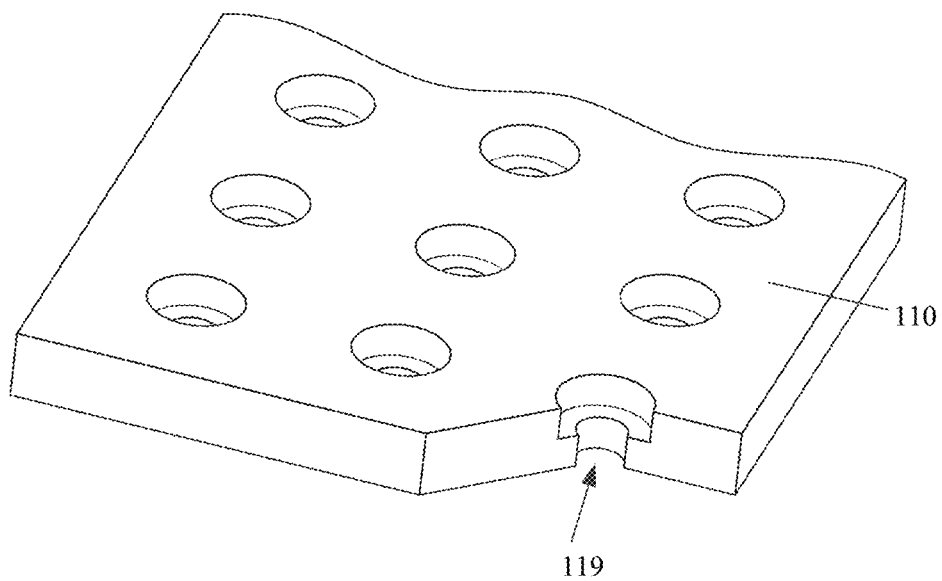
FIG. 2D illustrates a lens array substrate layer in the exemplary laser array module shown in FIGS. 2B and 2C, in accordance with some embodiments.
Figure 2E:
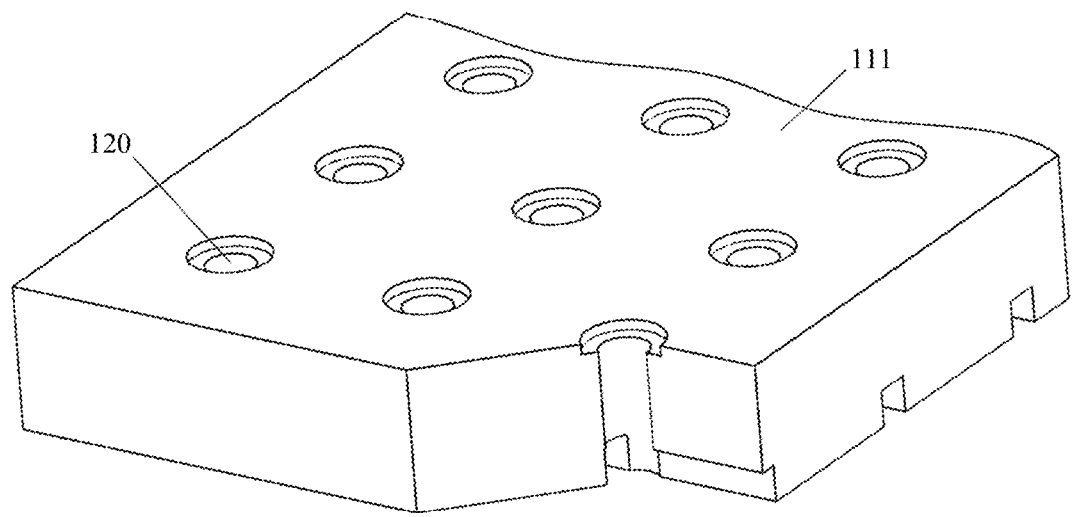
FIG. 2E illustrates the top and bottom views of a heat sink module in the exemplary laser array module shown in FIGS. 2B and 2C, in accordance with some embodiments.
Figure 2E:
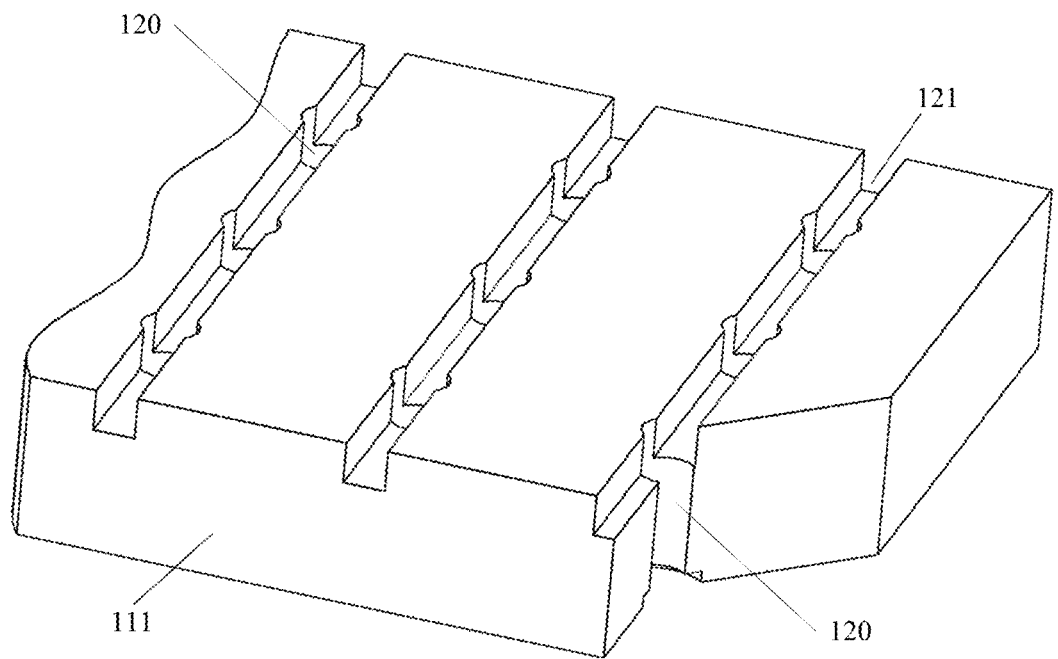

FIG. 2D shows a schematic of the lens array substrate layer 110 in accordance with some embodiments. As shown in FIG. 2D, the lens array substrate layer 110 is a substantially planar substrate with an array of through-holes (e.g., stepped through-holes 119) at locations corresponding to the lenses 108 in the lens array 119 (and the locations corresponding to the laser diodes 1 in the laser array 107). Each stepped through-hole 119 includes an upper portion that would fit a corresponding lens 108 (e.g., a cylindrical hole with the same diameter and height as the lens 108). In addition, each stepped through-hole 119 includes a lower portion that is slightly smaller than the upper portion, such that a ring-shaped surface or step is created between the upper portion and the lower portion of the stepped through-hole 109. In some embodiments, the ring-shape surface or step supports the bottom edge of a lens 108, while letting through the laser beam emitted from the laser diode below. In some embodiments, the lenses are suspended above the ring-shaped surface or step by an optical medium (e.g., a transparent optical gel). In some embodiments, the lenses are affixed to the top surface of the lens array substrate layer 110 with an air gap between each lens and the stepped surface of the stepped through-hole in the lens array substrate layer 110. In some embodiments, the lenses are disposed completely outside of the through-holes 109 and affixed to the top surface of the lens array substrate layer 110 by glue. In some embodiments, the lower portion of the stepped through-hole in the lens array substrate layer 110 has a diameter slightly larger than the metal enclosure 3 of the laser diode 1, and when the laser array module is assembled, at least the upper portions (e.g., enclosures 3) of the laser diodes 1 reside within the lower portions of the stepped through-holes 119 of the lens array substrate layer 110, e.g., as illustrated in FIG. 2H-(2). During operation, the laser beam from each laser diode 1 enters from the bottom side of a respective stepped through-hole 119, and passes through the lens 108 disposed within the respective stepped through-hole 119, and the lens 108 adjusts the divergence angle of the laser beam. In some embodiments, the alignment between the lenses 108 and the laser diodes are individually tuned during production to ensure that the outputs from the plurality of laser diodes are aligned with one another once they pass through the respective lenses above the plurality of laser diodes.

In some embodiments, the lens array substrate layer 110 shown in FIG. 2D can be replaced by a lens array substrate layer that includes straight through-holes, or through-holes with narrower upper portions and wider lower portions. In some embodiments, the lenses rest on top of the lens array substrate layer over the through-holes, rather than residing at least partially within the through-holes. These are illustrated, for example, in the embodiments shown in Figures AH-AK, AM-AS, AT, AU, and AY.

FIG. 2E shows the schematic of the heat sink module 111 in accordance with some embodiments. As shown in FIG. 2E-(1), the heat sink module 111 includes an array of through-holes (e.g., stepped through-holes 120) in a planar substrate, at locations corresponding to the laser diodes 1 in the laser array 107. Each stepped through-hole 120 includes an upper portion that is wide enough to fit the upper portion of a respective laser diode 1 (e.g., a cylindrical hole with a slightly larger diameter than that of the support plate 2 of the diode laser 1). In some embodiments, the height of the upper portion of the stepped through-holes 120 is smaller than the thickness of the support plates 2 for the laser diodes 1, such that at least a portion of the support plates 2 are protruding above the top surface of the laser diode module 111. In addition, each stepped through-hole 120 includes a lower portion that is slightly smaller than the upper portion, such that a ring-shaped surface or step is created between the upper portion and the lower portion of the stepped through-hole 120, and the ring-shape surface or step supports the bottom edge of the support plate 2 of the laser diode 1, while letting the conductive leads 4 of the laser diode 1 pass into the lower portion of the stepped through-hole 120. The lower portion of the stepped through-hole 120 has a height that is sufficient to fit a respective insulator tube 112, such that the insulator tube 112 insulates the conductive leads of the laser diode 1 from the inner sidewall of the stepped through-hole 120; and with grooves passing through the bottoms of a sequence of the stepped through-holes 120 (e.g., a row or a column of stepped through-holes 120), the conductive lead connectors 116 and 114 inside these stepped through-holes 120 are insulated (e.g., physically separated by air gaps) from the inner walls of the grooves 121 in the bottom surface of the heat sink module 111. As shown in FIG. 2E-(2), on the bottom side of the heat sink module 111, linear grooves 121 are present to accommodate the horizontal portions of the U-shaped conductive lead connectors 114 and the horizontal portions of the L-shaped conductive lead connectors 116. Each groove 121 passes through the lower portions of at least one row or column of stepped through-holes 120. The heat sink module 111 is made of good thermal conductors to efficiently transfer heat from the laser diodes 1 to the liquid cooling layer 102 below, while staying electrically insulated from the conductive leads 4 of the laser diodes 1 in the laser diode array 107.

In some embodiments, the heat sink module 111 shown in FIG. 2E can be replaced by a heat sink module that includes straight through-holes. In some embodiments, the support plates of the laser diodes rest on top of the heat sink module over the through-holes, rather than residing at least partially within the through-holes. These are illustrated, for example, in the embodiments shown in Figures AH, AI, AL-AS, and AT-AX.

Figure 2F:
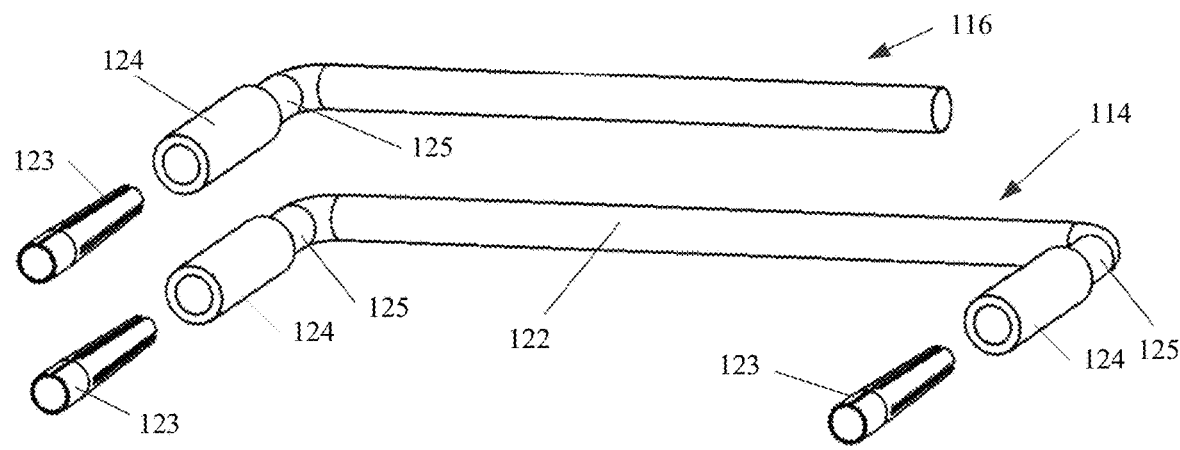
FIG. 2F illustrates schematics of an L-shaped conductive lead connector and a U-shaped conductive lead connector used in the exemplary laser array module shown in FIGS. 2B and 2C, in accordance with some embodiments.
Figure 2F:
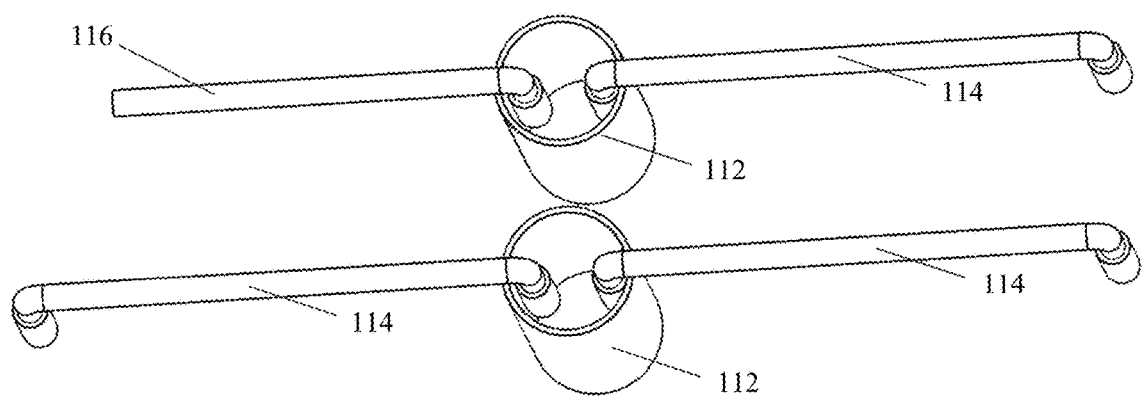

FIG. 2F shows schematics of an L-shaped conductive lead connector 116, and a U-shaped conductive lead connector 114 in accordance with some embodiments. As shown in FIG. 2F-(1), the L-shaped conductive lead connector 116 includes two conductive legs that are at an angle (e.g., are perpendicular) to each other, and one of the legs includes a conductive boot 124 that encloses a conductive spring-loaded insert 123. The spring-loaded insert 123 includes multiple leaves that will open and push against the inner wall of the boot 124 when a conductive lead of a laser diode 1 is inserted into the spring-loaded insert 123, such that the conductive lead of the laser diode 1 is held firmly in contact with the conductive boot 124 by the spring-loaded conductive insert 123. The U-shaped conductive lead connector 114 is similar to the L-shaped connector 116, except that the U-shaped conductive lead connector 114 has two legs/arms 125 that are connected by a linear conductive body 122. Each of the two arms/legs 125 of the U-shaped connector 114 includes a respective boot 124, and a corresponding spring-loaded insert 123 for holding a conductive lead of a laser diode 1.

FIG. 2F-(2) shows the view from below of how the legs/arms 125 of the U-shaped conductive lead connectors 114 and the legs/arms of the L-shaped conductive lead connectors 116 are disposed within the insulator tubes 112, when assembled in a laser array module. As shown in FIG. 2F-(2), when connecting the leg of a U-shaped conductive lead connector 114 or a leg of the L-shaped connector 116 with a respective conductive lead of a laser diode 1, the leg with the boot 124 and the spring loaded insert 123 thereof are placed within the insulator tube 112 from below, and an appropriate lead of the laser diode (not shown in FIG. 2F-(2)) is inserted into the spring-loaded insert from above. The U-shaped conductive lead connectors 114 are used to connect adjacent laser diodes in the diode array (e.g., adjacent laser diodes in a row or column of the laser diode array) in series, while the L-shaped conductive lead connectors 116 are used to connect a laser diode (and consequently other laser diodes that are connected to said laser diode by the U-shaped connectors 116) to the external driving circuit layer (e.g., a driving PCB board) (e.g., the driving circuit layer 118 placed on the vertical sides of the heat sink module 111). The insulator tube 112 is inserted within the lower portion of the stepped through-holes 120 (or the lower portion or the entirety of straight through-holes) in the heat sink module 111 (or variations thereof), and electrically insulates the conductive leads 4 of the laser diodes 1 from the heat sink module 111 (or the variations thereof).

Figure 2G:
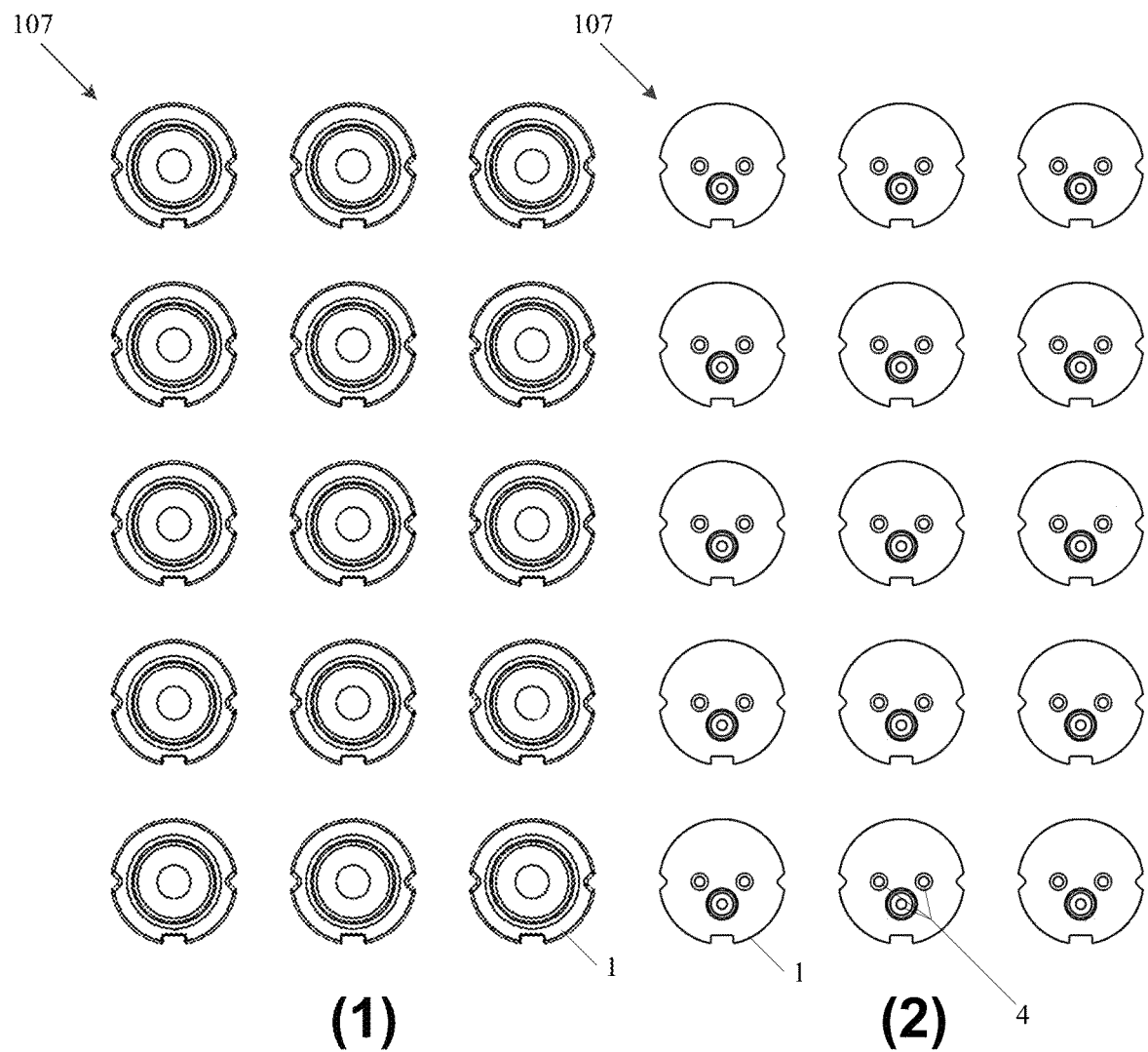
FIG. 2G illustrates the top and bottom views of an exemplary laser diode array in the exemplary laser array module shown in FIGS. 2B and 2C, in accordance with some embodiments.
Figure 2H:
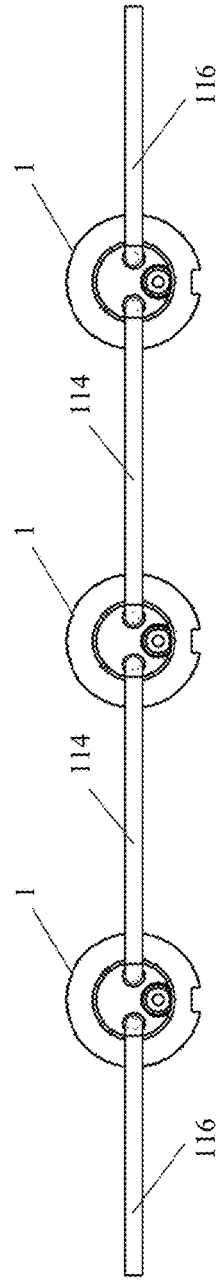
FIG. 2H shows the bottom and side views of the connections between the laser diodes and the conductive lead connectors in the exemplary laser array module shown in FIGS. 2B and 2C, in accordance with some embodiments.
Figure 2H:
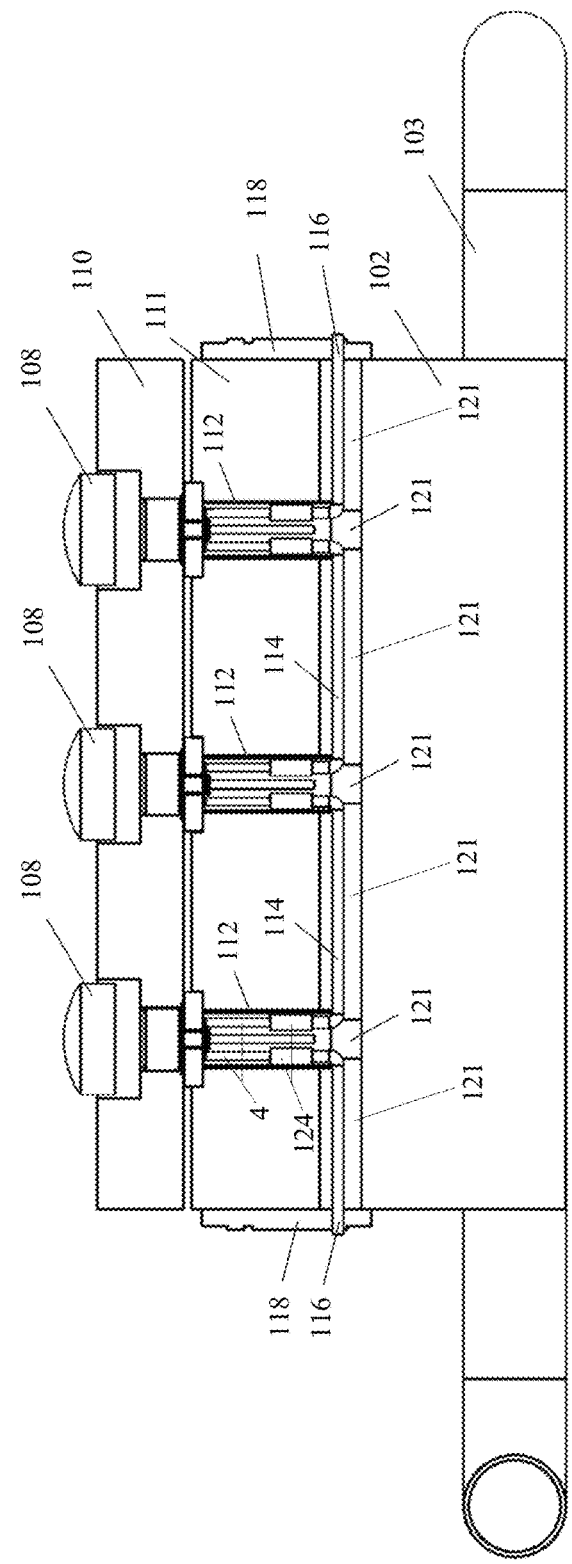

FIG. 2G shows the top view and the bottom view of the laser diode array 107, in accordance with some embodiments. For example, FIG. 2G-(1) shows the top view of the laser diode array 107, and FIG. 2G-(2) shows the bottom view of the laser diode array 107, with 3 rows by 5 columns of laser diodes 1. In the embodiments shown in FIG. 2G, the orientations of the laser diodes are substantially identical (e.g., as indicated by the relative positions of the corresponding conductive leads in different laser diodes in FIG. 2G-(2)). In some embodiments, small adjustments may be made to the orientations of the laser diodes 1 to align the polarization planes of the laser beams from the different laser diodes 1 when the laser diodes 1 are place within the through-holes (e.g., stepped through-holes 120 or straight through-holes 120'). In some embodiments, once the orientations of the laser diodes are adjusted, the lens array substrate layer is placed above the top of the laser diodes 1, and fastened to the heat sink module. The lens array substrate layer thus keeps the laser diodes from moving or rotating during operation of the laser array module.

In some embodiments, using the laser diode array 107 shown in FIG. 2G, each row of three laser diodes 1 are connected in series by two U-shaped conductive lead connectors 114 and the two laser diodes 1 located at the edges of the array 107 are respectively connected to the external driving circuit in the driving circuit layer 118 by two L-shaped conductive lead connectors 116, as shown in FIG. 2H.

FIG. 2H-(1) shows the connections between the laser diodes 1 and the conductive lead connectors 114 and 116 from below. FIG. 2H-(2) shows the side view of the laser array module 101. As shown in FIG. 2H, the conductive leads 4 of the laser diodes 1 are inserted into the spring-loaded inserts 123 in the boots 124 of the conductive lead connectors 116 and 114 to establish electrical contact between the laser diodes 1 and the conductive lead connectors 116 and 114. The U-shaped conductive lead connectors 114 and the L-shaped conductive lead connectors 116 are electrically insulated from the heat sink module 111 (or the variations thereof) by the insulator tubes 112. In some embodiments, instead of using insulator tubes 112, other insulating materials may be applied between the conductive lead connectors 114 and 116 and the inner walls of the stepped through-holes 120 (or the straight through-holes 120'), and between the conductive lead connectors 114 and 116 and the grooves 121 in the heat sink module 111 (or the variations thereof), to electrically insulate the heat sink module 111 (or the variations thereof) from the electrical leads 4 of the laser diodes 1 and from the driving circuit layer 118 of the laser array module 101.

As shown in FIG. 2H-(2), the lower portions of the laser diodes 1 are inserted into the lower portion of the stepped through-holes 120 in the heat sink module 111, with the support plates 2 of the laser diodes 1 resting on the ring-shaped step surfaces in the stepped through-holes 120. The metal enclosures 3 of the laser diodes 1 are at least partially inserted into the lower portions of the stepped through-holes 119 in the lens substrate layer 110. The lens array substrate layer 110 and the heat sink module 111 are rested next to each other after alignment based on the positions of the through-holes 120 and 119. In some embodiments, the lens array substrate layer is adhered to the top surface of the heat sink module 111 with some adhesive medium or other fixation method (e.g., fasteners, screws, etc.). In some embodiments, the thickness of the support plates 2 of the laser diodes 1 are greater than the height of the upper portions of the stepped through-holes 120, such that when the lens array substrate layer 110 are laid on top of the heat sink module 111, the bottom surface of the lens array substrate layer 110 is suspended above the top surface of the heat sink module 111 by the protruding support plates 2 of the laser diodes. When the lens array substrate layer 110 are affixed to the heat sink module 111, e.g., by an adhesive or fasteners, the lens array substrate layer 110 press the support plates 2 of the laser diodes against the top surface of the heat sink module 111, so that shift and rotation of the laser diodes are prevented. Each lens 108 is placed within the upper portion of a respective through-hole 119 above a corresponding laser diode 1. The lens 108 is then affixed to the lens substrate layer 110, e.g., using glue or other adhesives, at the top edge or the inside walls of the stepped through-holes 119, after the position and orientations of the lenses have been individually adjusted to ensure optical alignment and focus. For example, when affixing the lenses to the lens substrate layer 110, the heights and orientation of the lenses 108 may be adjusted individually as needed such that the gaps (e.g., an air gap or gap filled with other high index media) between the lenses 108 and the output windows 5 of the laser diodes 1 are of suitable widths to focus the laser beams from the different laser diodes 1 onto a plane at a desired distance. When a defective lens is discovered during or subsequent to the assembly of the laser array module 101, the defective lens may be replaced with another non-defective lens without impacting other lenses in the lens substrate layer 110.

As shown in FIG. 2H-(2), the horizontal portions of the U-shaped conductive lead connectors 114 and the horizontal portions of the L-shaped conductive lead connectors 116 are placed within the grooves 121 in the bottom surface of the heat sink module 111 (or the variations thereof). The bottom surface of the heat sink module 111 (or the variations thereof) is placed in close thermal contact with the liquid cooling module 102, and transfers heat generated by the laser diodes 1 to the liquid cooling module 102 to realize cooling of the laser array module 101. At the same time, the U-shaped conductive lead connectors 114 and the L-shaped conductive lead connectors 116 are electrically separated and insulated from the heat sink module 111 (or the variations thereof).

Figure 2I:
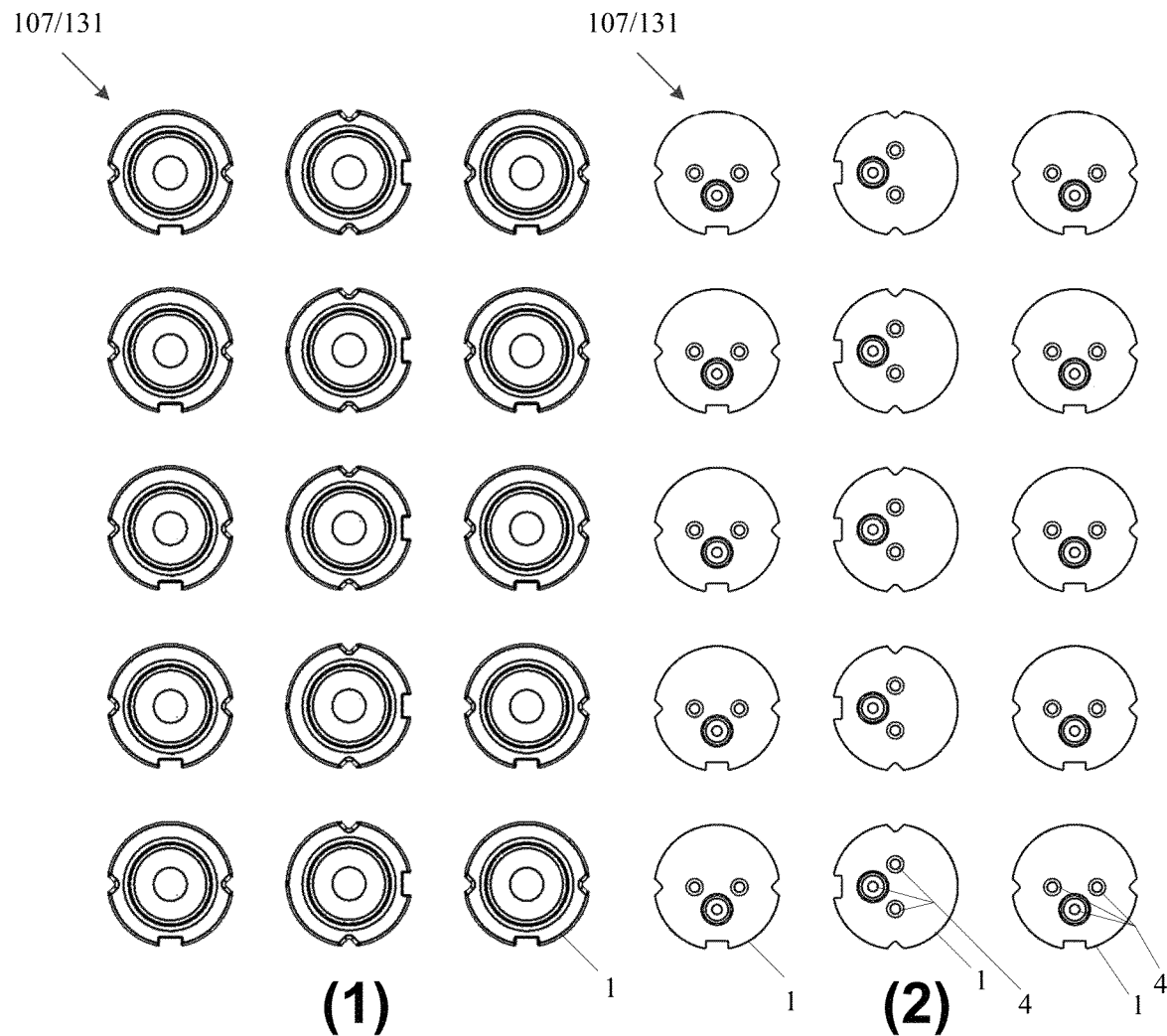
FIG. 2I shows the top and bottom views of another exemplary laser diode array in the exemplary laser array module shown in FIGS. 2B and 2C, in accordance with some embodiments.
Figure 2J:
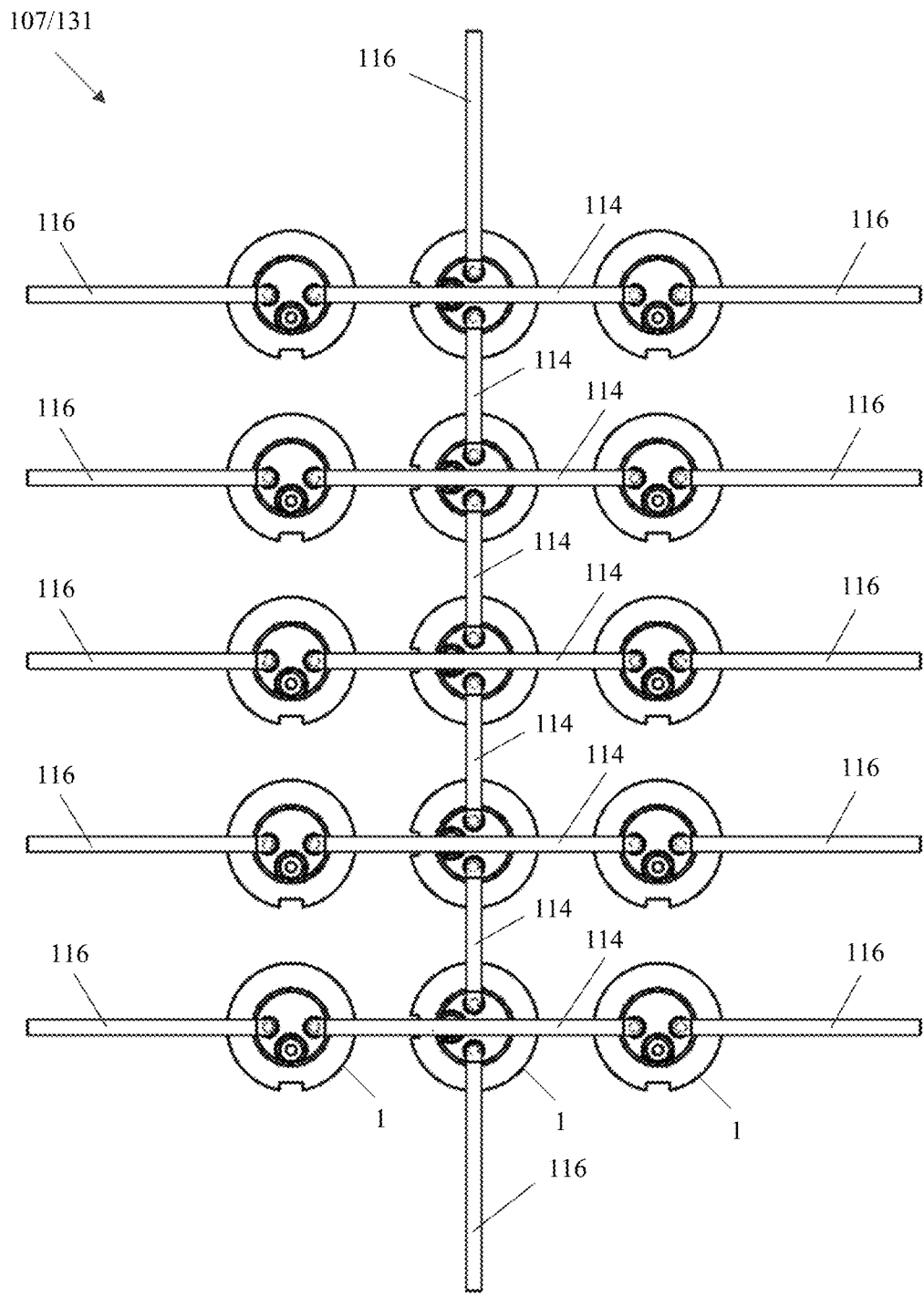
FIG. 2J illustrates an exemplary arrangement of the conductive lead connectors based on the arrangement of the laser diodes in FIG. 2I, in accordance with some embodiments.
Figure 2K:
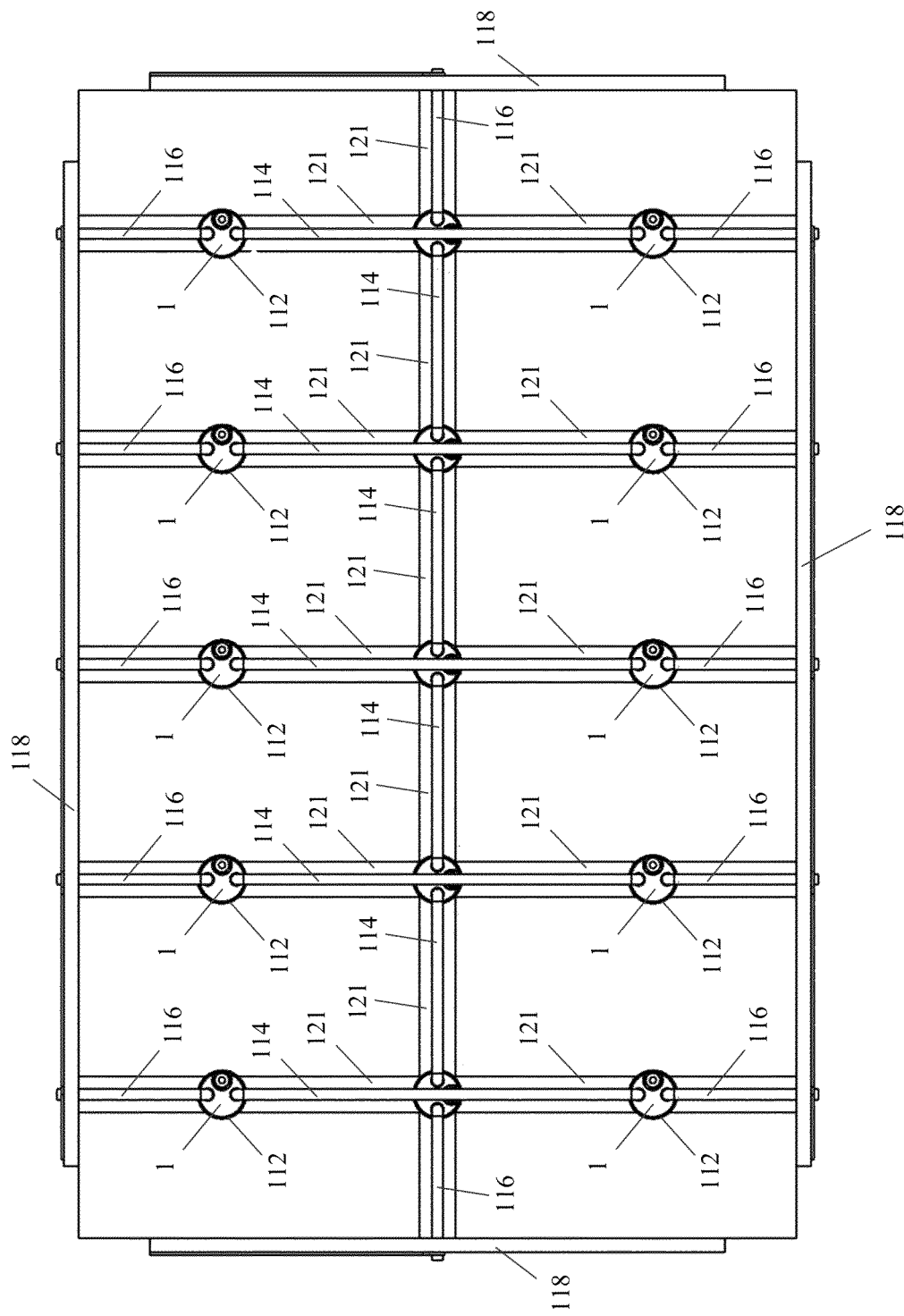
FIG. 2K illustrates an exemplary groove pattern in the bottom surface of the heat sink module based on the arrangement of the conductive lead connectors shown in FIG. 2J, in accordance with some embodiments.

The orientations of the laser diodes 1 shown in FIG. 2G are merely illustrative. In some embodiments, a different arrangement of the laser diodes 1 may be used in the laser diode array 107. For example, as shown in FIG. 2I, the orientations of the laser diodes 1 are not all identical in the laser diode array 107. FIG. 2I-(1) shows the top view of the laser diode array 107, and FIG. 2I-(2) shows the bottom view of the laser diode array 107, in accordance with some embodiments. Based on the arrangement of the laser diodes 1 in FIG. 2I, the conductive leads of the laser diodes can be connected using the L-shaped conductive lead connectors 116 and the U-shaped conductive lead connectors 114 in accordance with the arrangement shown in FIG. 2J, in accordance with some embodiments. In accordance with the arrangement of the L-shaped conductive lead connectors 116 and the U-shaped conductive lead connectors 114 shown in FIG. 2J, the grooves 112 can be created in accordance with the pattern shown in FIG. 2K. The configurations of the laser diode array 107 and the arrangement of the conductive lead connectors 114 and 116 can be based on the particular needs of the laser illumination needs and the design of the driving circuit in the driving circuit layer. An exemplary laser diode array according to the layout and orientations shown in FIGS. 2I-2K is also referred to later in the specification as laser diode array 131. In some embodiments, a laser array module includes a laser diode array 131 instead of a laser diode array 101.

As indicated earlier, in some embodiments, the stepped through-holes 119 in the lens array substrate layer 110 can be replaced with straight through-holes without any steps inside (e.g., straight through-holes 119'). In some embodiments, the stepped through-holes 119 in the lens array substrate layer 110 can be replaced with stepped through-holes that are wider on top and narrower on the bottom (e.g., stepped through-holes 119"). In some embodiments, the stepped through-holes 120 in the heat sink module 111 can be replaced with straight through-holes without any steps inside (e.g., straight through-holes 120'). In some embodiments, lenses (e.g., lenses 108') can be placed above the lens array substrate layer 110 instead of placed within the through-holes 119 (or 119', or 119") in the lens array substrate layer 110. Depending on the particular combinations of the types of through-holes in the lens array substrate layer 110 and the through-holes in the heat sink module 111 used in a laser array module, the relative positions of the lenses, the body and support plates of the laser diodes, the through-holes in the lens array substrate module, and the through-holes in the heat sink module will be adjusted, e.g., as illustrated in FIGS. 2AH-2AS.

As shown in FIG. 2AH, the laser array module 101' includes a heat sink module 111' that includes through-holes 120', where the through-holes 120' are straight through-holes that replace the stepped-through-holes 120 shown in FIG. 2C. In FIG. 2AI, the laser array module 101" includes a heat sink module 111' with the straight through-holes 120', and further includes a lens array substrate layer 110", where the lens array substrate layer 110" includes stepped through-holes 119" with wider upper portions and narrower lower portions, instead of stepped through-holes 119. In addition, the lenses 108' used in the laser array module 101" have diameters larger than the diameter of the upper portions of the through-holes 119", such that the lenses 108' will not fit within the through-holes 119" of the lens array substrate layer 110".

In some embodiments, in FIG. 2AI, the laser array module 101' includes a heat sink module 111' with the straight through-holes 120', and further includes a lens array substrate layer 110', where the lens array substrate layer 110' includes straight through-holes 119', instead of stepped through-holes 119' or 119". In addition, the lenses 108' used in the laser array module 101' have diameters larger than the diameter of the through-holes 119', such that the lenses 108' will not fit within the through-holes 119' of the lens array substrate layer 110'.

FIG. 2AJ illustrates a lens array substrate layer 110' that includes an array of straight through-holes 119'. The lens array substrate layer 110' can replace the lens array substrate layer 110 in various embodiments of the laser array module described herein.

FIG. 2AK illustrates a lens array substrate layer 110" that includes an array of stepped through-holes 119". The stepped through-holes 119" each has a cylindrical upper portion and a cylindrical lower portion that are joined by a respective ring-shaped surface. The stepped through-holes 119" each have a smaller diameter in the upper portion and a larger diameter in the lower portion. The lens array substrate layer 110" can replace the lens array substrate layer 110 or lens array substrate layer 110' in various embodiments of the laser array module described herein.

FIG. 2AL illustrates a heat sink module 111' that can replace the heat sink module 111 in various embodiments of the laser array module described herein. The heat sink module 111' includes an array of straight through-holes 120' instead of the stepped through-holes 120.

FIGS. 2AM-2AS illustrate some exemplary configurations for the laser array modules, when various combinations of the heat sink modules (e.g., 111, and 111') and lens array substrate layers (e.g., 110, 110' and 110") are used. Descriptions of the example configurations in FIGS. 2AM-2AS focus on the key differences from the embodiments shown earlier with the laser array module 101, descriptions of other components and arrangements thereof in the laser array modules shown in FIGS. 2AM-2AS can be found at least in the descriptions of laser array module 101 and accompanying FIGS. 2A-2H, for example, and are not repeated here.

As shown in FIG. 2AM, the laser array module 101-*a* includes a lens array substrate layer 110 (with stepped through-holes 119) and a heat sink module 111 (with stepped through-holes 120), but the lenses 108 are replaced with larger lenses 108'. The larger lenses 108' do not reside within the upper portion of the stepped through-holes 119 of the laser array substrate layer 110; instead, each lens 108' is disposed on the top surface of the lens array substrate layer 110. In this particular configuration, the stepped through-holes 119 are each wider in the top portion and narrower in the lower portion. The diameter of the lenses 108' is greater than the diameter of the top portion of the stepped through-hole 119. The position of the lenses 108' can be adjusted during assembly (before being glued to the surface of the lens array substrate layer 110) such that the alignment and focus requirements of the laser array module are met by each laser diode-lens pair. One advantage of having a stepped through hole that is wider on top is that the diverging output from the laser diodes are less likely to be blocked by the top portion of the through-holes 119. In some embodiments, the through-hole 119 needs not have a step along its body, and the diameter of the through-hole can be gradually increasing from the bottom to top. In some embodiments, as shown in FIG. 2AM, the metal enclosure of the laser diode 1 fit within the lower portion of the stepped through-hole 119, and the lower edge of the through-hole 119 rests on top of the edge of the support plate of the laser diode 1. This configuration allows the lens support substrate layer to press the laser diodes 1 against the step within the through-holes 120 in the heat sink module 111, so that rotation of the laser diodes 1 is prevented.

FIG. 2AN shows another embodiment (e.g., laser array module 101-*b*) that is similar to the embodiment shown in FIG. 2AM, except that the lens array substrate layer 110 with the stepped through-holes 119 are replaced with the lens array substrate layer 110' with straight through-holes 119'. In this example embodiment, the lenses 108' are resting on the top surface of the lens array substrate layer 110' in the same manner that the lenses 108' rest on the top surface of the lens array substrate layer 110 in FIG. 2AM. In this configuration, the metal enclosures of the laser diodes 1 are residing within the lower portions of the through-holes 119', such that the lower edges of the through-holes 119' are pressed against the edges of the support plates of the laser diodes 1.

FIG. 2AO shows another embodiment (e.g., laser array module 101-c) that is similar to the embodiments shown in FIG. 2AM, except that the lens array substrate layer 110 with the stepped through-holes 119 are replaced with the lens array substrate layer 110" with stepped through-holes 119". In this example embodiment, the lenses 108' are resting on the top surface of the lens array substrate layer 110" in the same manner that the lenses 108' rest on the top surface of the lens array substrate layer 110 in FIG. 2AM. In some embodiments, as shown in FIG. 2AO, the metal enclosure of the laser diode 1 fit within the lower portion of the stepped through-hole 119", and the lower edge of the through-hole 119" rests on top of the edge of the support plate of the laser diode 1. This configuration allows the lens support substrate layer to press the laser diodes 1 against the step within the through-holes 120 in the heat sink module 111, so that rotation of the laser diodes 1 is prevented. This configuration is suitable in cases where the size of the laser diode body is relatively large compared to the size of the lenses, a narrower top can prevent small lenses from falling into the stepped through holes in the lens array substrate layer.

FIG. 2AP illustrates another embodiment (e.g., laser array module 101-d) that is similar to the embodiment shown in FIG. 2H, except that the heat sink module 111 with stepped through-holes 120 are replaced with the heat sink module 111' with straight through-holes 120'. In this example embodiment, the support plates 2 of the laser diodes 1 are supported by the top surface of the heat sink module 111' (e.g., on the edges of the through-holes 120'), and only the conductive leads of the laser diodes 1 are within the through-holes 120'. In addition, the bottom surface of the lens array substrate layer 110 rests against the top surfaces of the support plates 2 of the laser diodes 1. When the lens array substrate layer 110 is affixed to the heat sink module 111', the lens array substrate layer 110 presses the support plates 2 of the laser diodes 1 against the top surface of the heat sink module 111', such that rotation and movement of the laser diodes 1 are prevented.

FIG. 2AQ illustrates another embodiment (e.g., laser array module 101-e) that is similar to the embodiment shown in FIG. 2AP, except that the lenses 108' are placed above the top surface of the lens array substrate layer 110.

FIG. 2AR illustrates another embodiment (e.g., laser array module 101-f) that is similar to the embodiment shown in FIG. 2AQ, except that the heat sink module 111 with stepped through-holes 120 are replaced with the heat sink module 111' with straight through-holes 120'. The lenses 108' have greater diameters than the through-holes 120'.

FIG. 2AS illustrates another embodiment (e.g., laser array module 101-g) that is similar to the embodiment shown in FIG. 2AQ, except that the through-holes in the lens array substrate layer 110" have a narrower upper portion and a wider lower portion. For example, in some embodiments, the size of the output window of the laser diodes are large, and through-hole with wider upper portions or straight through-holes in the lens array substrate layer will require very large lenses (so that they do not fall through into the holes), and would increase cost. Thus, in such situations, through-holes with narrower upper portions are desirable.

FIGS. 2H and 2AM-2AS are not an exhaustive listing of all possible combinations of the different types of through-holes in the lens array substrate layer and the heat sink module, and the different relative positions of the laser diodes and lenses. In some embodiments, the lenses 108 are affixed (e.g., by glue) to the top surface of the lens substrate layer 110 and suspended above the laser diodes 1 by air gaps. In some embodiments, the diameter of lower portion of the through-hole in the lens array substrate layer is smaller than the diameter of the metal enclosure 3 of the laser diode 1. In such embodiments, the bottom surface of the lens array substrate layer 110 is optionally supported by the top surfaces of the metal enclosures 3 of the laser diodes 1, and the lenses are separated from the tops of the metal enclosures 3 by an air gap.

Figure 2L:
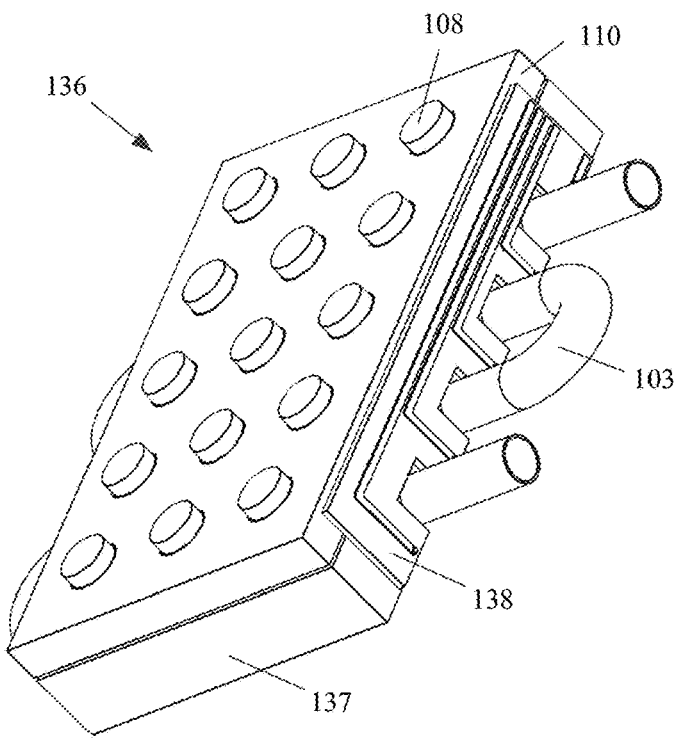
FIG. 2L illustrates the top and bottom views of another exemplary laser array module in accordance with some embodiments.
Figure 2L:
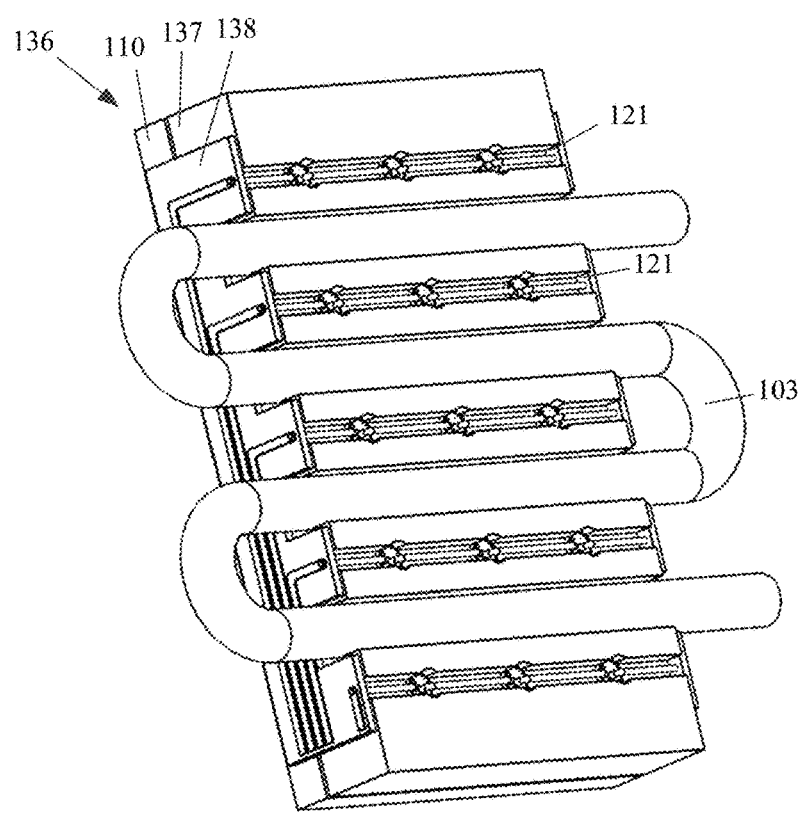

The configurations of the laser array modules (e.g., 101, 101', 101", and 101-a to 101-g) shown in FIGS. 2B-2K and 2AH-2AS are merely illustrative. Variations are possible. For example, FIG. 2L shows a laser array module 136 that is similar to the laser array module 101 shown in FIGS. 2B-2K and 2AH-2AS, except that the liquid cooling system is integrated with the heat sink module, and the driving circuit layer is placed on the sides of the heat sink module with the built-in liquid cooling system. In other words, in the laser array module shown in FIG. 2L, a liquid cooling system with built-in grooves and through-holes (e.g., stepped-through-holes) are used to accommodate the laser diode array, and thus omitting the heat sink module 111 (or variations thereof) shown in the laser array module 101 (or variations thereof). This configuration reduces the number of thermal interfaces and thus improves heat transfer efficiency of the laser array module.

Figure 2M:
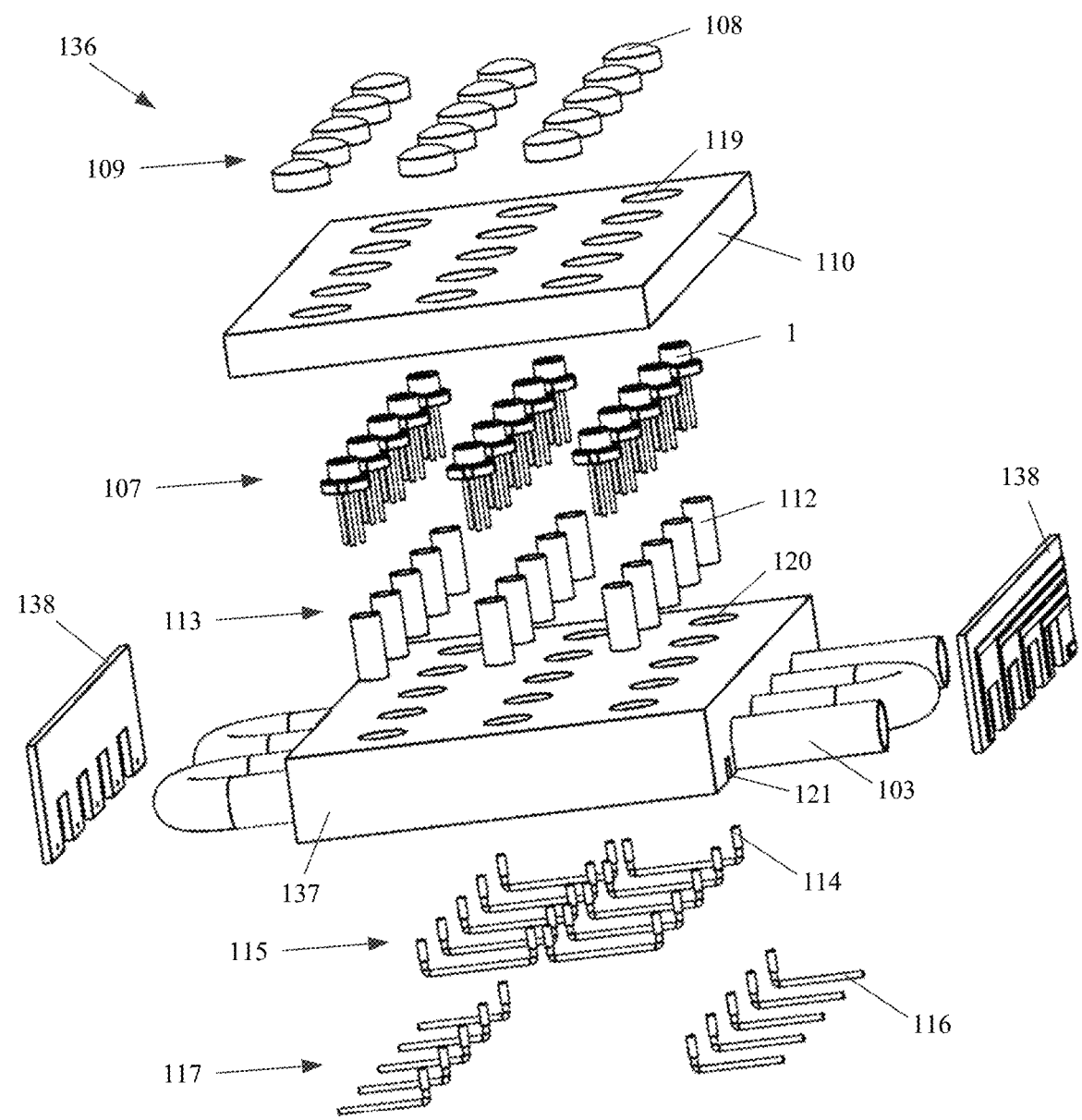
FIG. 2M illustrates an exploded view of the exemplary laser array module in FIG. 2L.

FIG. 2L-(1) shows the perspective view of the laser array module 136 from above, and FIG. 2L-(2) shows the perspective view of the laser array module 136 from below, in accordance with some embodiments. FIG. 2M shows an exploded view of the laser array module 136 in accordance with some embodiments.

As shown in FIGS. 2L and 2M, the laser array module 136 includes a heat sink module 137 that is an integration of a heat sink module such as the heat sink module 111 and the liquid cooling system 102 that are shown in FIGS. 2B-2C. As described herein, the heat sink module 137 may also be referred to as a liquid cooling module 137 since it serves both the functions of the heat sink module and the liquid cooling module in the laser array module 136.

As shown in FIGS. 2L and 2M, the heat sink module/liquid cooling module 137 includes an array of through-holes (e.g., stepped through-holes 120) at locations that correspond to the locations of the laser diodes 1 in the laser diode array 107. On the bottom surface of the heat sink module 137, grooves 121 are made to each pass through multiple adjacent through-holes (e.g., stepped through-holes 120) in the heat sink module 137. In addition, as shown in FIGS. 2L and 2M, the liquid cooling tube 103 are embedded in the substrate of the heat sink module 137, e.g., in channels created in the bottom surface of the heat sink module 137. As shown in FIGS. 2L and 2M, the laser array module 136 further includes one or more driving circuit layers 138 that are adhered to the vertical side surface(s) of the heat sink module 137. The driving circuit layers 138 include openings (e.g., slots) to allow the liquid cooling tubes 103 to pass through the driving circuit layers 138 before returning back to the channels in the heat sink module 137. In some embodiments, the liquid cooling tubes 103 have segments that are parallel to the grooves 121 in the bottom surface of the heat sink module 137. In some embodiments, the height of the driving circuit layers 138 is greater than the thickness of the heat sink module 137 and the driving circuit layers 138 may also extend to cover the sides of the lens array module as well, e.g., covering the sides of the lens substrate layer 110 (or variations thereof) as shown in FIGS. 2L and 2M.

As shown in FIGS. 2L and 2M, the laser array module 136 also includes a lens array (e.g., lens array 109) that includes lenses (e.g., lenses 108) arranged in an array pattern. The laser array module 136 further includes a lens array substrate layer (e.g., lens array substrate layer 110) that includes an array of through-holes (e.g., stepped through-holes 119) at locations corresponding to the laser diodes 1 in the laser diode array 107. The laser array module 136 further includes an array 113 of insulator tubes 112, an array 115 of U-shaped conductive lead connectors 114, and an array 117 of L-shaped conductive lead connectors 116. When assembled, the lenses (e.g., lenses 108) are placed within (or above) the lens array substrate layer (e.g., the lens array substrate layer 110, 110', or 110") and the laser diodes 1 are placed at least partially within the through-holes (e.g., stepped through-holes 120) in the heat sink module 137 in a manner as shown in FIG. 2H-(2) (or variations thereof as described in Figures AM-AS). Furthermore, the insulator tubes 112 are placed within the through-holes (e.g., stepped through-holes 120) and the laser diodes 1 are connected to the U-shaped conductive lead connectors 114 and the L-shaped conductive lead connectors 116 in the manner shown in FIG. 2H as well (or variations thereof as described in Figures AM-AS). The L-shaped conductive lead connectors 116 connect the leads 4 of the laser diodes 1 with the driving circuit layers 138.

Although the example shown in FIGS. 2L and 2M is a modification based on a configuration of the laser array module 101 shown in FIG. 2B, similar modifications can be applied to laser array modules 101', 101", 101-a through 101-g shown in FIGS. 2AM-2AS as well. For example, FIGS. 2AT and 2AU illustrate example laser array modules 136' and 136".

In FIG. 2AT, the laser array module 136' includes a heat sink module 137' which is an integrated heat sink and liquid cooling module. The heat sink module 137' includes straight through-holes 120' that replace the stepped through-holes 120. The relative positions of the laser array diodes 1, the insulator tubes 112, the through-holes 120' in the heat sink module 137', the lens array substrate layer 110, and the lenses 108 are similar to those shown in FIG. 2AP, for example. The relative positions of the driving circuit module 138, liquid cooling tubes 103, conductive lead arrays 115 and 117, insulator tubes 112, and the heat sink module 137' are similar to those shown in FIG. 2M, for example.

Similarly, in FIG. 2AU, laser array module 136" includes an integrated heat sink module 137' with straight through-holes 120'. The laser array module 136" is similar to the laser array module 136' shown in FIG. 2AT, except that the lens array substrate layer 110" include stepped through-holes 119" that are narrower in the lower portions and wider in the upper portions. The relative positions of the laser array diodes 1, the insulator tubes 112, the through-holes 120' in the heat sink module 137', the lens array substrate layer 110", the through-holes 119", and the lenses 108' are similar to those shown in FIG. 2AS, for example. The relative positions of the driving circuit module 138, liquid cooling tubes 103, conductive lead arrays 115 and 117, insulator tubes 112, and the heat sink module 137' are similar to those shown in FIG. 2M, for example.

Figure 2N:
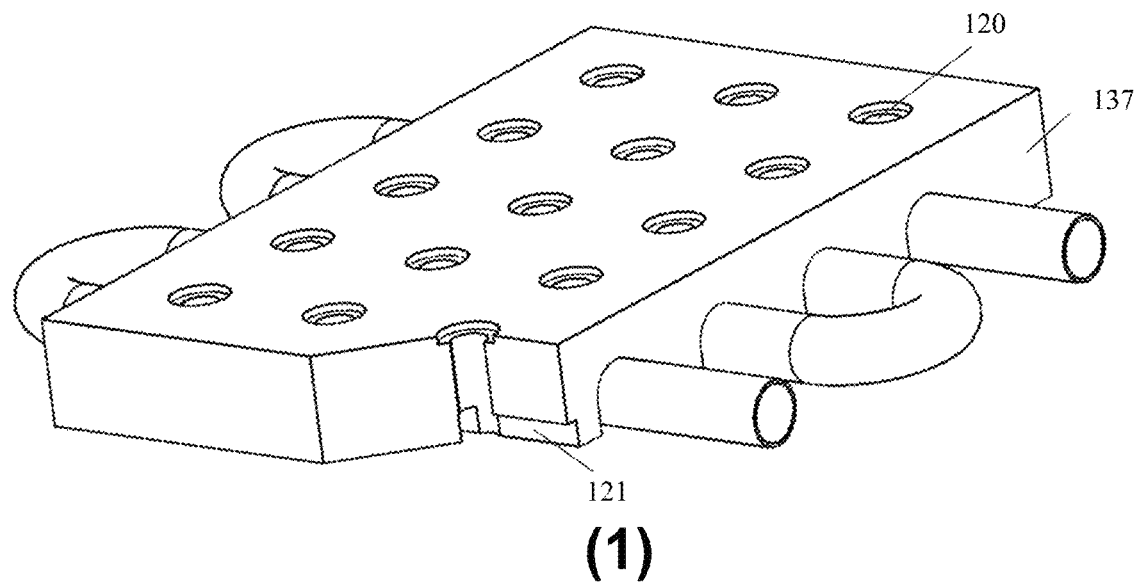
FIG. 2N illustrates the heat sink module in the exemplary laser array module shown in FIGS. 2L and 2M, in accordance with some embodiments.
Figure 2N:
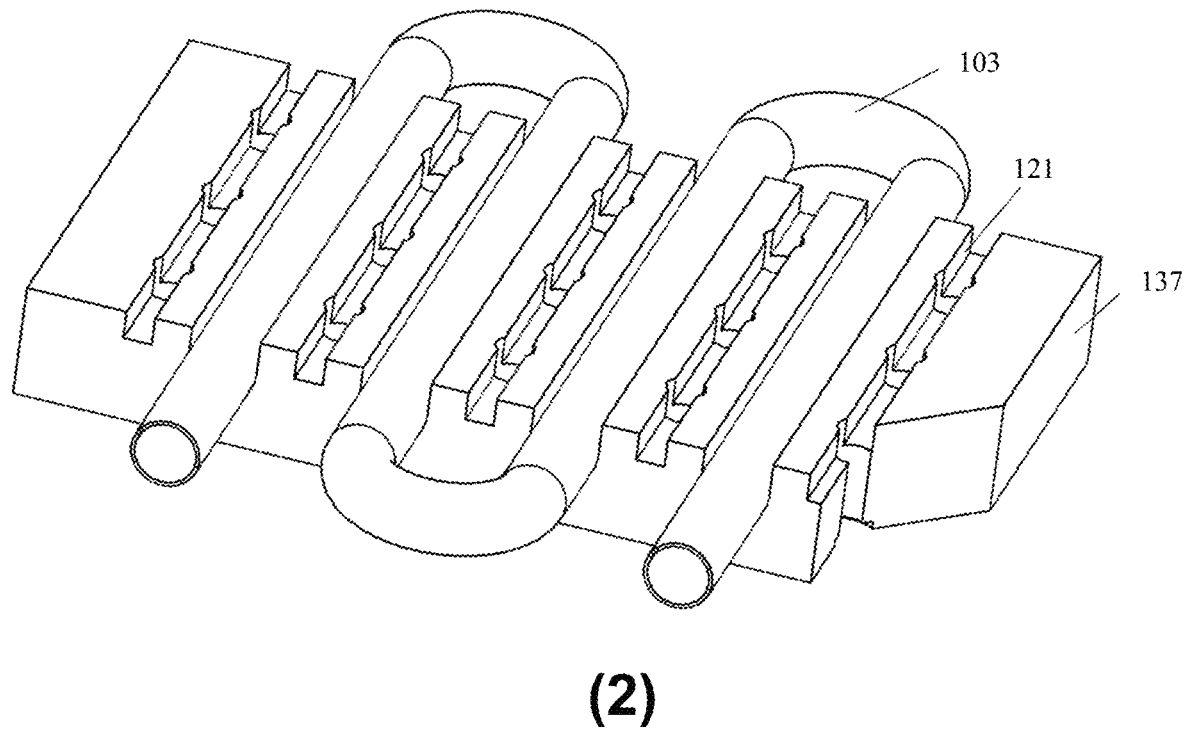

Other variations of the heat sink module 137 can be based on the configurations (e.g., with various combinations of the through-holes 120 and 120' in the heat sink module, the through-holes 119, 119', 119" in the lens array substrate layer, and lenses 108 and 108' in the lens array) shown in FIGS. 2AM-2AO and 2AQ-2AR, for example. FIGS. 2L-2M, 2AT and 2AU show that the liquid cooling tube 103 is placed within channels created in the bottom surface of the heat sink module 137, 137' and/or 137" in accordance with some embodiments. FIG. 2N shows the heat sink module 137 with the liquid cooling tube 103 placed within channels carved in the bottom surface of the heat sink module 137. FIG. 2N-(2) also shows that the liquid cooling tube 103 includes a plurality of linear segments that run parallel to the grooves 121 in the bottom surface of the heat sink module 137. It is also possible to create channels in the top surface of the heat sink module to accommodate the liquid cooling tube 103 in accordance with some embodiments. For example, in the heat sink module 139 shown in FIG. 2O, the liquid cooling tube 103 is placed within channels carved in the top surface of the heat sink module 139.

Figure 2O:
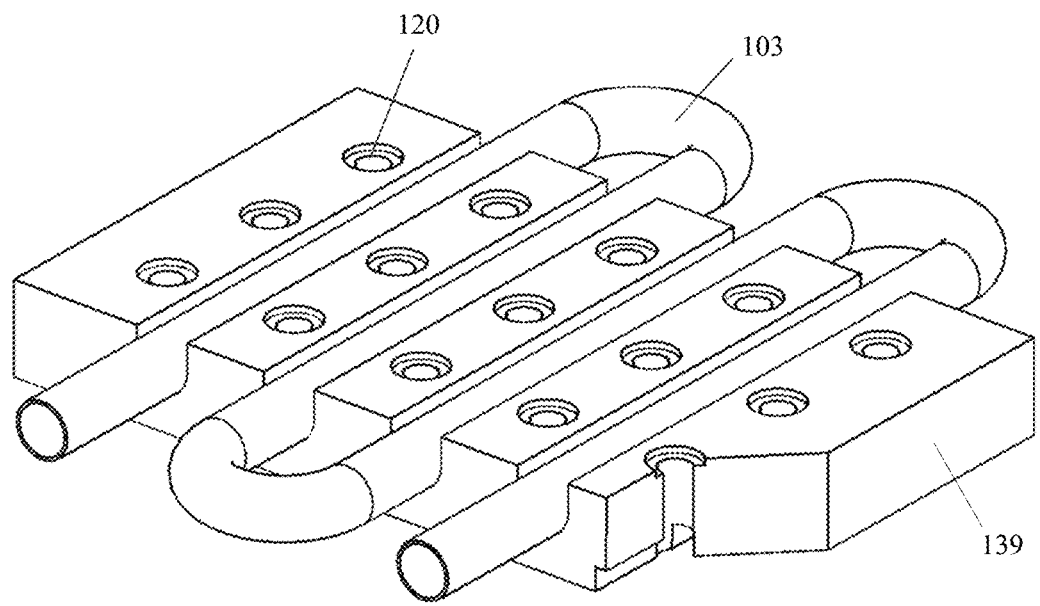
FIG. 2O illustrates the top and bottom views of another heat sink module in accordance with some embodiments.
Figure 2O:
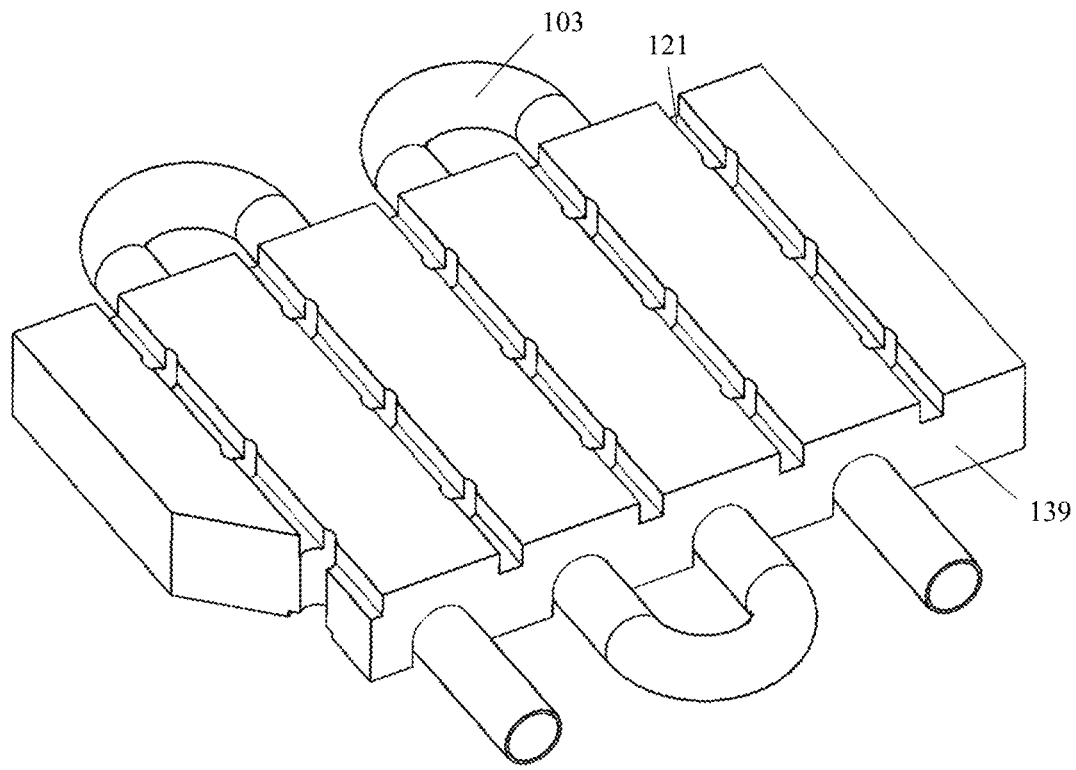
Figure 2P:
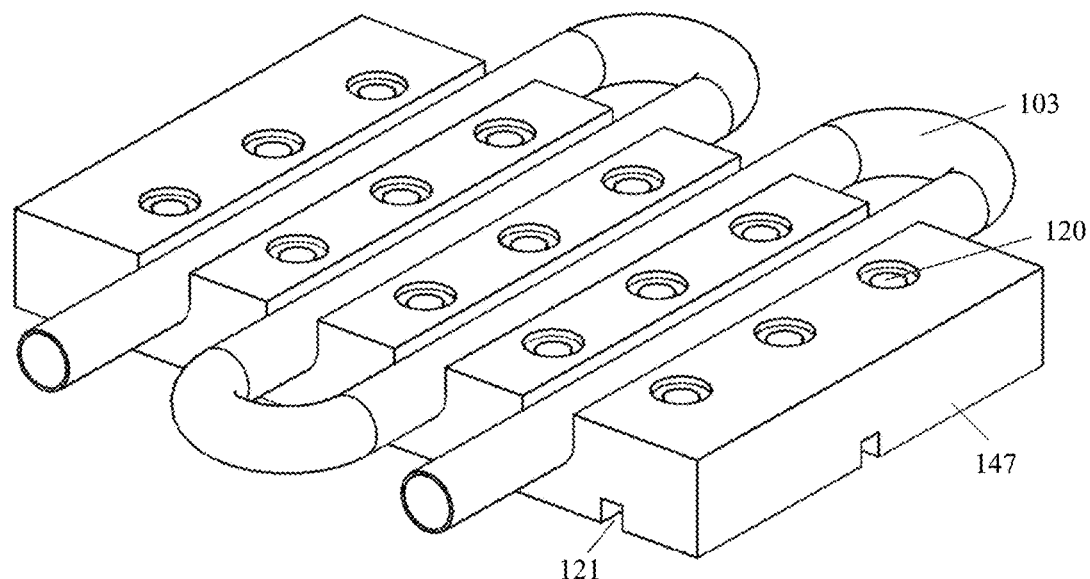
FIG. 2P illustrates the top and bottom views of another heat sink module in accordance with some embodiments.
Figure 2P:
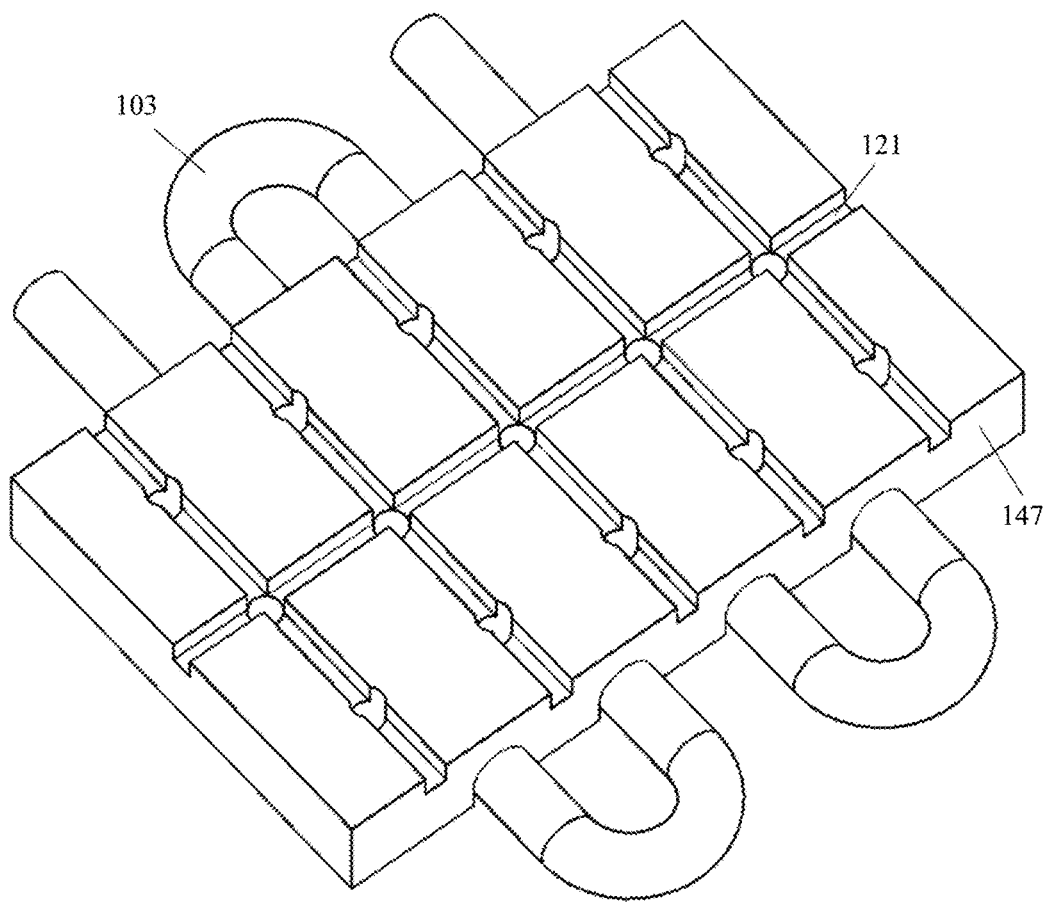

In some embodiments, when the laser diodes 1 in the diode array 107 are oriented such that only parallel grooves 121 need to be created in the bottom surface of the heat sink module (e.g., as shown in FIG. 2G), the channels for the liquid cooling tube 103 may be created on either the top surface or the bottom surface of the heat sink module (e.g., as shown in FIGS. 2N and 2O, respectively). However, in some embodiments, when the laser diodes 1 in the diode array 107 are oriented such that crossing of the grooves 121 in the bottom surface of the heat sink module are required (e.g., as shown in FIGS. 2I-2K), the channels for the liquid cooling tube 103 may be created in the top surface of the heat sink module to avoid interfering with the positioning of the grooves 121 in the bottom surface of the heat sink module. For example, as shown in FIG. 2P, the channels for the liquid cooling tube 103 are created in the top surface of the heat sink module 147, while the grooves 121 for the U-shaped conductive lead connectors and the L-shaped conductive lead connectors are created in the bottom surface of the heat sink module 147. In some embodiments, crossing of the grooves 121 may coexist with the channels for liquid cooling tube 103 on the same side of the heat sink module, provided that the depths of the grooves and channels are such that the conductive leads and the cooling tube 103 will not interfere with each other at the same depth level (e.g., the channels are deeper than the grooves, or vice versa).

The examples shown in FIGS. 2N-2P are based on heat sink modules that have stepped through-holes 120. Similar configurations of the heat sink module, the grooves, and the liquid cooling tubes, can also be based on the heat sink modules that have straight through-holes 120'. For example, FIG. 2AV shows the top and bottom views of an integrated heat sink module 137' with straight through-holes 120'. Similar to the heat sink module 137 shown in FIG. 2N, the heat sink module 137' includes the channels on the bottom surface of the heat sink module 137', and the channels include segments that are parallel to the linear grooves 121 in the bottom surface of the heat sink module 137'.

In another example, FIG. 2AW shows the top and bottom views of an integrated heat sink module 139' with straight through-holes 120'. Similar to the heat sink module 139 shown in FIG. 2O, the heat sink module 139' includes the channels on the top surface of the heat sink module 139', and the channels include segments that are parallel to the linear grooves 121 in the bottom surface of the heat sink module 139'.

In another example, FIG. 2AX shows the top and bottom views of an integrated heat sink module 147' with straight through-holes 120'. Similar to the heat sink module 147 shown in FIG. 2P, the heat sink module 147' includes the channels on the top surface of the heat sink module 147', and the channels include segments that are parallel to some of the linear grooves 121 in the bottom surface of the heat sink module 147', but perpendicular to some other linear grooves 121 in the bottom surface of the heat sink module 147'.

Figure 2Q:
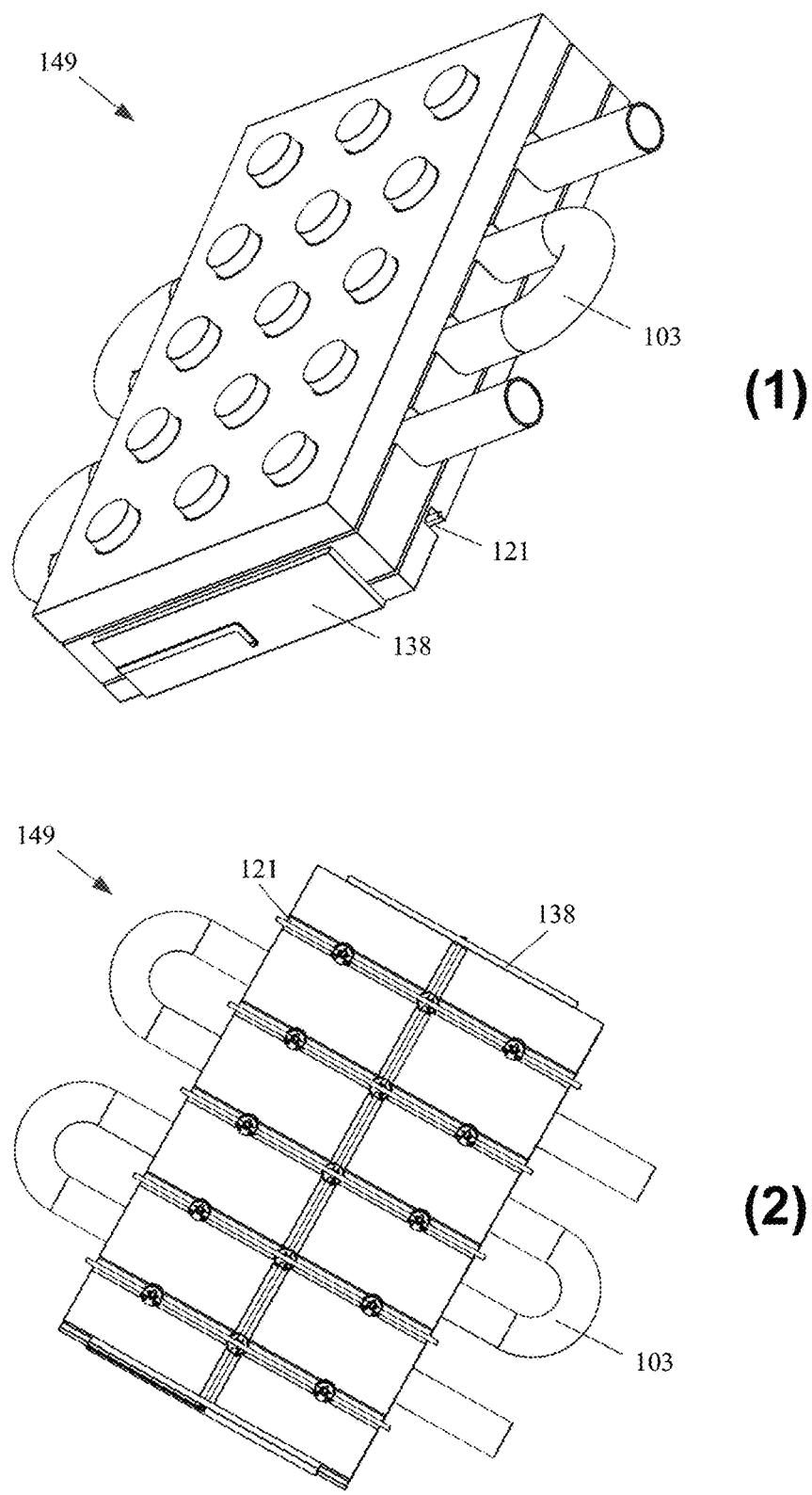
FIG. 2Q illustrates the top and bottom views of another exemplary laser array module in accordance with some embodiments.

In some embodiments, the layer of substrate with the grooves 121 can be fabricated separately from the layer of substrate with the channels for accommodating the liquid cooling tube 103. The layer of substrate with the channels for accommodating the liquid cooling tube 103 also include the upper portions of the stepped through-holes 120, and optionally part of the lower portion of the stepped through-holes 120. The layer of substrate with the grooves also includes at least part of the lower portions of the stepped through-holes 120. The heat sink module is created by aligning the respective portions of the stepped through holes 120 in both layers of substrate and adhere the two layers together. FIG. 2Q illustrates an example heat sink module 149 having the two-layer configuration. The circuit driving layer 138 are placed on the sides of the heat sink module 149 that are not passed through by the liquid cooling tube 103.

In some embodiments, when the liquid cooling system is integrated with the heat sink module, it is also possible to include the driving circuit layer next to the bottom surface of the heat sink module, or have a portion of the driving circuit layer wrap down onto the bottom surface of the heat sink module from the vertical side(s) of the heat sink module, in accordance with some embodiments. The heat exchange interface is still separated from the driving circuit layer in such configurations, provided that the conductive lead connectors 114 and 116 are completely held within the grooves 121, and are physically separated from the driving circuit layer or portions thereof that are placed adjacent to the bottom surface of the heat sink module.

FIGS. 2B-2Q and 2AH-2AX illustrate the configurations of single-sided laser array modules in accordance with some embodiments. In some embodiments, many of the features of the single-sided laser array module may be adapted for use in a double-sided laser array module. For example, in some embodiments, two diode laser arrays may share the same liquid cooling system sandwiched in between the two diode laser arrays.

Figure 2R:
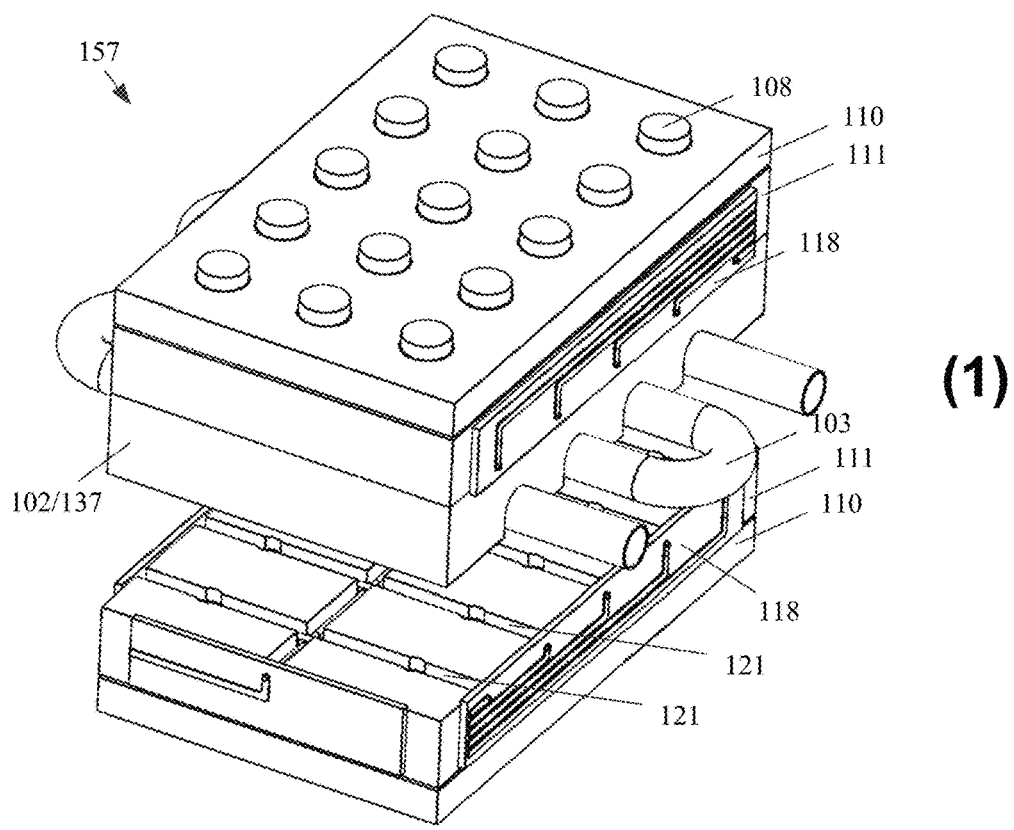
FIG. 2R illustrates an exemplary double-sided laser array module in accordance with some embodiments.
Figure 2R:
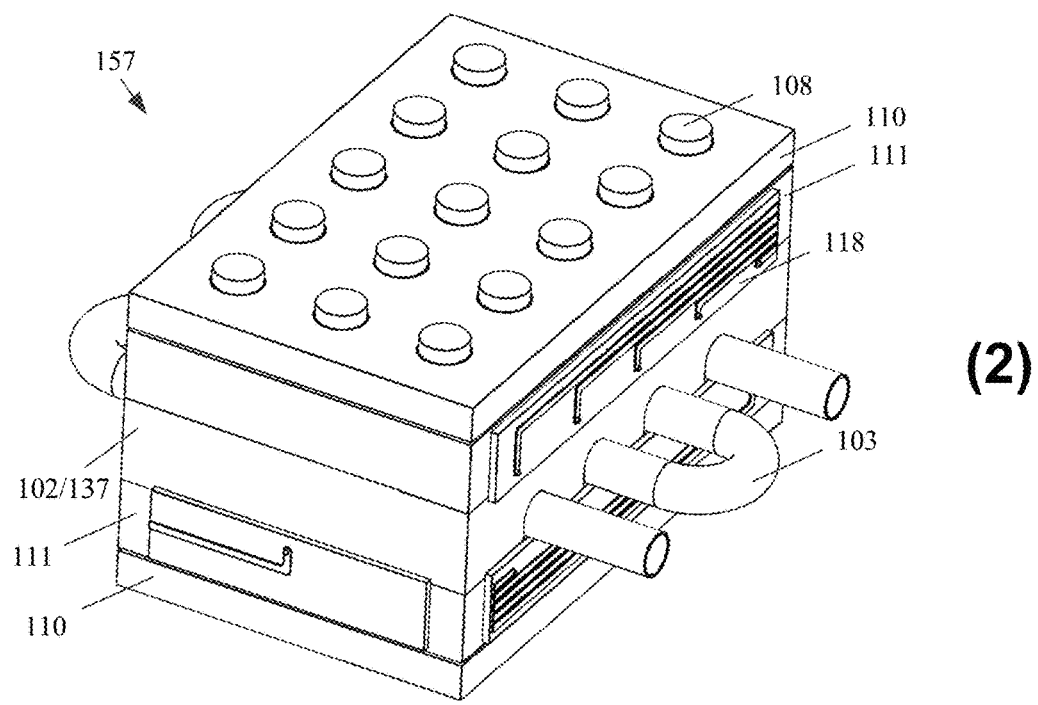

FIG. 2R illustrates a double-sided laser array module 157 that has a single liquid cooling layer shared by two diode arrays. FIG. 2R-(1) shows a perspective view of the double-sided laser array module 157 from above, where the upper portion of the laser array module 157 is lifted away from the lower portion of the laser array module 157 to reveal the internal features of the double-sided laser array module 157. FIG. 2R-(2) shows a perspective view of the double-sided laser array module 157 with the upper and lower portions fitted together.

As shown in FIG. 2R, the structure of the upper portion of the double-sided laser array module 157 is the same as the single-sided laser array module 101 (or a variation thereof) or the single-sided laser array module 136 (or a variation thereof). The upper portion of the double-sided laser array module 157 has its own driving circuit layers 118 on the sides of the laser array module above the liquid cooling layer 102/137. In some embodiments, the driving circuit layers of the upper portion of the double-sided laser array module 157 may also cover the sides of the liquid cooling layer 102/137, with slots to allow the liquid cooling tubes 103 to pass through (e.g., as does the driving circuit layer 138 shown in FIGS. 2M, 2AT, and 2AU).

As shown in FIG. 2R, the channels for accommodating the liquid cooling tube 103 are created in the bottom surface of the liquid cooling layer 102/137. As shown in FIG. 2R, the lower portion of the double-sided laser array module 157 is the same as the single-sided laser array module 101 (or a variation thereof) or the single-sided laser array module 136 (or a variation thereof), without the liquid cooling layer 102/137. The lower portion of the double-sided laser array module 157 shares the liquid cooling layer 102/137 with the upper portion of the double-sided laser array module 157. The lower portion of the double-sided laser array module 157 has its own set of lens arrays, heat sink module, driving circuit layers, and conductive lead connectors. In the example shown in FIG. 2R, the liquid cooling layer and the heat sink modules of the top and bottom laser diode arrays are separate layers, and the liquid cooling layer accepts the heat transferred from the heat sink modules of both the top and the bottom laser diode arrays. With respect to the bottom laser diode array, the channels are carved in the top surface of the liquid cooling module (the surface that is next to the bottom surface of the heat sink module).

Similar double-sided laser array modules can be built based on laser array modules (e.g., laser array modules 101', 101", 101-a to 101-g) and subcomponents thereof (e.g., heat sink modules 111, 111', 136, 136', 137, 137', 139, 139', 147, 147', and 149, and lens array substrate layers 110, 110', and 110", etc.), as shown in FIGS. 2AH-2AX.

Figure 2S:
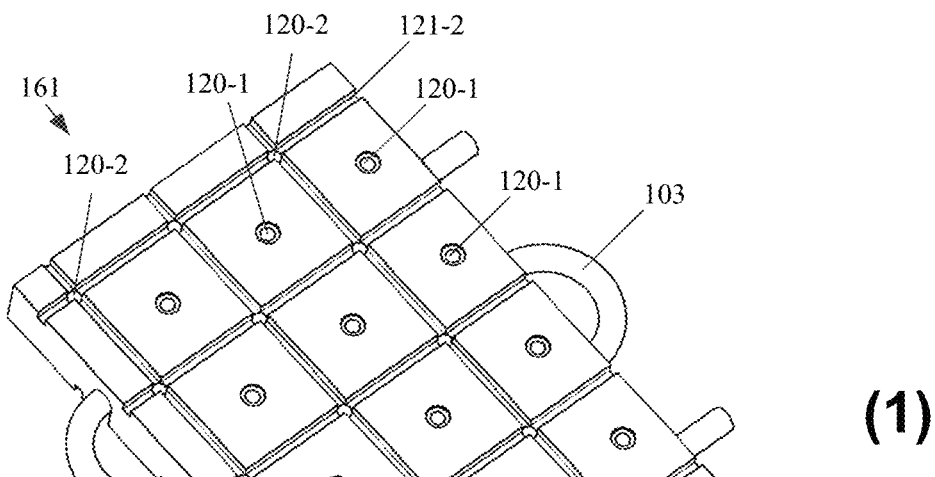
FIG. 2S illustrates the top and bottom views of another heat sink module in accordance with some embodiments.
Figure 2S:
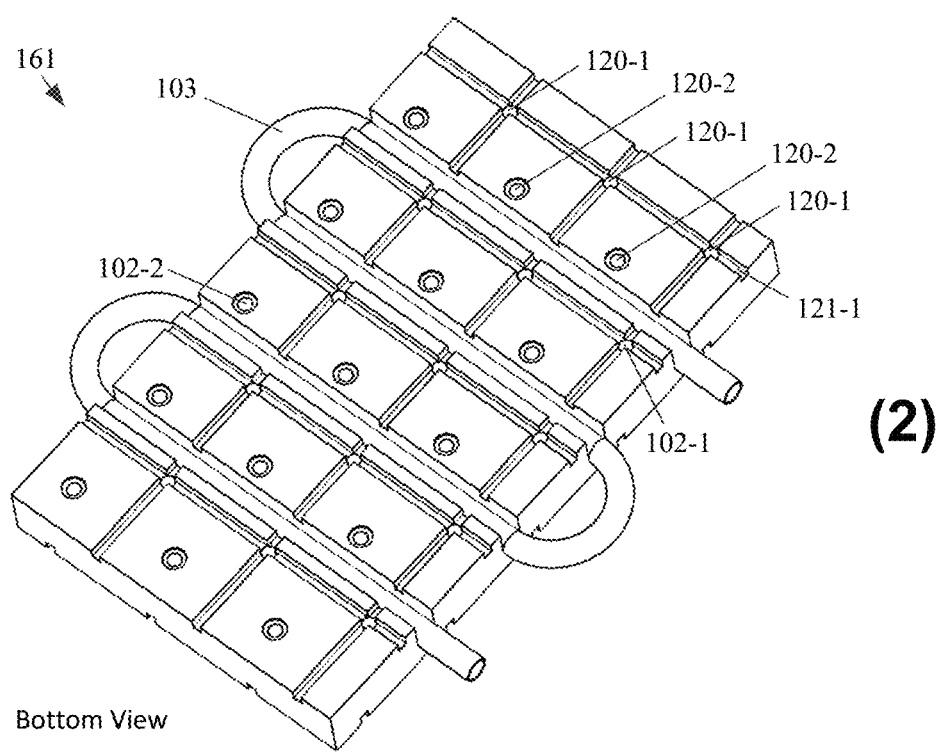
Figure 2T:
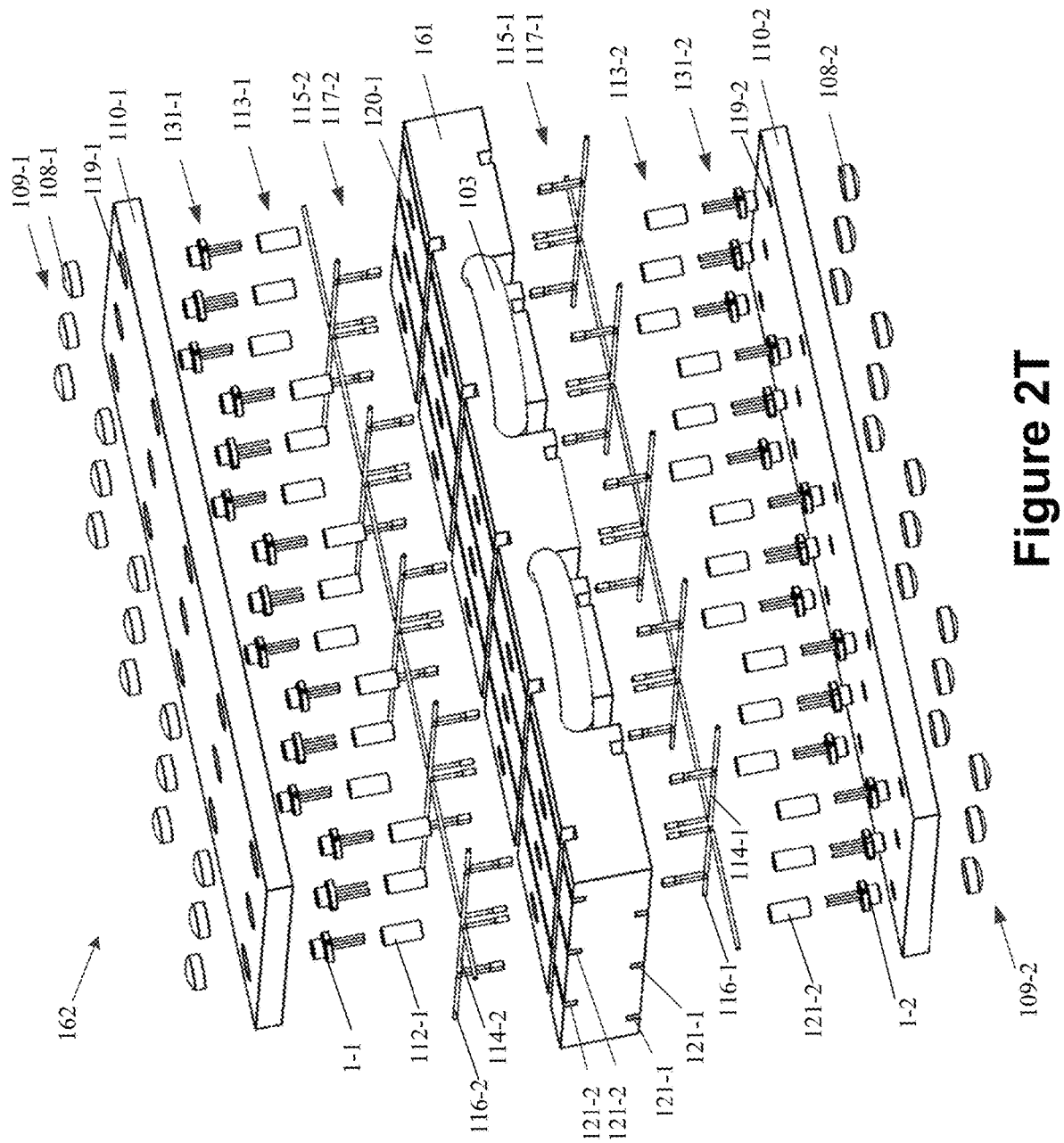
FIG. 2T illustrates another exemplary double-sided laser array module in accordance with some embodiments.

In some embodiments, in addition to sharing the liquid cooling layer, a double-sided laser diode array module can further share the heat sink module and/or the driving circuit layers. As shown in FIGS. 2S and 2T, a double-sided laser array module 162 includes an integrated heat sink/liquid cooling module 161, where the integrated heat sink/liquid cooling module 161 serves the laser arrays 131 (e.g., laser arrays 131-1 and 131-2) on both sides of the double-sided laser array module 162 (and analogously, suffixes "x-1" and "x-2" are used to refer to a subset of components x in the double-sided laser array module that are associated with the laser array 131-1, and 131-2, respectively).

In some embodiments, the integrated heat sink/liquid cooling module 161 includes two arrays of through-holes (e.g., two arrays of stepped through-holes 120 (e.g., an array of stepped through-holes 120-1 and an array of stepped through-holes 120-2)), each array of through-holes (e.g., stepped through-holes 120) accommodate a respective laser diode array 131 facing a respective side (e.g., the top-side or the bottom side, as described herein, the laser-diode array 131-1 face the top side of the laser diode array 162, and the laser diode array 131-2 face the bottom side of the laser diode array 162) of the double-sided laser array module 161. Furthermore, the two arrays of through-holes (e.g., stepped through-holes 120) are offset from each other by a respective distance (e.g., a half the grid size of the array of through-holes (e.g., stepped through-holes 120)).

FIG. 2S-(1) shows the perspective view of the integrated heat sink/liquid cooling module 161 from above, and FIG. 2S-(2) shows the perspective view of the integrated heat sink/liquid cooling module 161 from below, in accordance with some embodiments. As shown in FIG. 2S-(1) and FIG. 2T, the array of through holes (e.g., stepped through-holes 120-1, or straight through-holes) are for accommodating the laser diode array 131-1 facing the top side of the double-sided laser array module 162. As shown in FIG. 2S-(2) and FIG. 2T, the array of through-holes (e.g., stepped through-holes 120-2 or straight through-holes) are for accommodating the laser diode array 131-2 facing the bottom side of the double-sided laser array module 162.

As shown in FIG. 2S-(1), grooves 121-2 are formed in the top surface of the heat sink module 161, and each groove 121-2 links the lower portions of a sequence of stepped through-holes 120-2. As shown in FIG. 2S-(2), grooves 121-1 are formed in the bottom surface of the heat sink module 161, and each groove 121-1 links the lower portions of a sequence of through-holes (e.g., stepped through-holes 120-1).

As shown in FIGS. 2S-(1) and 2S-(2), the liquid cooling tube 103 includes multiple linear portions that are connected by curved portions, and the linear portions run parallel to one subset of linear grooves (e.g., the linear grooves 121-1, or the linear grooves 121-2) and run perpendicular to the other subset of linear grooves in the same grid pattern.

As shown in FIGS. 2S-(1) and 2S-(2), the liquid cooling tube 103 resides in channels that are opened from the bottom surface of the heat sink module 161, in accordance with some embodiments. In some embodiments, the channels for the liquid cooling tube 103 are opened from the top surface of the heat sink module 161. In some embodiments, the channels for the liquid cooling module are completely embedded between the top and bottom surfaces of the heat sink module. In some embodiments, the liquid cooling tube 103 is replaced with a fluid channel created within the top and bottom surfaces of the heat sink module, with the beginning of the fluid channel connected to the inlet 104, and the end of the fluid channel connected to the outlet 105, e.g., as shown in FIGS. 2AA and 2AE, and FIGS. 2BA and 2BC.

FIG. 2T shows an exploded view of the double-sided laser array module 162. As shown in FIG. 2T, the components of the double-sided laser array module 162 are substantially identical on both sides of the heat sink module 161.

As shown in FIG. 2T, on the top side of the laser array module 162, a first lens array 109-1 with an array of lenses 108-1 are placed within an array of first through-holes (e.g., first stepped through-holes 119-1) in a first lens array substrate 110-1 (e.g., the lens array substrate 110 in FIG. 2D). The first through-holes (e.g., the first stepped through holes 119-1) in the first lens array substrate 110-1 also accommodate the upper portions of the laser diodes 1-1 in the first laser diode array 131-1, e.g., in the manner shown in FIG. 2H-(2). The laser diodes 1-1 in the first laser diode array 131-1 are inserted in the array of through-holes (e.g., stepped through-holes 120-1) in the heat sink module 161. The lower portions of the laser diodes 1-1 in the first laser diode array 131-1 are separated (and electrically insulated) from the walls of the through-holes (e.g., stepped through-holes 120-1) by a first array 113-1 of respective insulator tubes 112-1. On the bottom surface of the heat sink module 161, grooves 121-1 are created to link respective sequences of through-holes (e.g., stepped through-holes 120-1). In addition, in some embodiments, channels are opened from the bottom surface of the heat sink module 161 to accommodate a liquid cooling tube 103. Lastly, the array 115-1 of U-shaped conductive lead connectors 114-1 link the conductive leads of the laser diodes 1-1 in respective rows (or columns) in the first laser diode array 131-1, and the array 117-1 of L-shaped conductive lead connectors 116-1 link the conductive leads of the laser diodes 1-1 on the edges of the array 131-1 to the driving circuit layer(s) (not shown in FIG. 2T) that are disposed on the vertical side(s) of the laser array module 162 (e.g., at least partially covering the vertical sides of the heat sink module 161).

As shown in FIG. 2T, on the reverse side of the laser array module 161, a second lens array 109-2 with an array of lenses 108-2 are placed within a second array of through-holes (e.g., a second array of stepped through-holes 119-2) in a second lens array substrate 110-2 (e.g., the lens array substrate 110 in FIG. 2D). The through-holes (e.g., stepped through holes 119-2) in the second lens array substrate 110-2 accommodate the upper portions of the laser diodes 1-2 in the second laser diode array 131-2, e.g., in the manner shown in FIG. 2H-(2). The laser diodes 1-2 in the second laser diode array 131-2 are inserted in the array of through-holes (e.g., stepped through-holes 120-2 (not clearly visible in the view shown in FIG. 2T)) in the heat sink module 161. The lower portions of the laser diodes 1-2 (e.g., including the conductive leads of the laser diodes 1-2) in the second laser diode array 131-2 are separated (and electrically insulated) from the walls of the stepped through-holes 120-2 by a second array 113-2 of respective insulator tubes 121-2. On the top surface of the heat sink module 161, grooves 121-2 are created to link respective sequences of through-holes (e.g., stepped through-holes 120-2).

As shown in FIG. 2T, the arrays of through-holes in the lens support module (e.g., stepped through-holes 119-1 and 119-2), the arrays of through-holes in the heat sink module (e.g., stepped through-holes 120-1 and 120-2), and corresponding laser diode arrays 131-1 and 131-2 are offset from each other, respectively, so that each row of laser diodes 1-1 from the first laser diode array 131-(1) are offset from a corresponding row of laser diodes 1-2 from the second laser diode array 131-(2), and each column of laser diodes 1-1 from the first laser diode array 131-(1) are offset from a corresponding column of laser diodes 1-2 from the second laser diode array 131-(2).

Figure 2U:
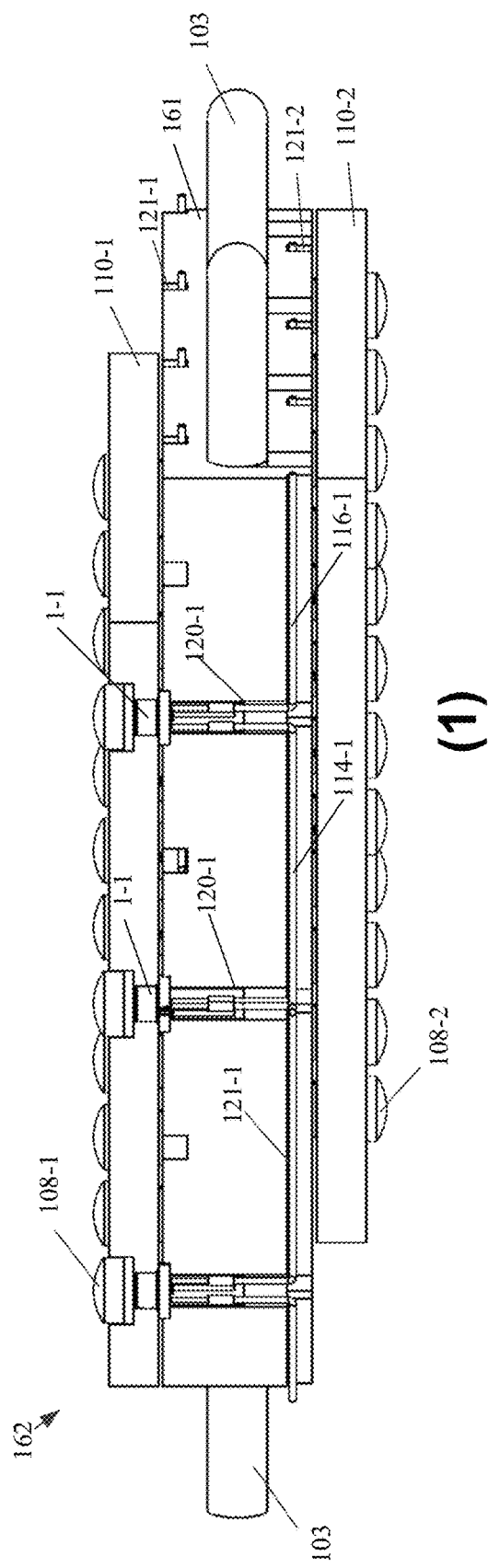
FIG. 2U illustrates the cross-sectional views of the exemplary double-sided laser array module shown in FIG. 2T.
Figure 2U:
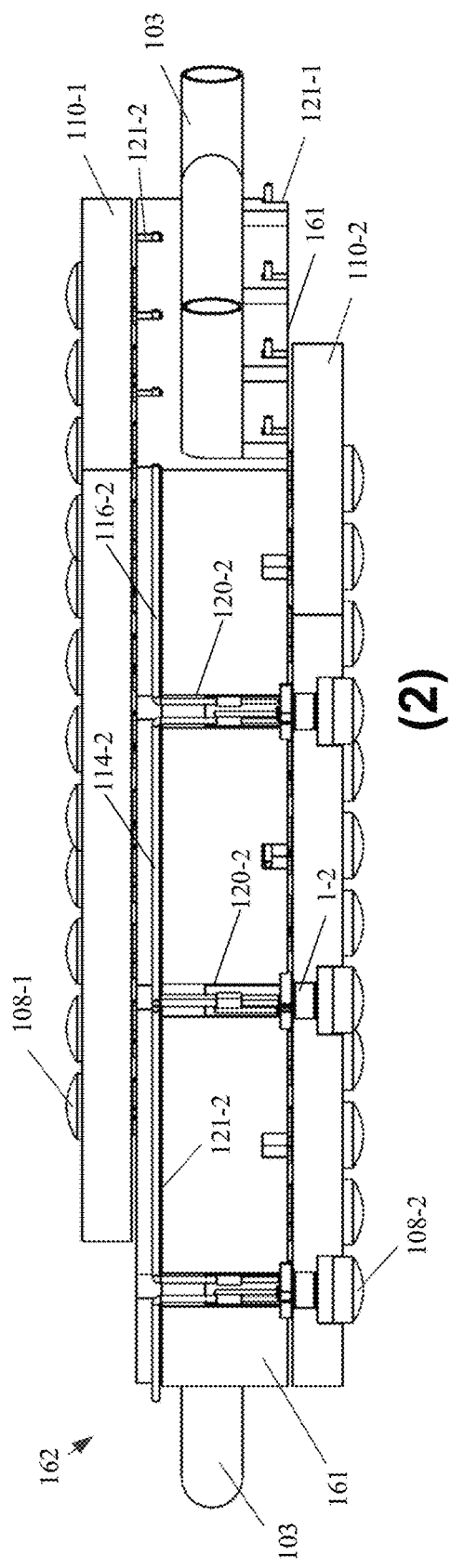

FIG. 2U illustrates the relative positions of the lenses 108, the laser diodes 1, the insulator tubes 112, the conductive lead connectors 114 and 116, the through-holes in the lens support module (e.g., the stepped through-holes 119), the through-holes in the heat sink module (e.g., the stepped through-holes 120), and the grooves 121, in the double-sided laser array module 162. FIG. 2U-(1) shows the double-sided laser array module 162 from a first vertical cross-section through a row or a column of laser diodes 1-1 facing the top side of the double-sided laser array module 162. FIG. 2U-(2) shows the double-sided laser array module 162 from a second vertical cross-section through a row or a column of laser diodes 1-2 facing the bottom side of the double-sided laser array module 162. FIG. 2U is similar to FIG. 2H-(2) in the relative positions of the components serving each side of double-sided laser array module 162. Similar double-sided laser array modules can also be built according to the configurations shown in FIGS. 2AM-2AS, for example.

Figure 2V:
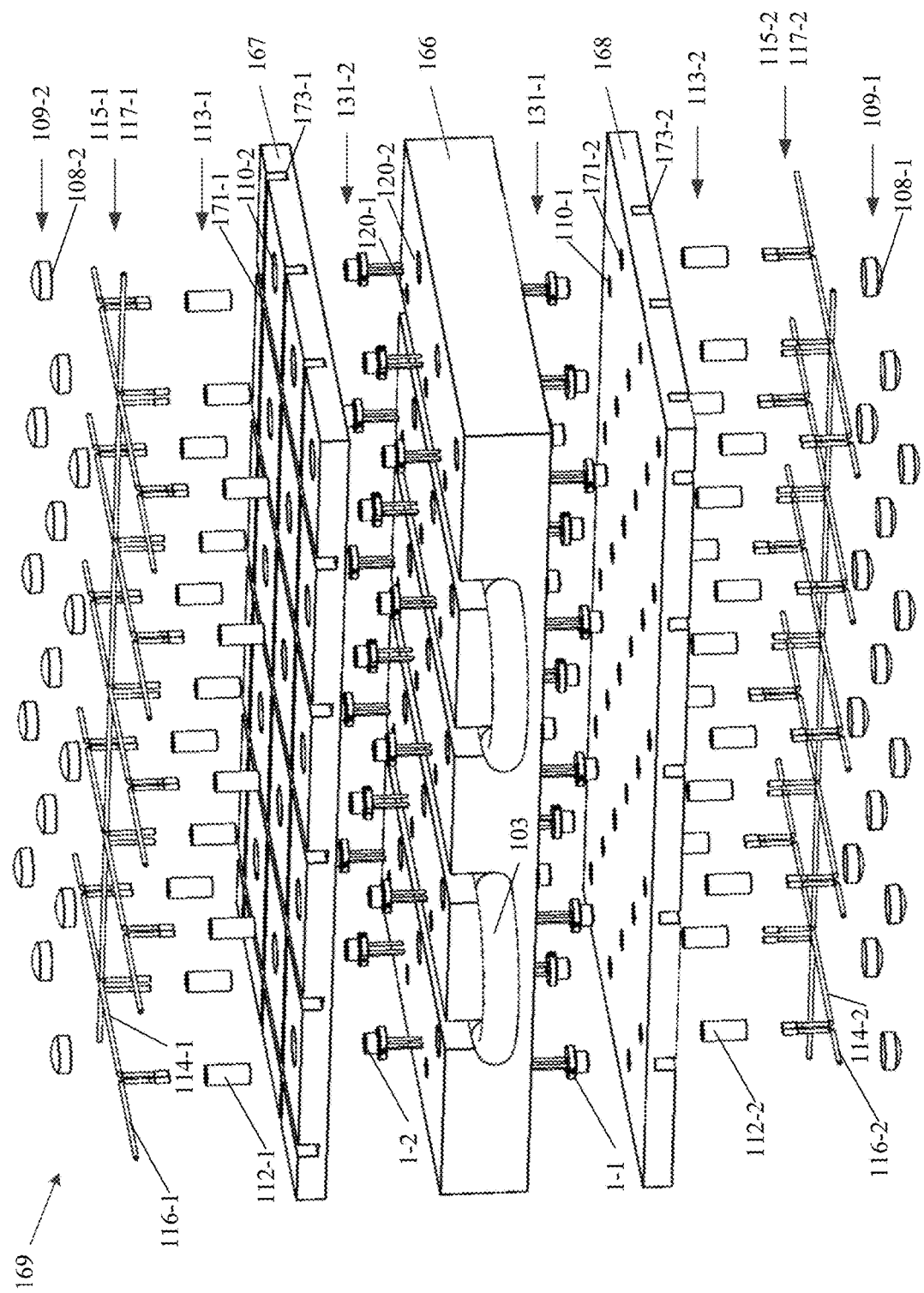
FIG. 2V illustrates another exemplary double-sided laser array module in accordance with some embodiments.

FIG. 2V illustrates an exploded view of another double-sided laser array module 169 in accordance with some embodiments. The double-sided laser array module 169 are substantially similar to the double-sided laser array module 162 when assembled, except that the grooves for connecting the conductive leads of the laser diodes 1 are moved to the surfaces of the lens array substrate layer, instead of the top and bottom surfaces of the heat sink module. Correspondingly, through-holes for accommodating the lower portions of the laser diodes 1 in a respective laser diode array 131 are created in each lens array substrate layer, in addition to the through-holes for accommodating a respective array of lenses.

As shown in FIG. 2V, the heat sink module 166 of the double-sided laser array module 169 includes a first array of through-holes (e.g., stepped through-holes 120-1 or straight through-holes) to accommodate a first array 131-1 of laser diodes 1-1 (facing the bottom side of the double-sided laser array module 169 in FIG. 2V), and a second array of through-holes (e.g., stepped through-holes 120-2 or straight through-holes) to accommodate a second array 131-2 of laser diodes 1-2 (facing the top side of the double-sided laser array module 169 in FIG. 2V). The two arrays of through-holes (e.g., stepped through-holes 120-1 and 120-2, or corresponding straight through-holes) are offset from each other by a respective distance (e.g., by half of the grid distance) in each of the row direction and the column direction. As shown in FIG. 2V, the channels for the liquid cooling tube 103 are created in the top surface of the heat sink module 166.

As shown in FIG. 2V, the lens array substrate layer 167 is used to accommodate a first array 109-2 of lenses 108-2 (which corresponds to the second array of lenses 108-2 in FIG. 2T) residing on the top side of the double-sided laser array module 169. On the reverse side of the double-sided laser array module 169, the lens array substrate layer 168 is used to accommodate a second array 109-1 of lenses 108-1 (which corresponds to the first array of lenses 108-1 in FIG. 2T) residing on the bottom side of the double-sided laser array module 169. In addition, through-holes 171-1 are created in the lens array substrate layer 167 at locations corresponding to the laser diodes 1-1 in the first laser diode array 131-1, to accommodate the lower portions (e.g., conductive leads) of the laser diodes 1-1 in the first laser diode array 131-1. Grooves 173-1 are created in the top surface of the lens array substrate layer 167, where each groove 173-1 links a respective row or column of through-holes 171-1. Similarly, through-holes 171-2 are created in the lens array substrate layer 168 at locations corresponding to the laser diodes 1-2 in the first laser diode array 131-2, to accommodate the lower portions (e.g., conductive leads) of the laser diodes 1-2 in the first laser diode array 131-2. Grooves 173-2 are created in the bottom surface of the lens array substrate layer 168, where each groove 173-2 links a respective row or column of through-holes 171-2.

As shown in FIG. 2V, when assembling the double-sided laser array module 169, an array 113-1 of insulator tubes 112-1 are inserted from the top side of the lens array substrate layer 167 into the through holes 171-1, and optionally further into the stepped through-holes 120-1 in the heat sink module 166; the laser diodes 1-1 in the first laser diode array 131-1 are inserted into the stepped through holes 120-1 from the bottom side of the heat sink module 166, and the conductive leads of the laser diodes 1-1 pass into the through-holes 171-1 in the lens array substrate layer 167, and are insulated from the walls of the through-holes 171-1 and 120-1 by the insulator tubes 112-1. Conductive lead connectors 114-1 are used to connect the conductive leads of the laser diodes 1-1 between adjacent through-holes 171-1, and conductive lead connectors 116-1 are used to connect the conductive leads of the laser diodes 1-1 on the edges of the laser diode array 113-1 to the driving circuit layers (not shown) residing on the vertical sides of the double-sided laser array module 169. The horizontal portions of the conductive lead connectors 114-1 and 116-1 in the arrays 115-1 and 117-1 reside within the grooves 173-1 in the top surface of the lens array substrate layer 167.

As shown in FIG. 2V, on the reverse side, when assembling the double-sided laser array module 169, an array 113-2 of insulator tubes 112-2 are inserted from the bottom side of the lens array substrate layer 168 into the through holes 171-2, and optionally further into the stepped through-holes 120-2 in the heat sink module 166; the laser diodes 1-2 in the second laser diode array 131-2 are inserted into the stepped through holes 120-2 from the top side of the heat sink module 166, and the conductive leads of the laser diodes 1-2 pass into the through-holes 171-2 in the lens array substrate layer 168, and are insulated from the walls of the through-holes 171-2 and 120-2 by the insulator tubes 112-2. Conductive lead connectors 114-2 are used to connect the conductive leads of the laser diodes 1-2 between adjacent through-holes 171-2, and conductive lead connectors 116-2 are used to connect the conductive leads of the laser diodes 1-2 on the edges of the laser diode array 113-2 to the driving circuit layers (not shown) residing on the vertical sides of the double-sided laser array module 169. The horizontal portions of the conductive lead connectors 114-2 and 116-2 in the arrays 115-2 and 117-2 reside within the grooves 173-2 in the bottom surface of the lens array substrate layer 168.

The lenses 108-1 in the lens array 109-1 for the first laser diode array 131-1 are inserted into the through-holes 110-1 from the bottom side of the lens array substrate layer 168, while the lenses 108-2 in the lens array 109-2 for the second laser diode array 131-2 are inserted into the through-holes 110-2 from the top side of the lens array substrate layer 167.

Figure 2W:
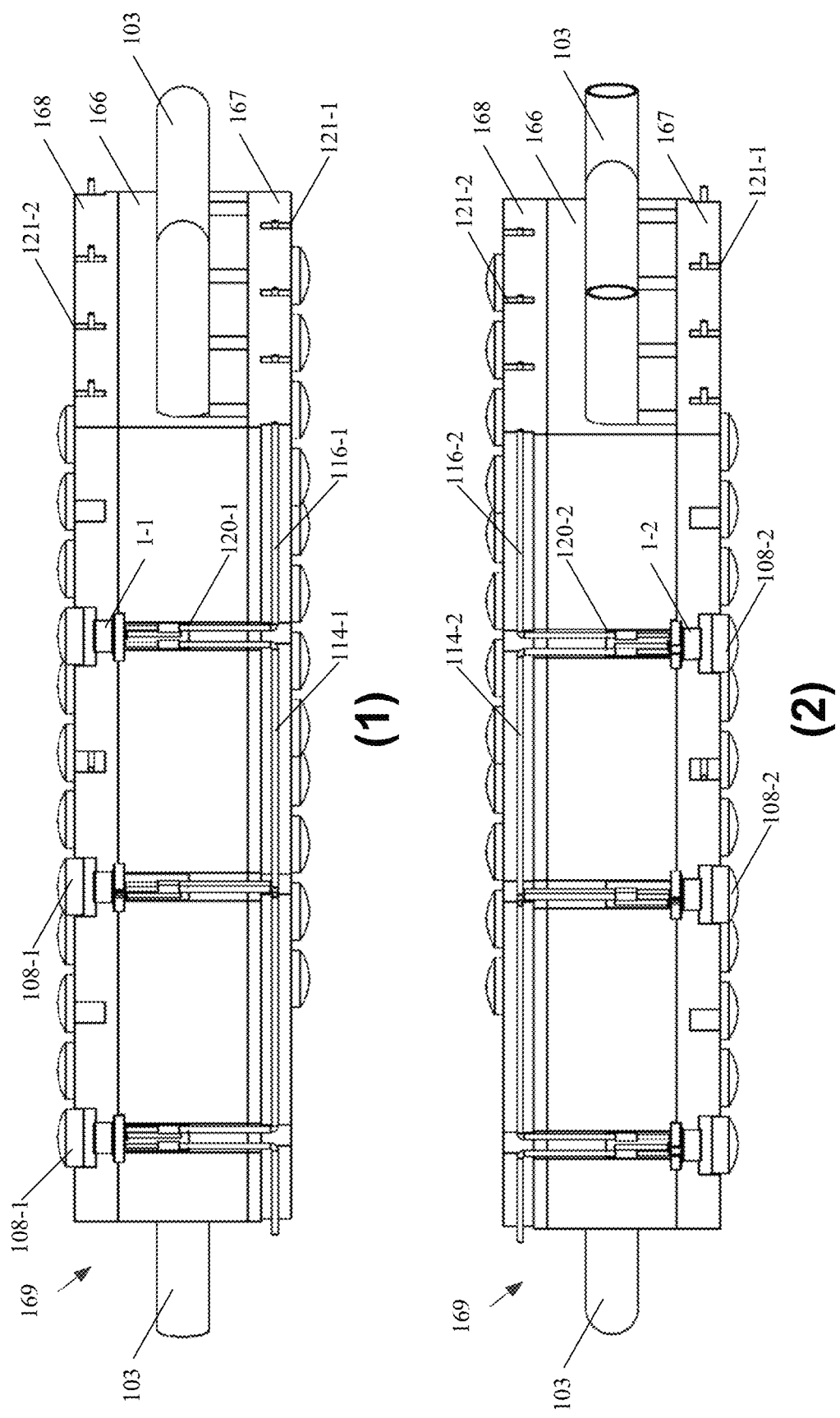
FIG. 2W illustrates the cross-sectional views of the exemplary double-sided laser array module shown in FIG. 2V.

FIG. 2W illustrate the cross-sectional view of the double-sided laser array module 169. FIG. 2W-(1) illustrates a cross-section through a row or column of laser diodes 108-1 in the first laser diode array 131-1. FIG. 2W-(2) illustrates a cross-section through a row or column of laser diodes 108-2 in the second laser diode array 131-2. As shown in FIG. 2W, the structure of the double-sided laser array module 169 is similar to the structure of the double-sided laser array module 162 shown in FIG. 2U, except that the grooves for accommodating the horizontal portions of the conductive lead connectors 114 and 116 are moved further away from the upper portions of the laser diodes 1 (e.g., for the laser diode array facing the top side of the double-sided laser array module, the grooves are moved from the bottom surface of the heat sink module to the bottom surface of the lens array substrate layer at the bottom side of the double-sided laser array module). In addition, the through-holes for accommodating the conductive leads of the laser diodes are extended from the heat sink module to the lens array substrate layer (e.g., for the laser diode array facing the top side of the double-sided laser array module, the through-holes for accommodating the laser diodes extend from the top surface of the heat sink module through the lens array substrate layer at the bottom side of the double-sided laser array module).

In the double-sided laser array module 169 shown in FIGS. 2V and 2W, the heat sink module 166 may be integrated with the lens array substrate layers 167 and 168, and the integrated heat sink module serves to support the lenses on both sides of the double-sided laser array module, and to serve as the heat sink module and liquid cooling module of the double-sided laser array module. Although the driving circuit layers are not shown in FIGS. 2T-2W, a person skilled in the art can appreciate that the driving circuit layers can be attached to one or more of the vertical sides of the double-sided laser array module, and may extend beyond the layers/modules that accommodate the horizontal portions of the conductive lead connectors 114 and 116.

Similar double-sided laser array modules as those shown in FIGS. 2S-2W can be built based on the configurations shown with respect to laser array modules 101', 101", 101-a to 101-g and subcomponents thereof (e.g., heat sink modules 111, 111', 136, 136', 137, 137', 139, 139', 147, 147', and 149, and lens array substrate layers 110, 110', and 110", etc.), as shown in FIGS. 2AH-2AX.

Figure 2X:
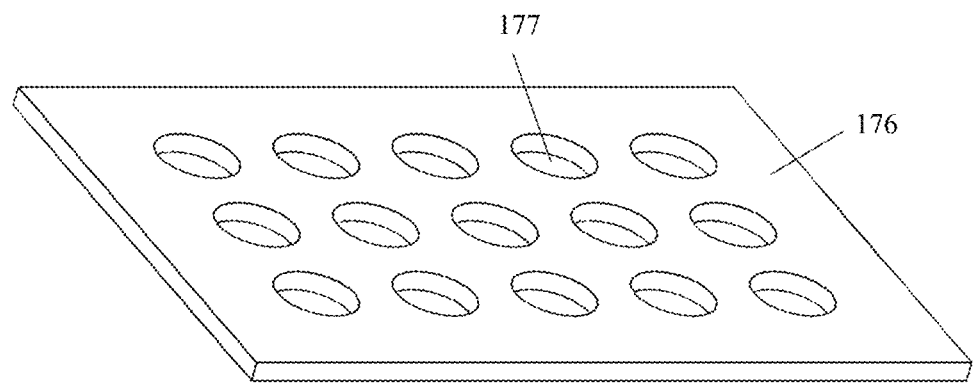
FIG. 2X illustrates the structure an exemplary lens array module with lenses supported by two adjacent substrate layers, in accordance with some embodiments.
Figure 2X:
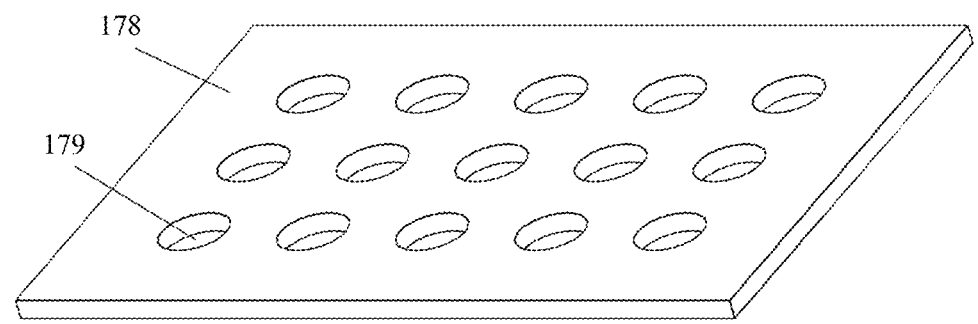
Figure 2X:
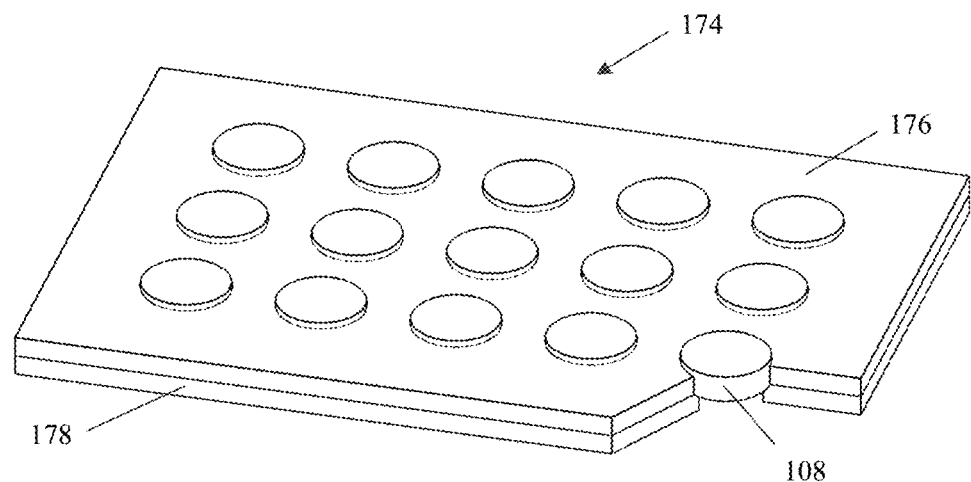

As disclosed herein, a lens array module includes an array of lenses and a lens array substrate layer that accommodate the lenses (and optionally, accommodate other structural features and components (e.g., grooves, conductive lead connectors, conductive leads of laser diodes, housing of laser diodes, etc.) of the laser array module). FIG. 2X illustrates the formation of a lens array module in accordance with some embodiments. In FIG. 2X, the lens array module 174 is formed with two separate substrate layers 176 and 178. As shown in FIG. 2X-(1), the substrate layers 176 and 178 each include a respective array of straight through-holes. The diameters of through-holes 177 in the substrate layer 176 are slightly larger than the diameters of the lenses 108, such that the lenses 108 can snuggly fit within the through-holes 177. The through-holes 179 in the substrate layer 178 have slightly smaller diameters than the through-holes 177 in the substrate layer 176. The locations of the through-holes 177 and 178 in the two substrate layers correspond to the locations of the laser diodes 1 in the laser array module.

FIG. 2X-(2) shows that when the two substrate layers 176 and 178 are placed adjacent to each other, an array of stepped through-holes is formed. The lenses 108 are placed within the stepped through-holes, and supported by the edges of the straight through-holes 179 in the lower substrate layer 178. In some embodiments, the thickness of the lower substrate layer 178 is selected based on the size of gap needed between the lenses and the laser diodes.

In FIG. 2AY, the lens array module 174' is formed with single substrate layer 178 with an array of straight through-holes 179. The diameters of through-holes 179 in the substrate layer 174' are slightly smaller than the diameters of the lenses 108, such that the lenses 108 can sit above the through-holes 179 without falling through. The locations of the through-holes 179 correspond to the locations of the laser diodes 1 in the laser array module.

Figure 2Y:
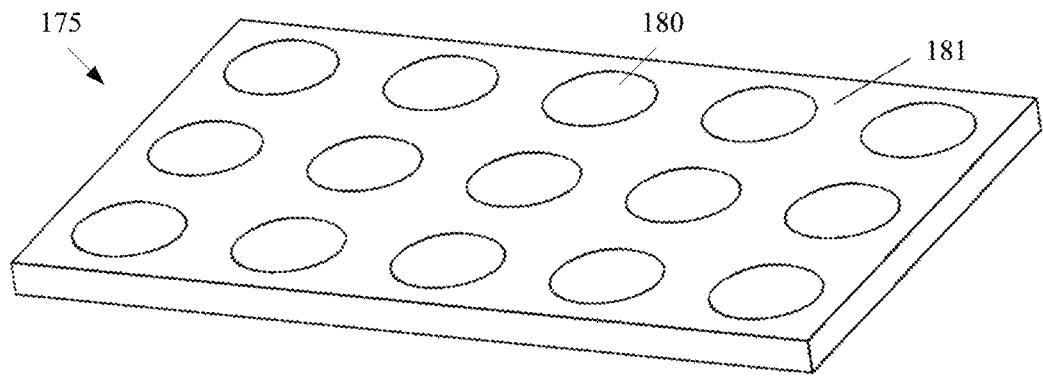
FIG. 2Y illustrates the structure of an exemplary lens array module with integrated lens domes on a substrate layer, in accordance with some embodiments.
Figure 2Y:

FIG. 2Y shows an exemplary lens array module 175 with integrated lens domes on a substrate layer. The lens array module 175 optionally accommodates other structural features and components (e.g., grooves, conductive lead connectors, conductive leads of laser diodes, housing of laser diodes, etc.) of the laser array module in some embodiments. As shown in FIG. 2Y-(1), the lens array module 175 includes a substantially planar substrate portion 181, with an array of lens domes 180 protruding from the planar portion. In some embodiments, the integrated lens array module is formed using a mold from a high index optical material, e.g., glass, or other high-index plastics, polymers, etc.

Figure 2Z:
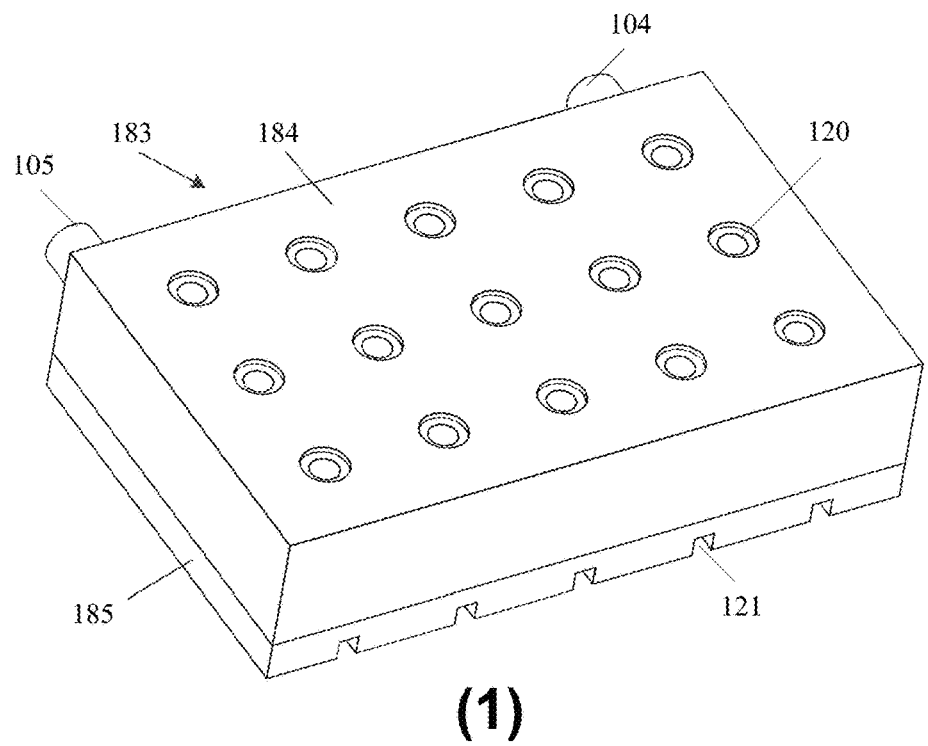
FIG. 2Z illustrates the top and bottom views of another exemplary heat sink module in accordance with some embodiments.
Figure 2Z:
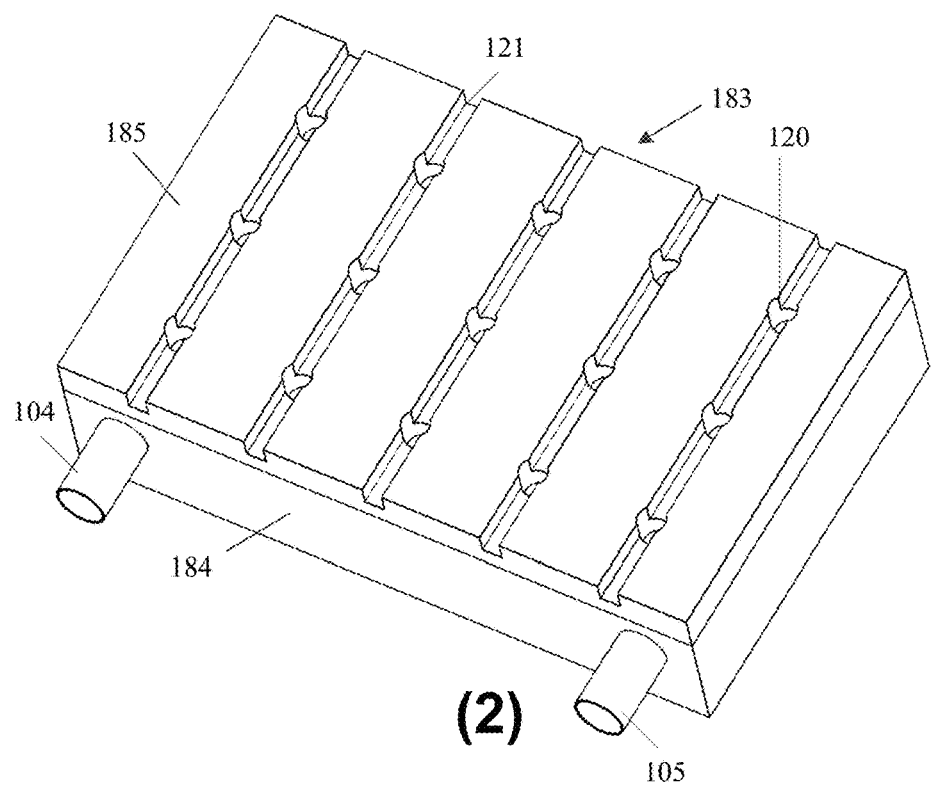
Figure 2A:
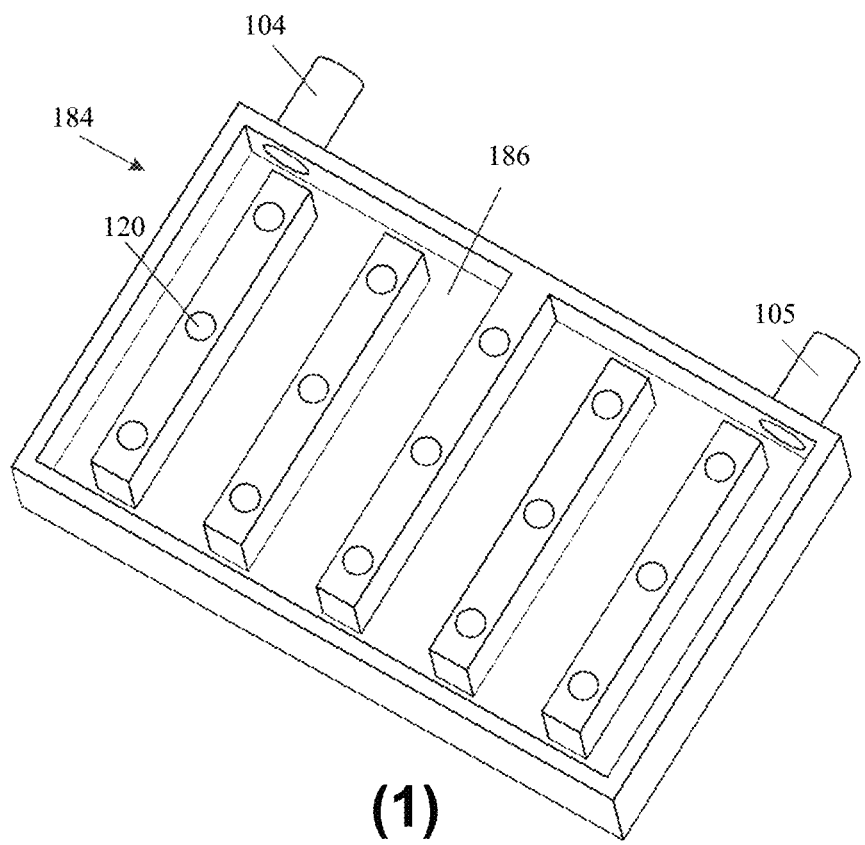
Figure 2A:
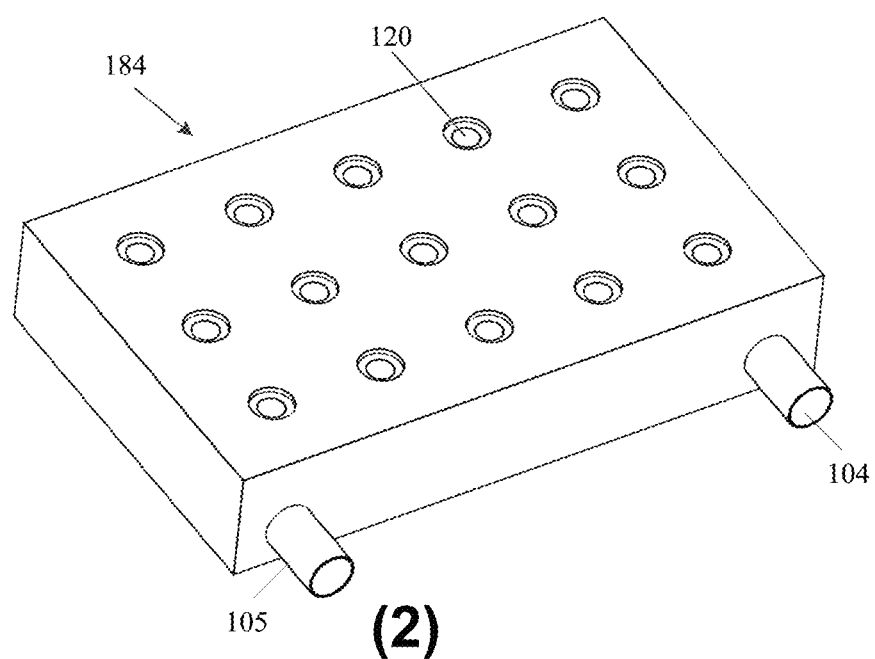
Figure 2A:
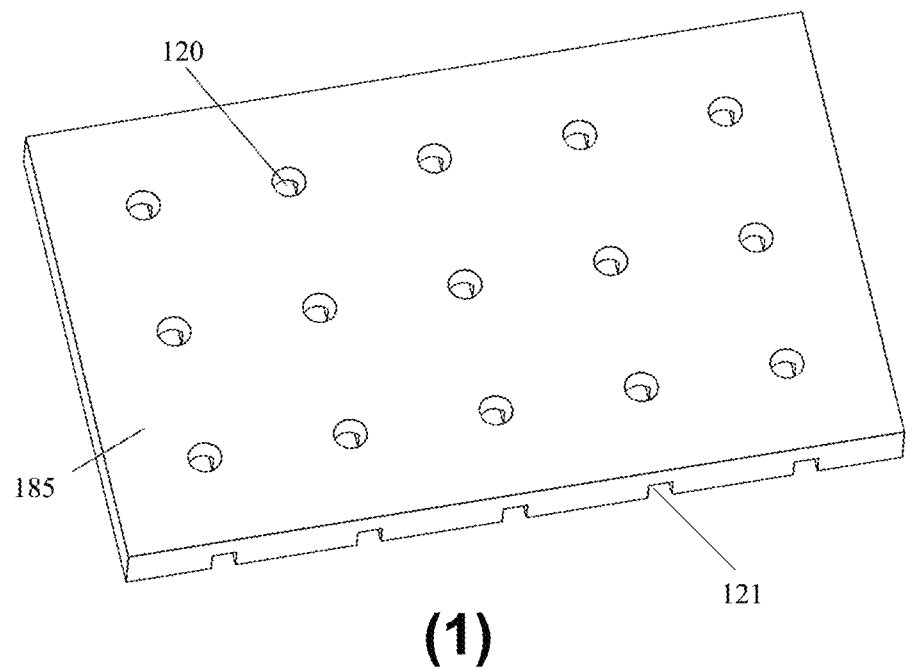
Figure 2A:
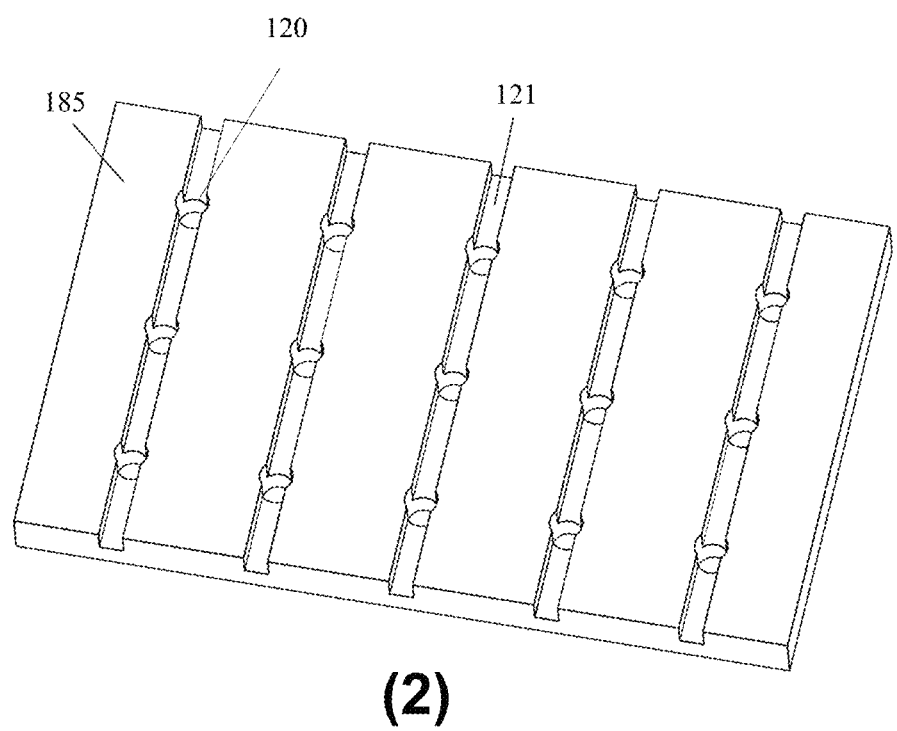
Figure 2A:
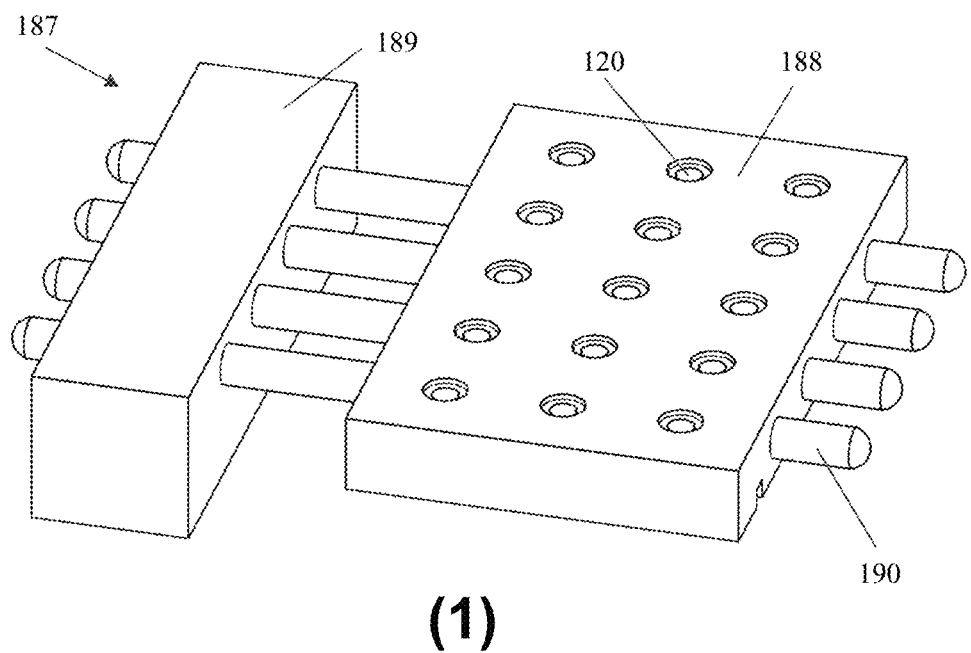
Figure 2A:
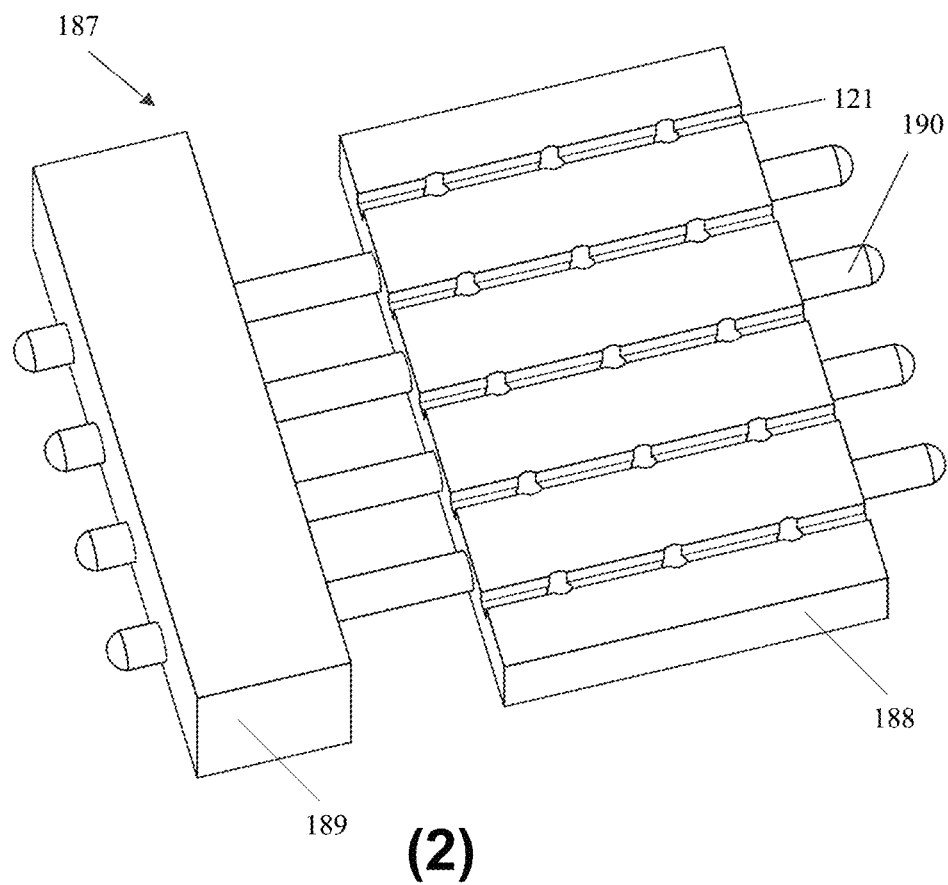
Figure 2A:
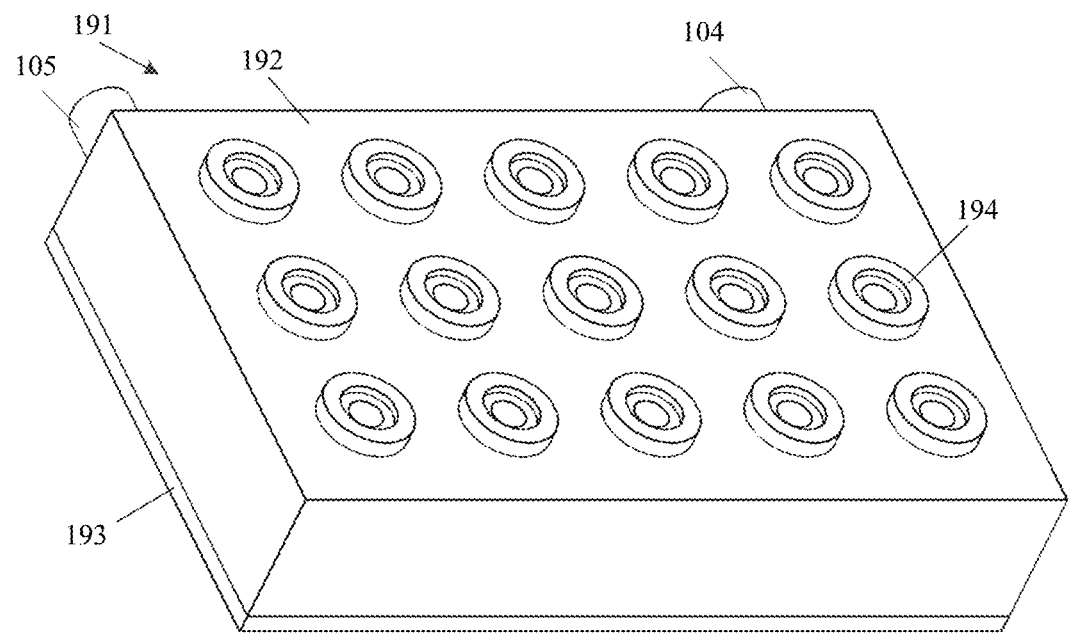
Figure 2A:
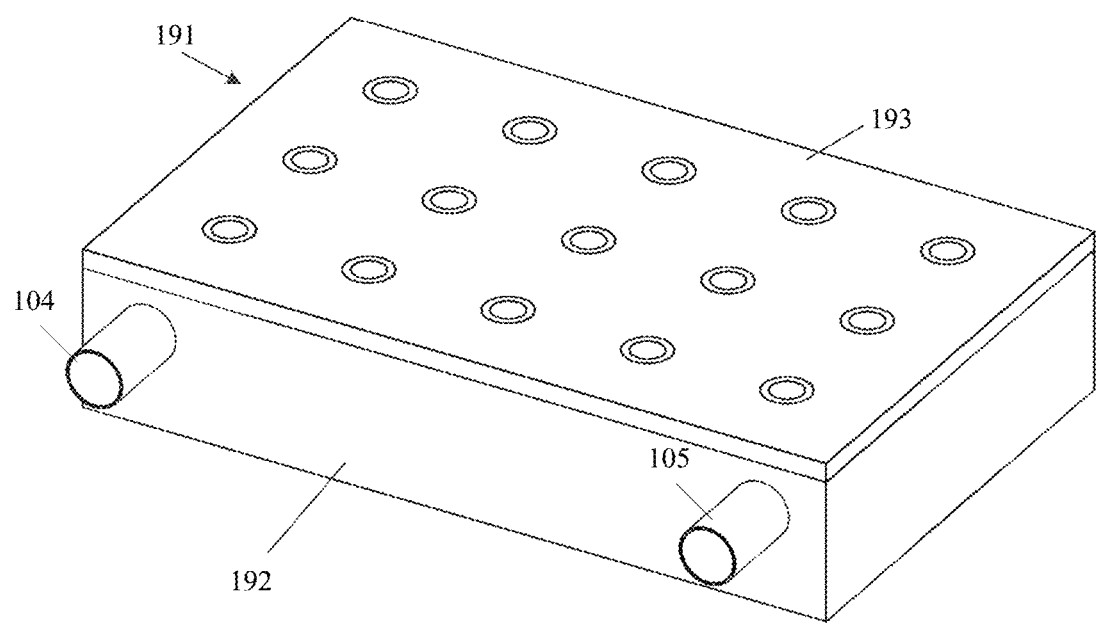
Figure 2A:
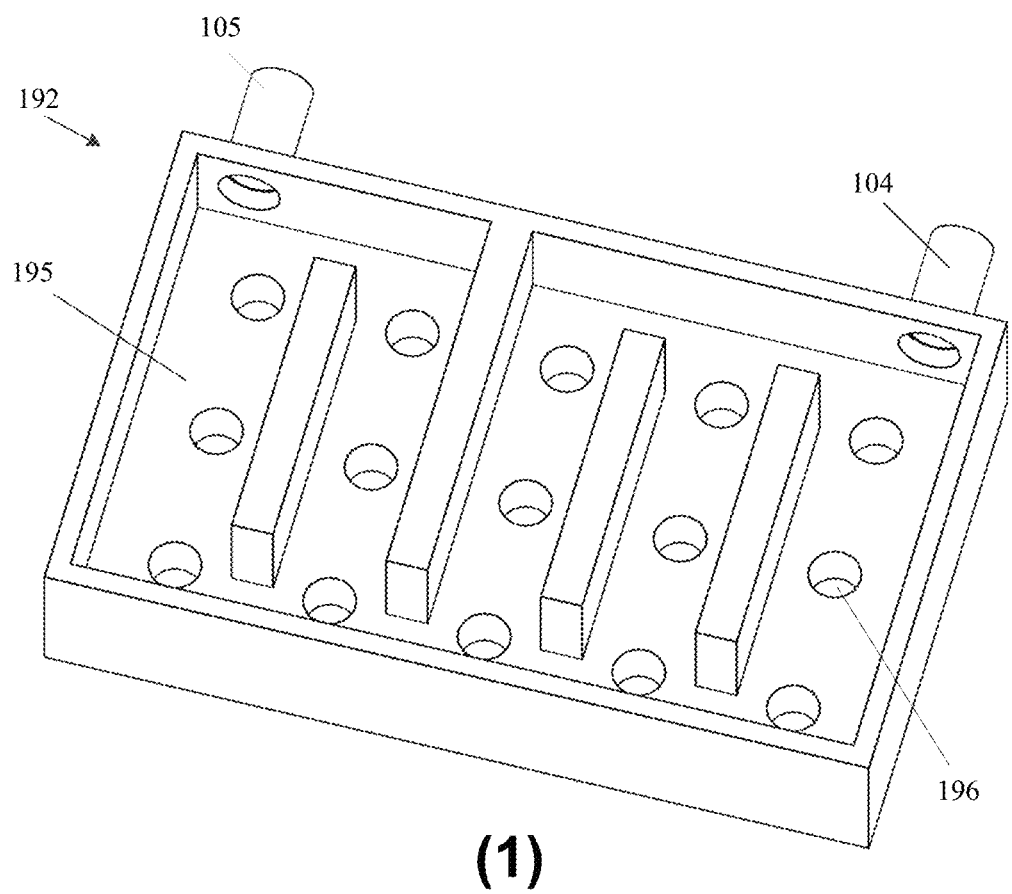
Figure 2A:
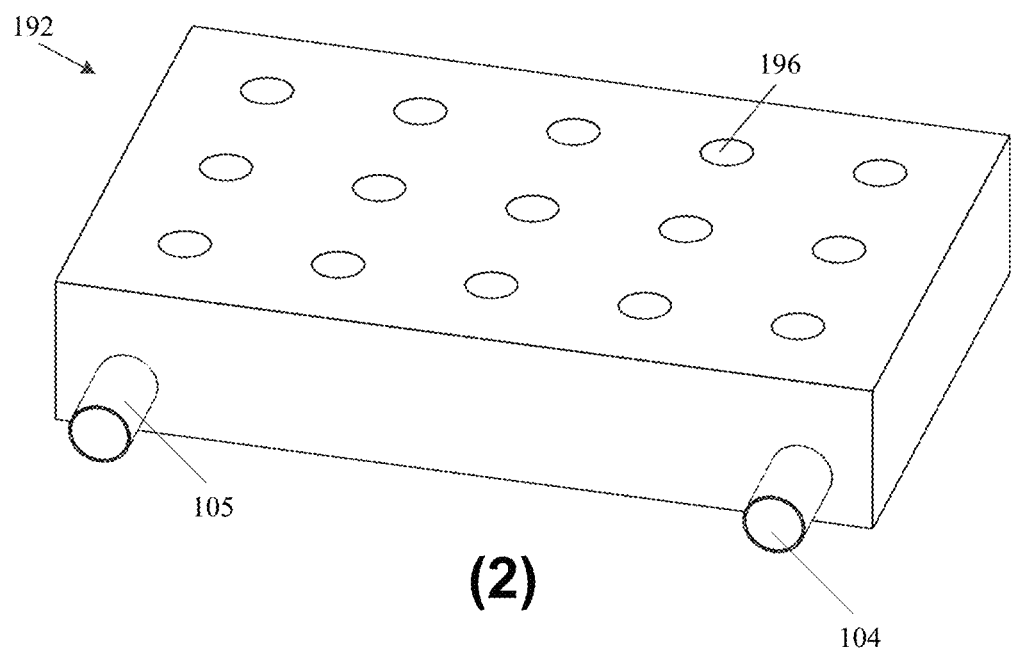
Figure 2A:
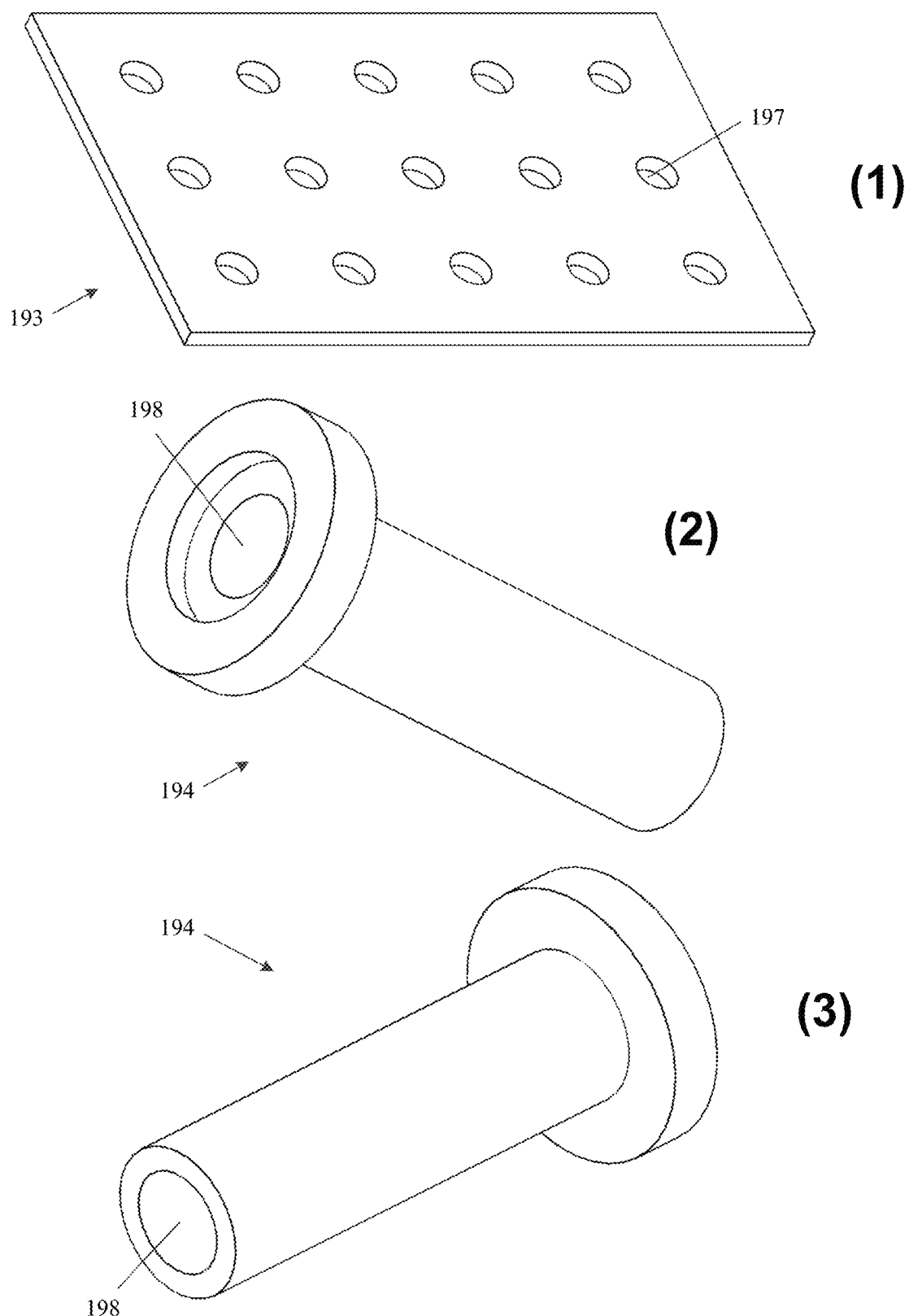
Figure 2A:
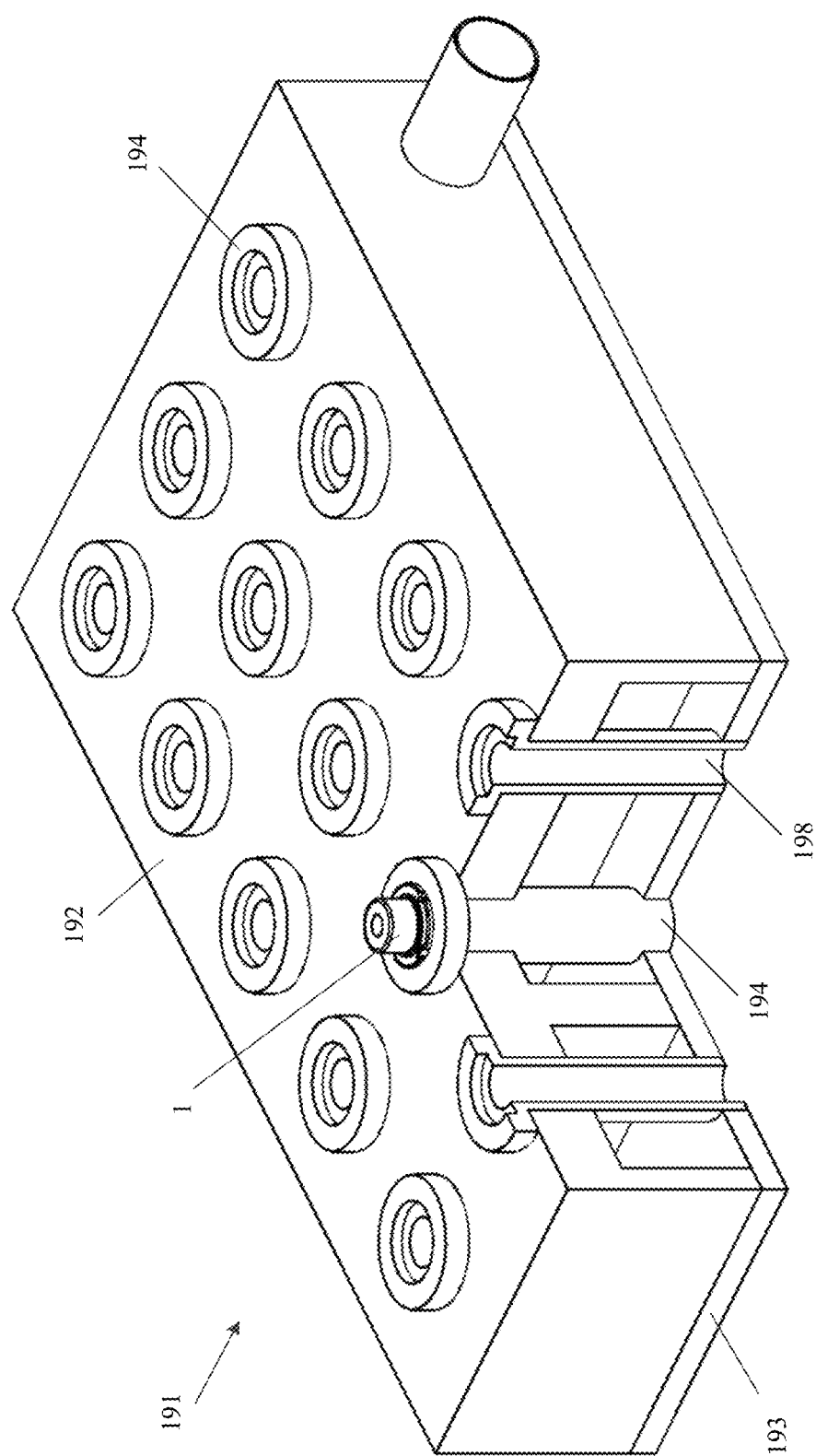
Figure 2A:
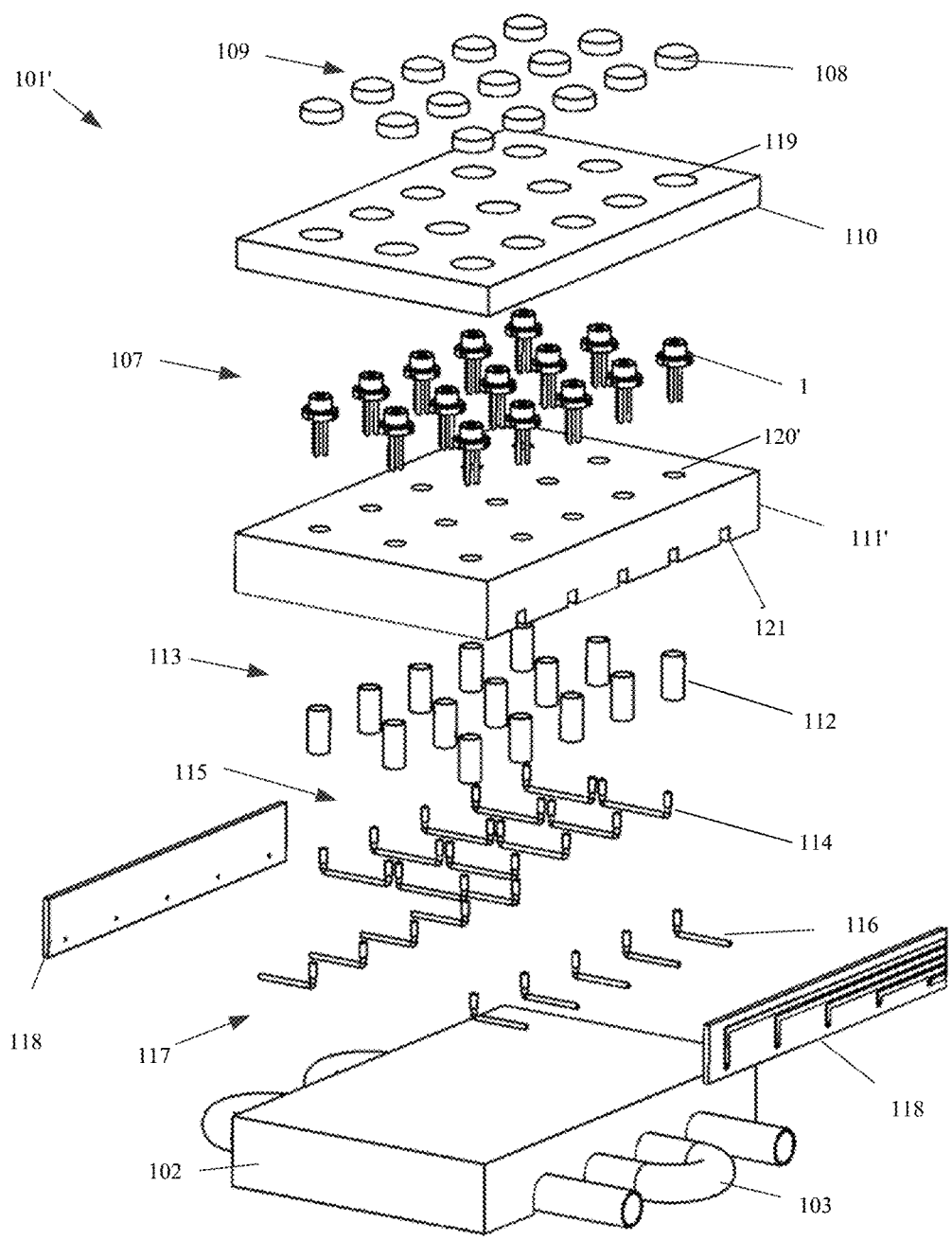
Figure 2A:
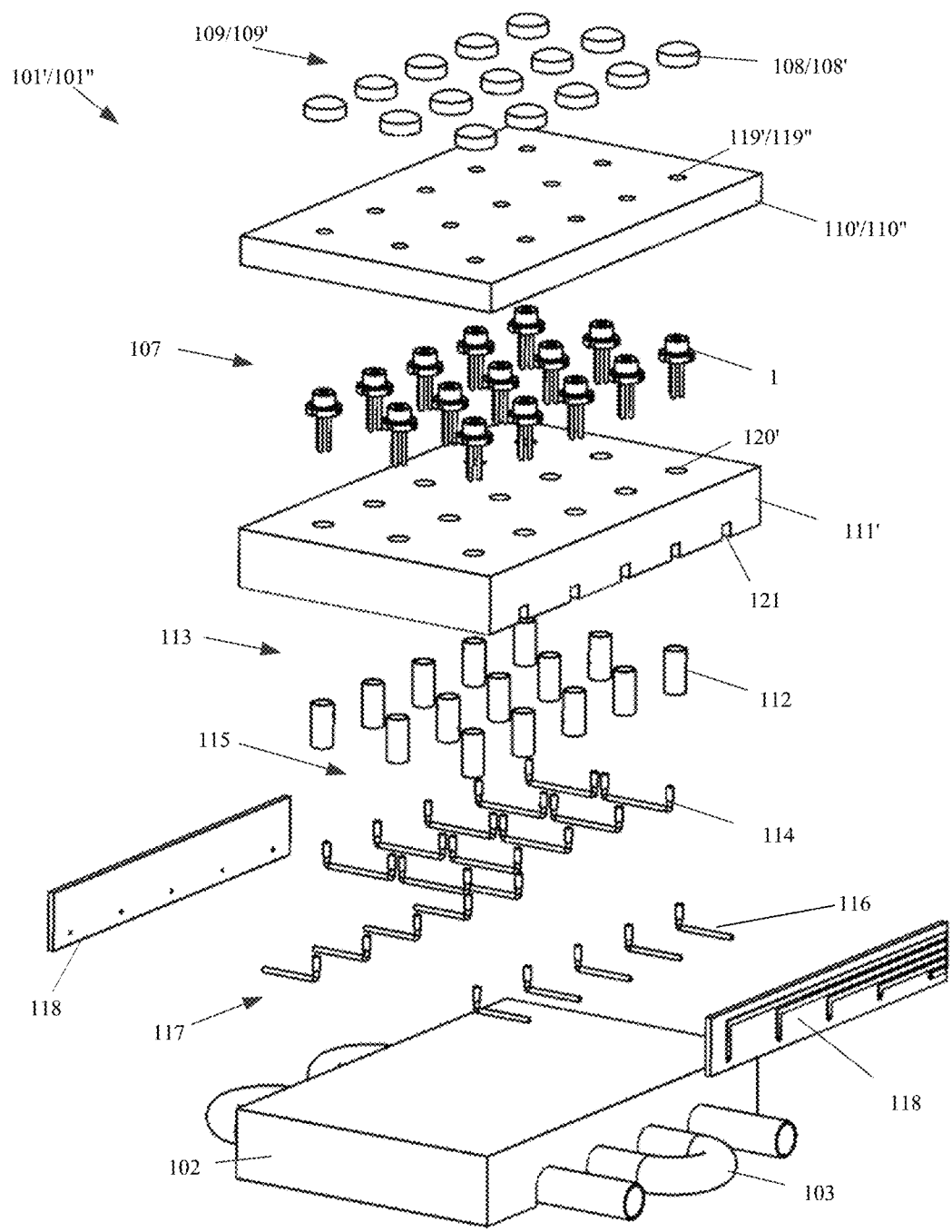
Figure 2A:
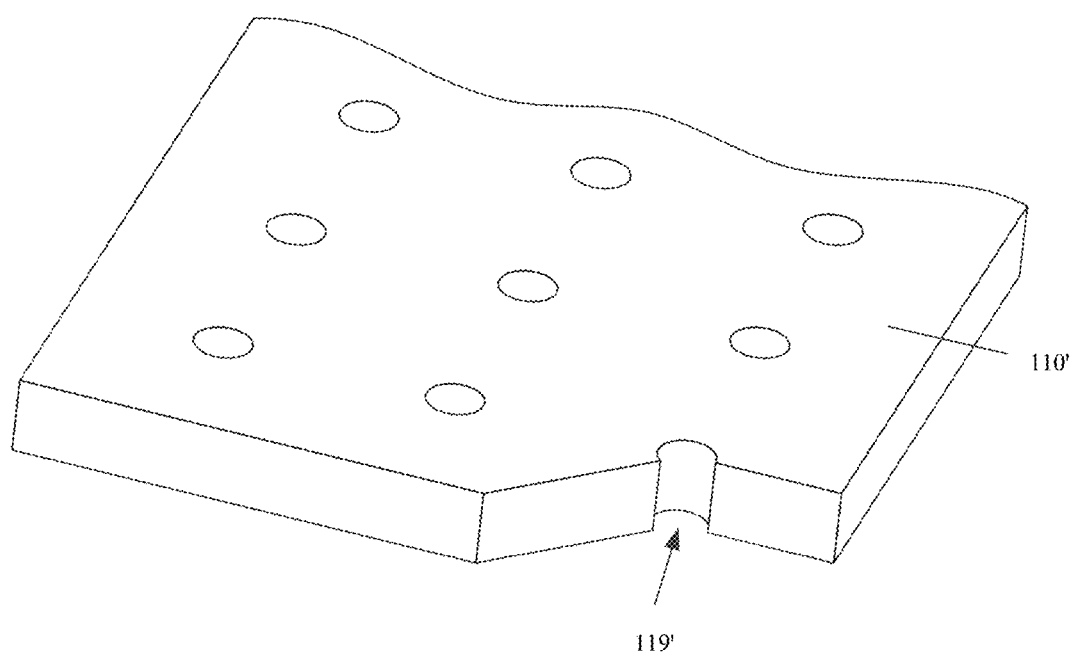
Figure 2A:
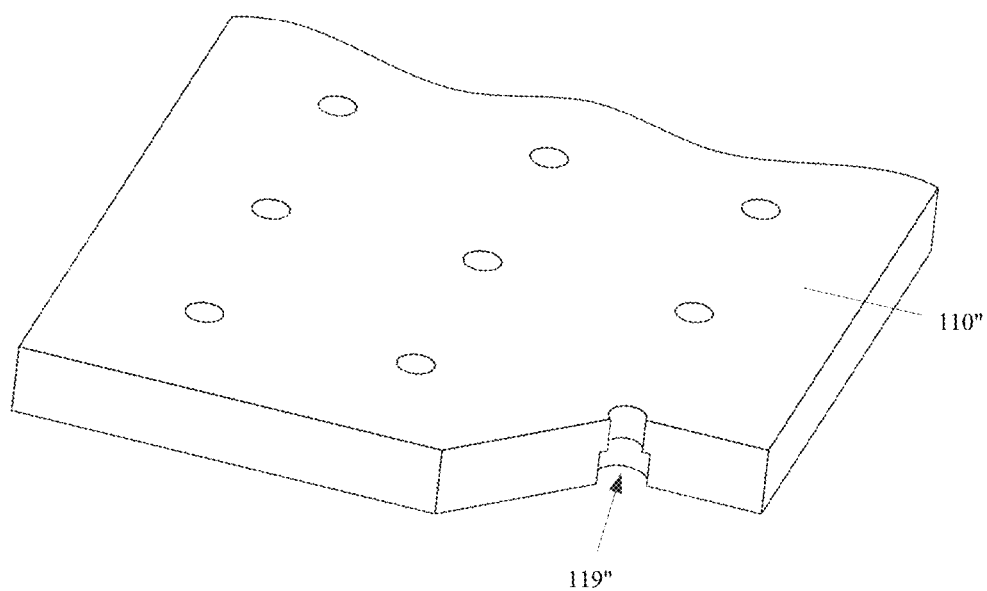
Figure 2A:
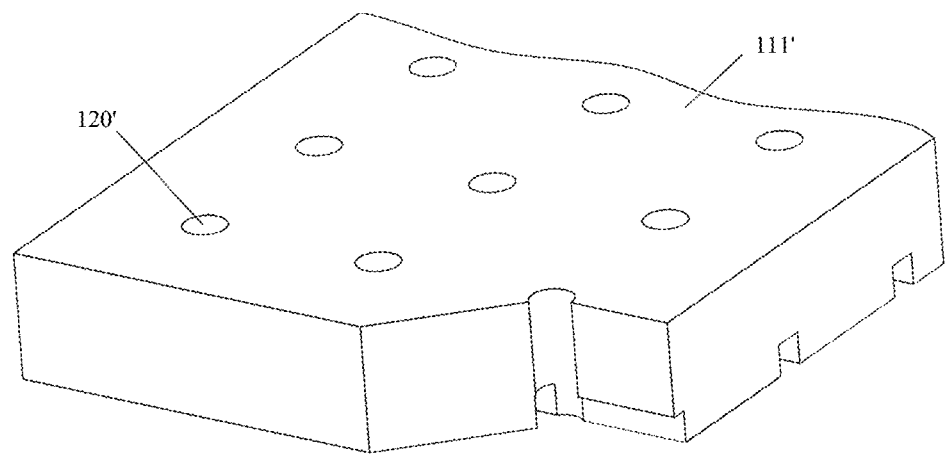
Figure 2A:
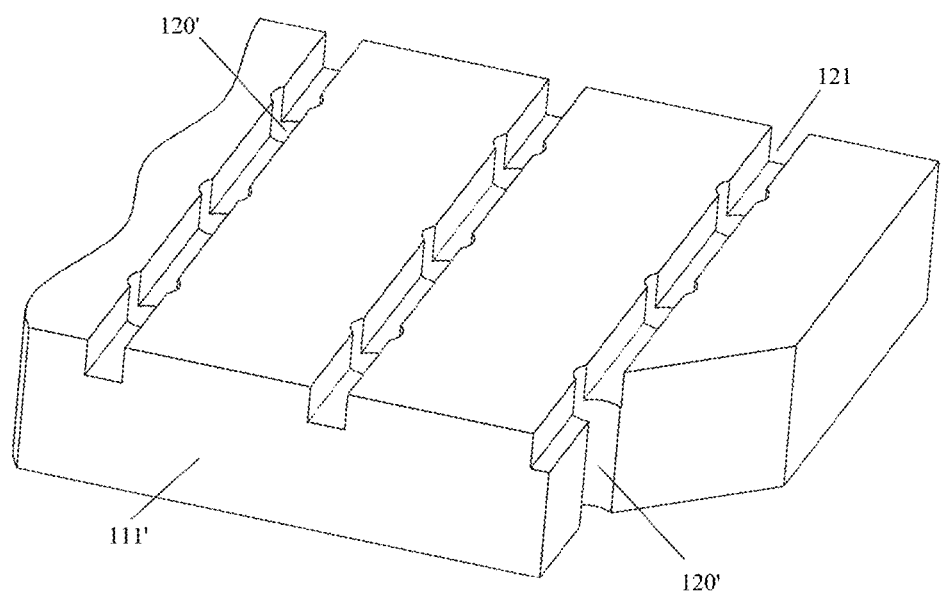
Figure 2A:
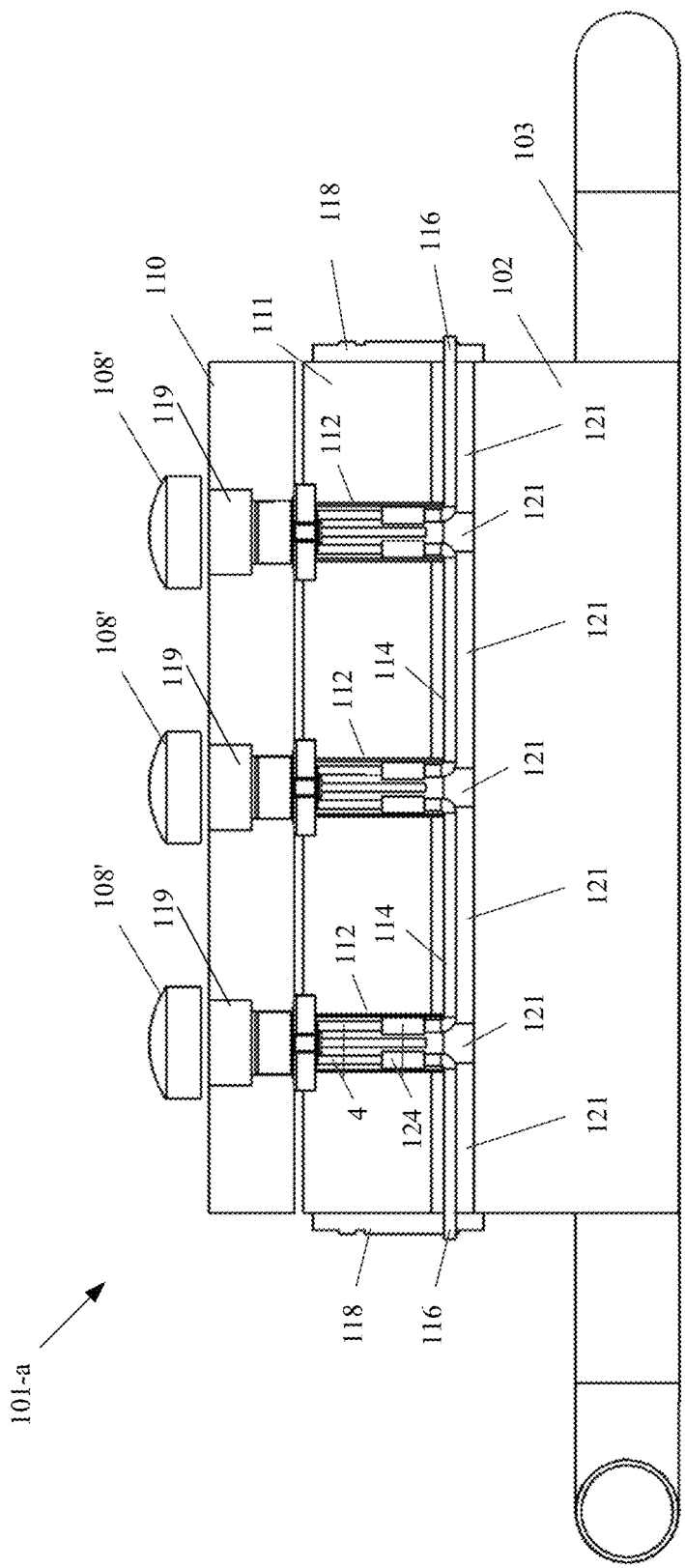
Figure 2A:
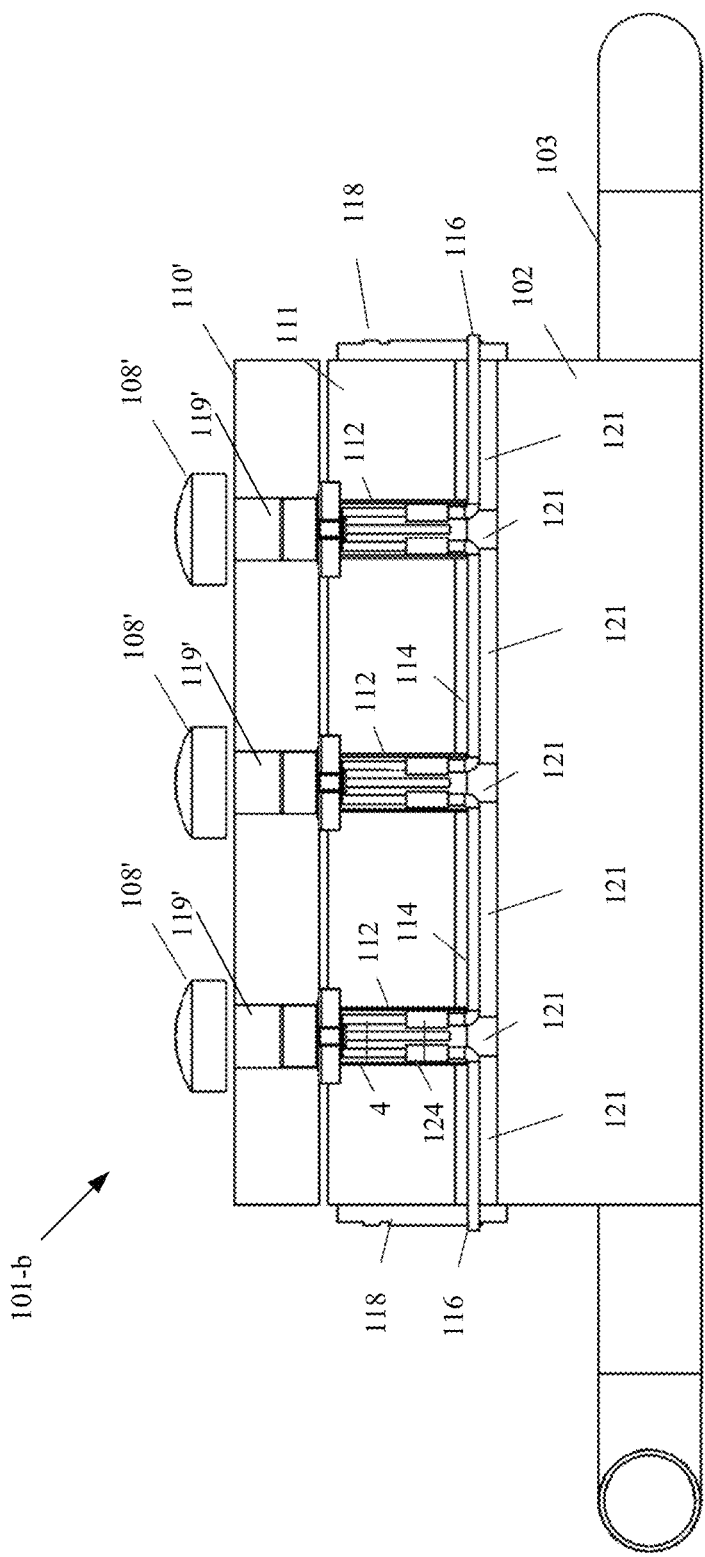
Figure 2A:
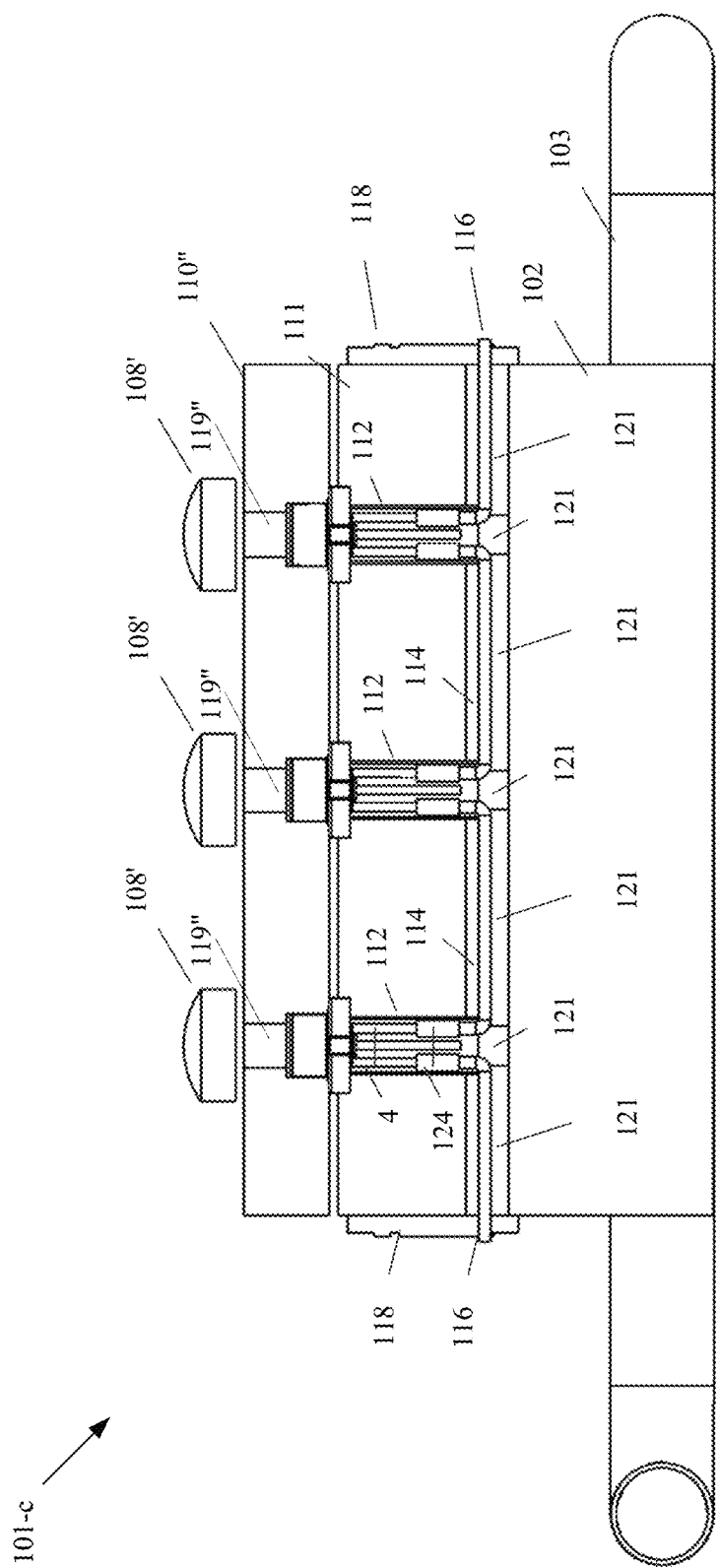
Figure 2A:
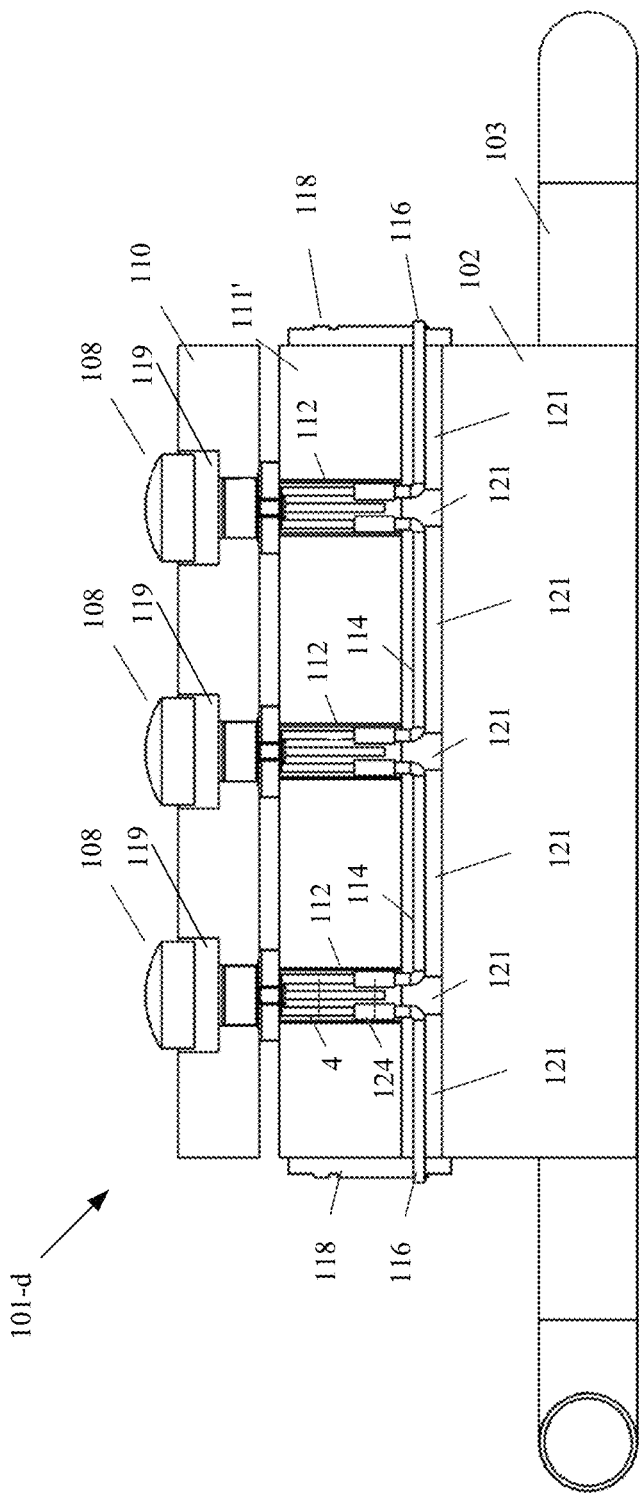
Figure 2A:
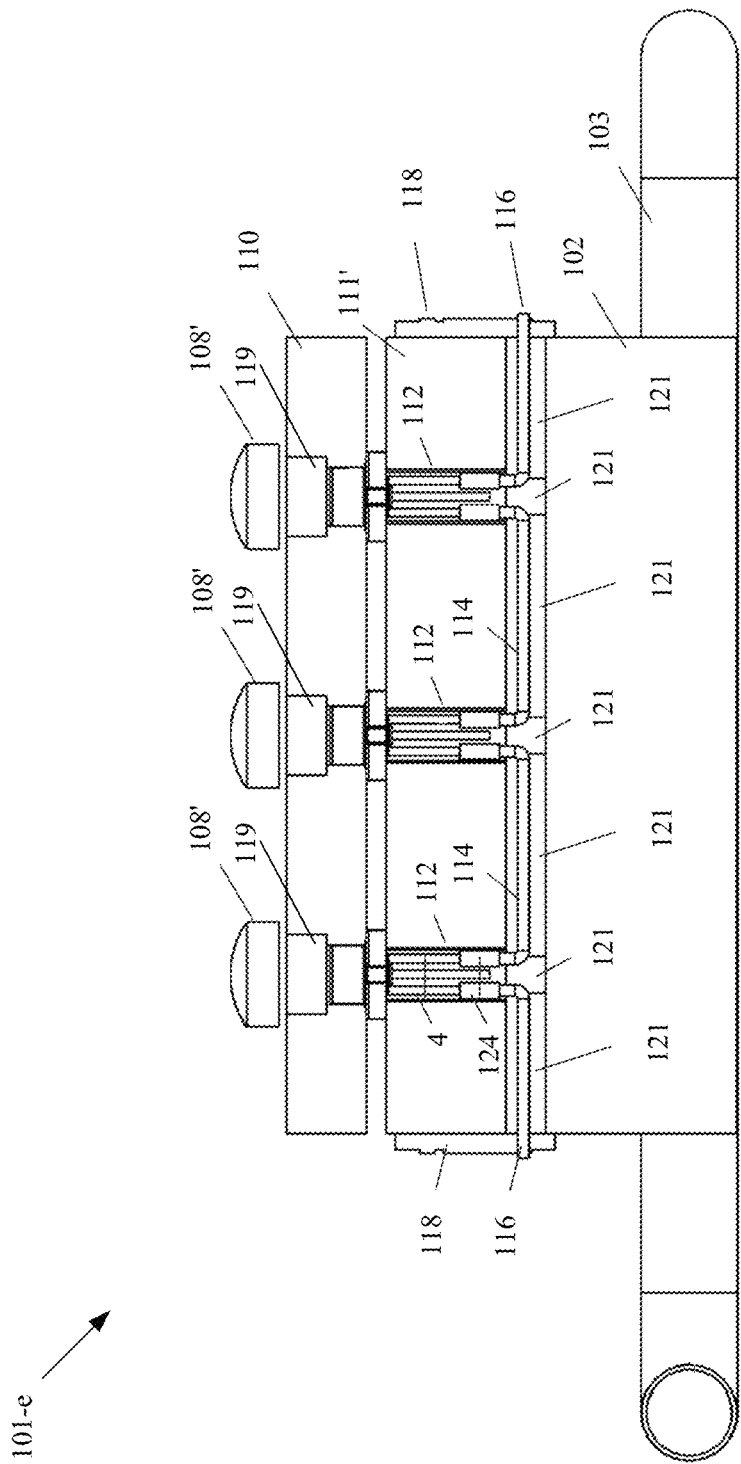
Figure 2A:
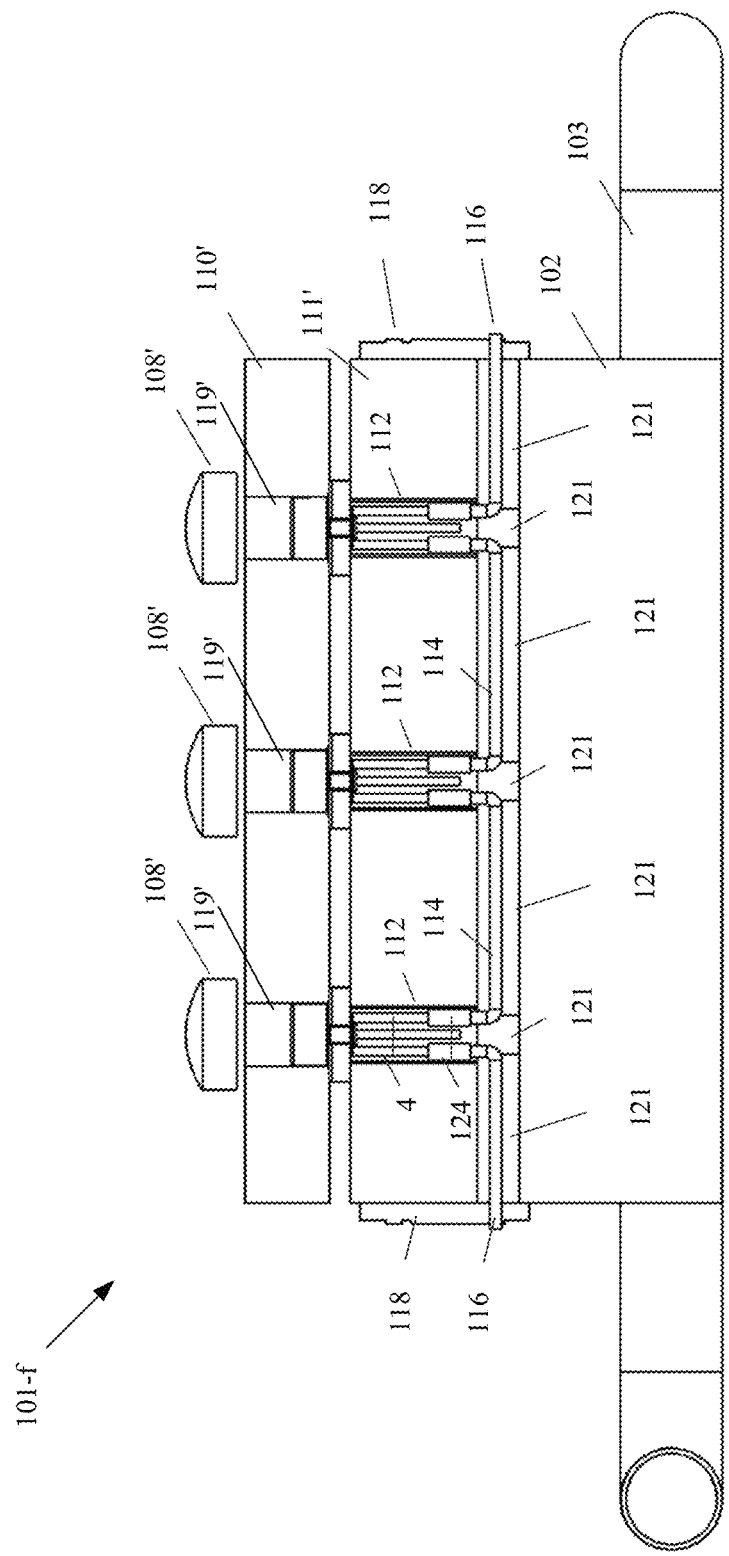
Figure 2A:
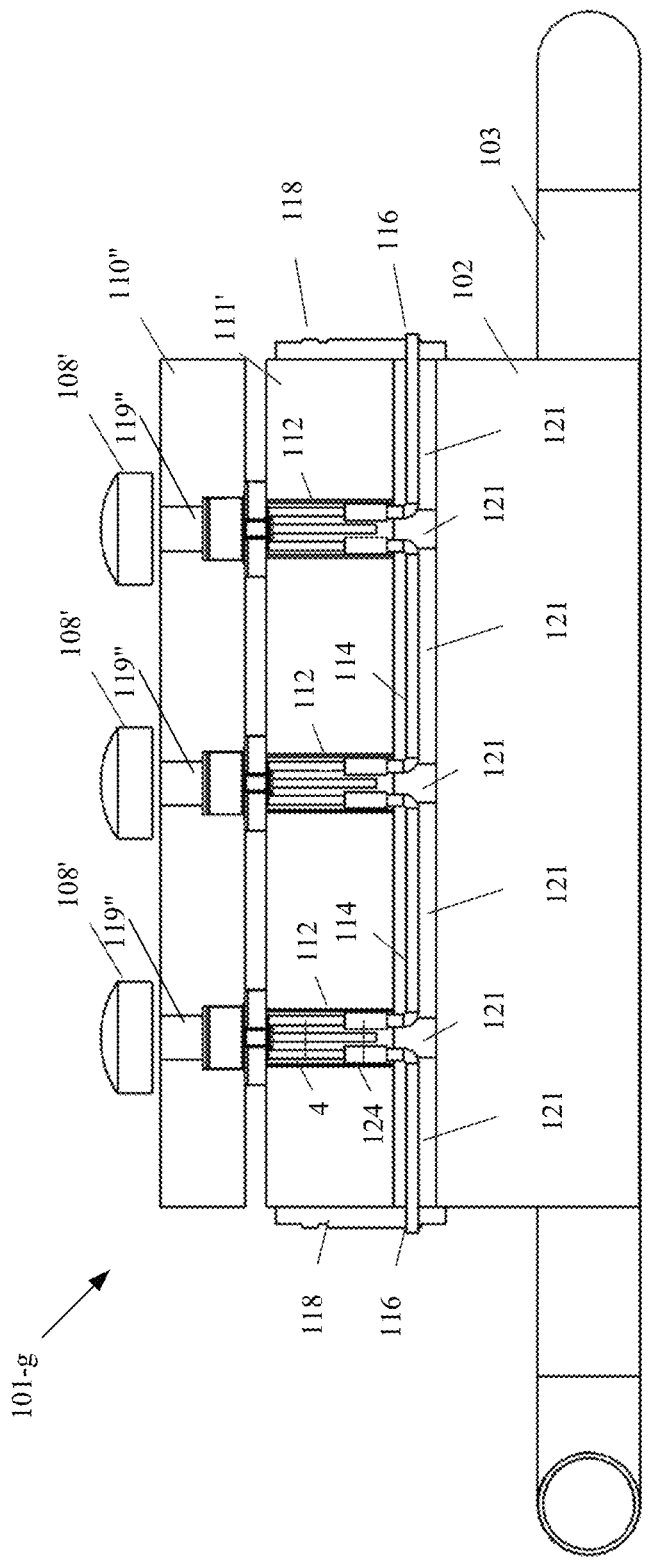
Figure 2A:
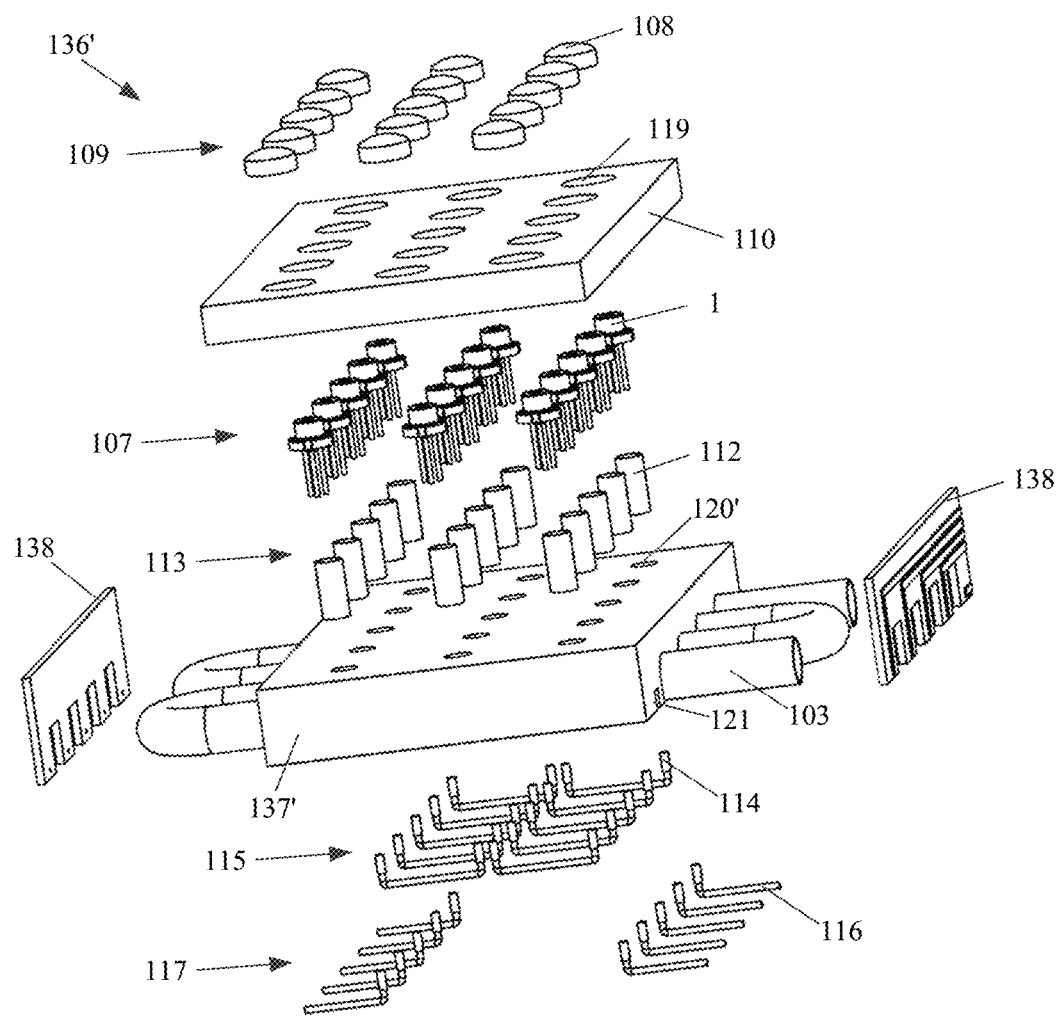
Figure 2A:
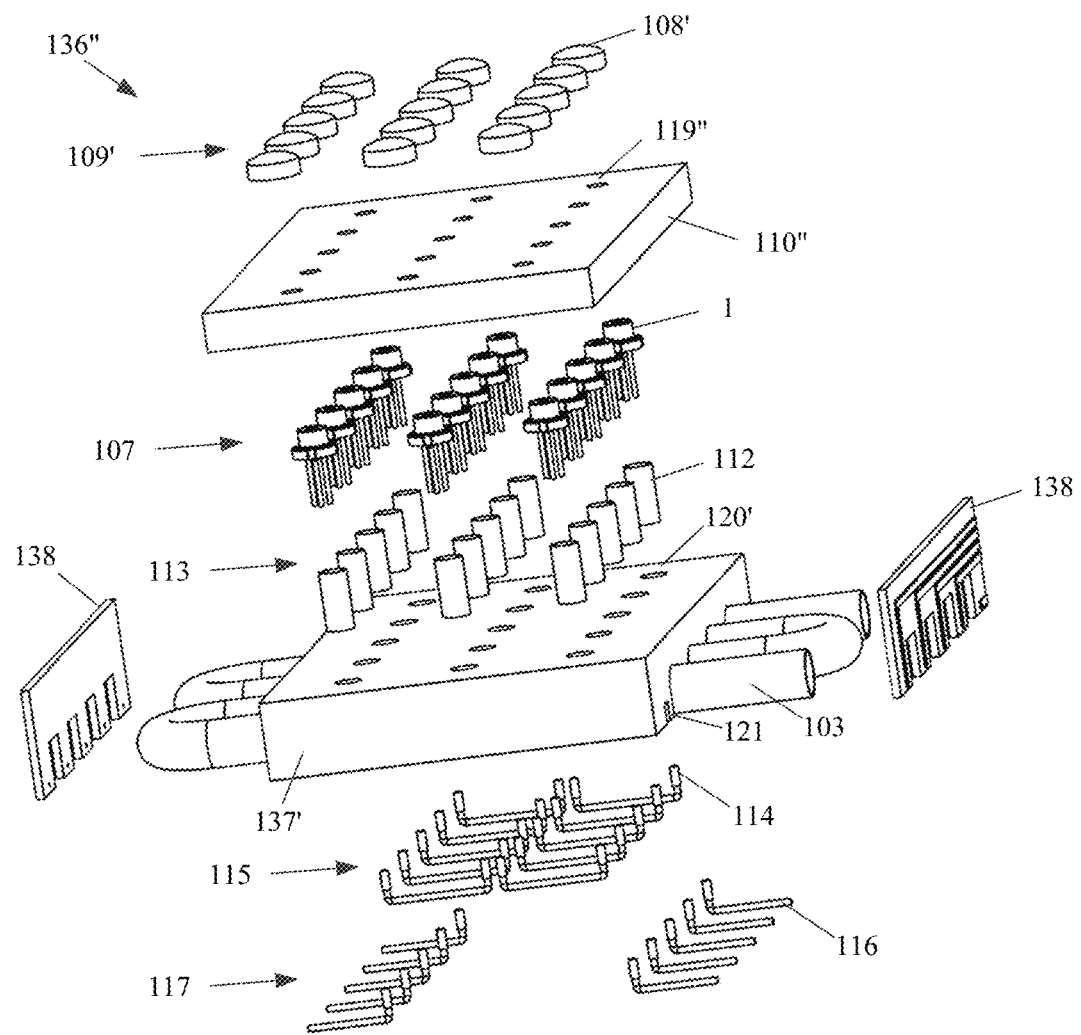
Figure 2A:
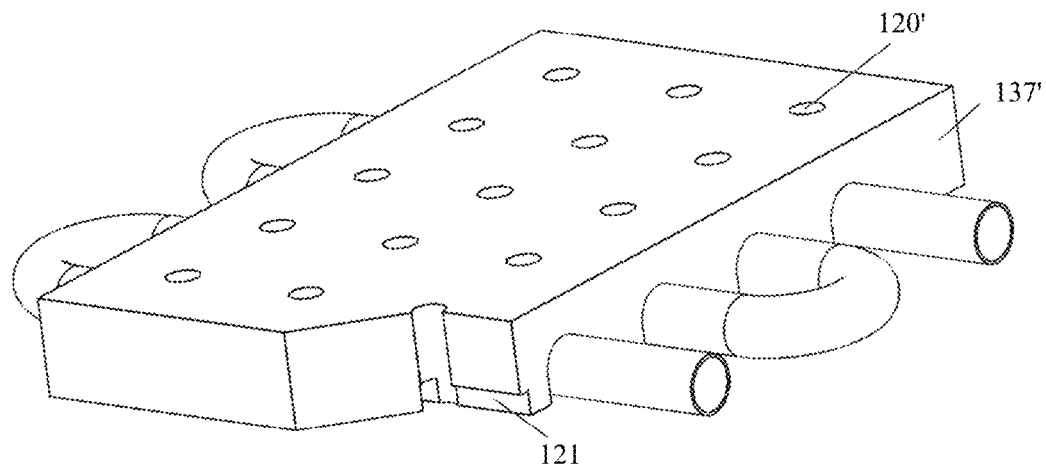
Figure 2A:
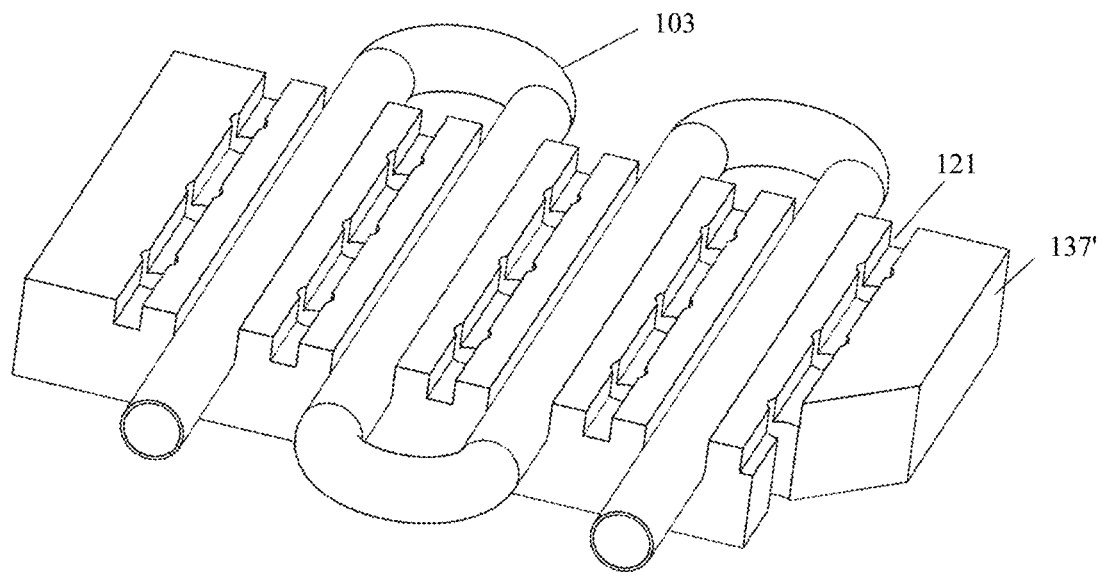
Figure 2A:
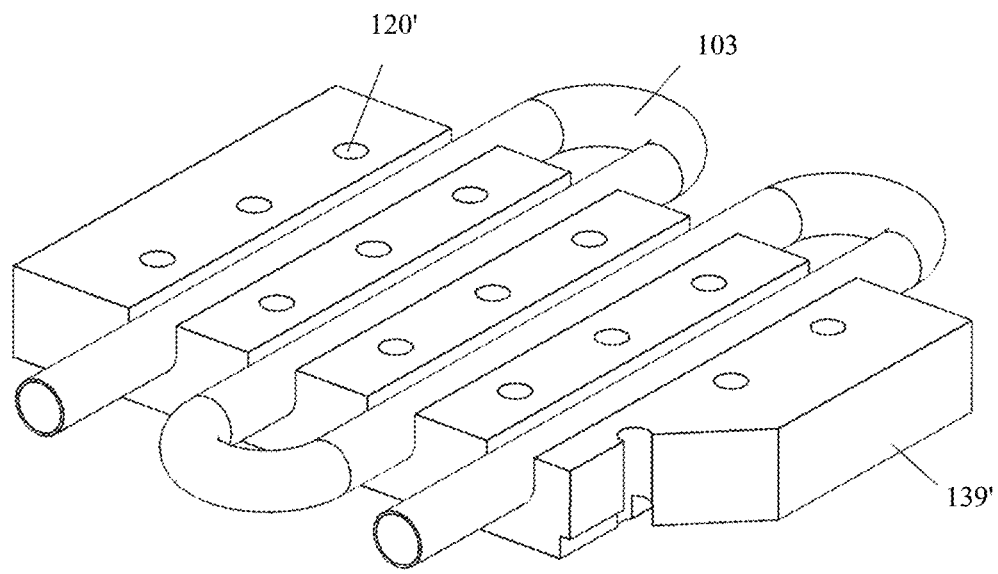
Figure 2A:
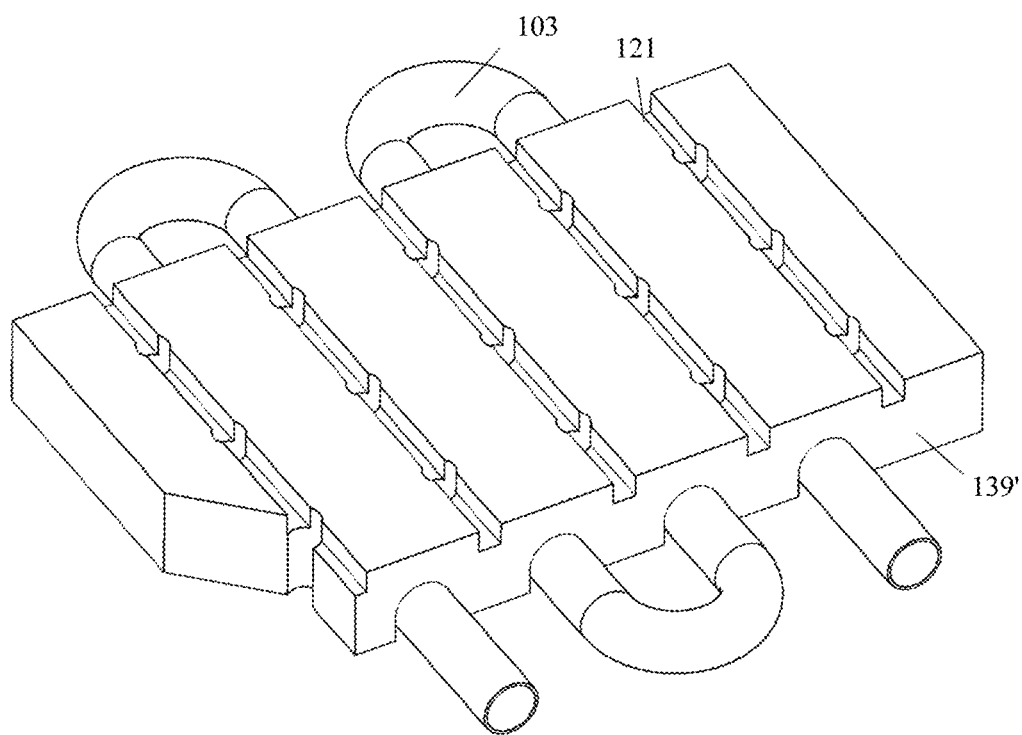
Figure 2A:
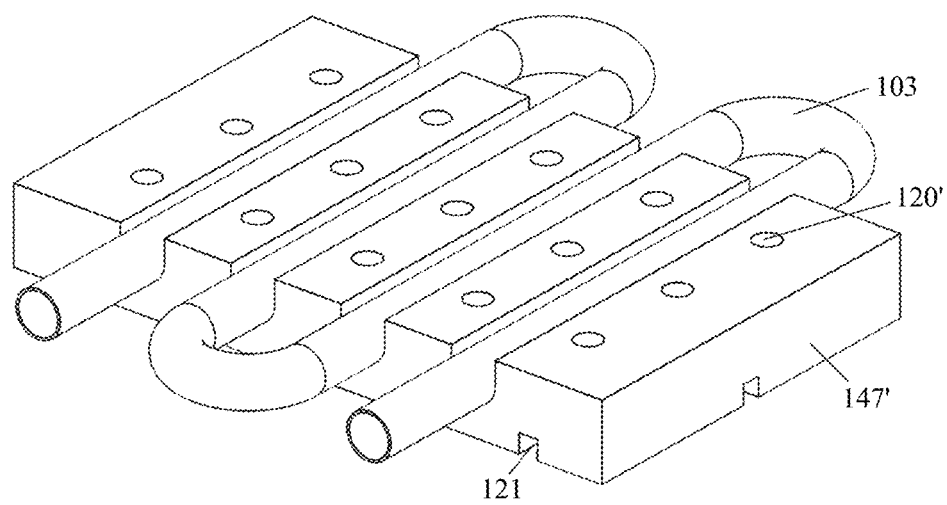
Figure 2A:
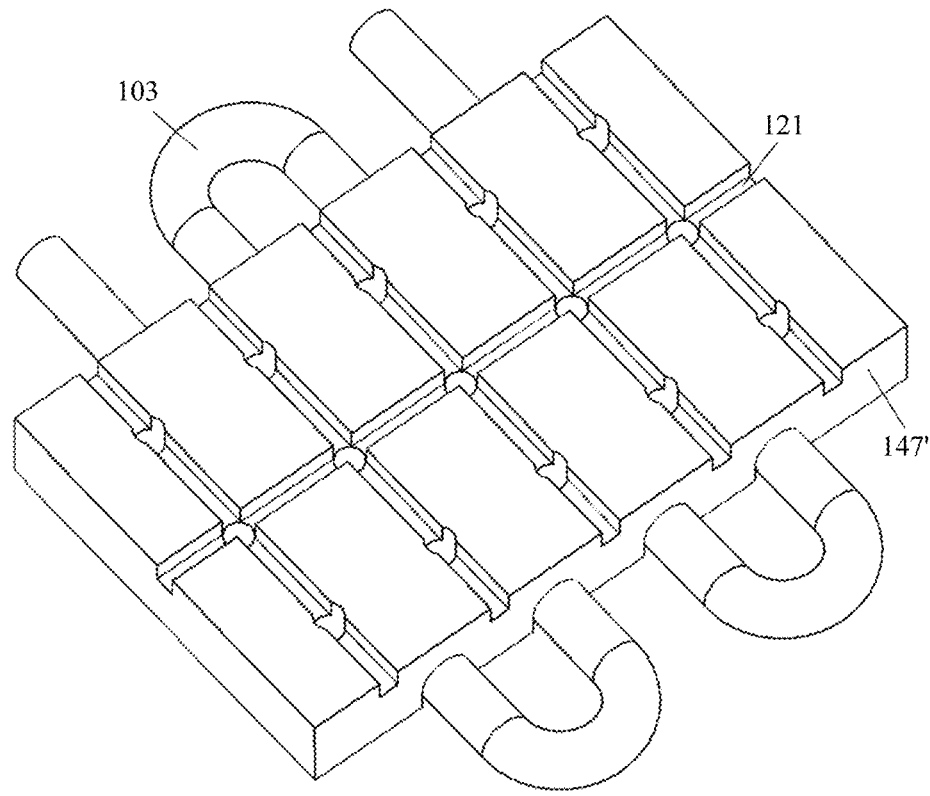
Figure 2A:
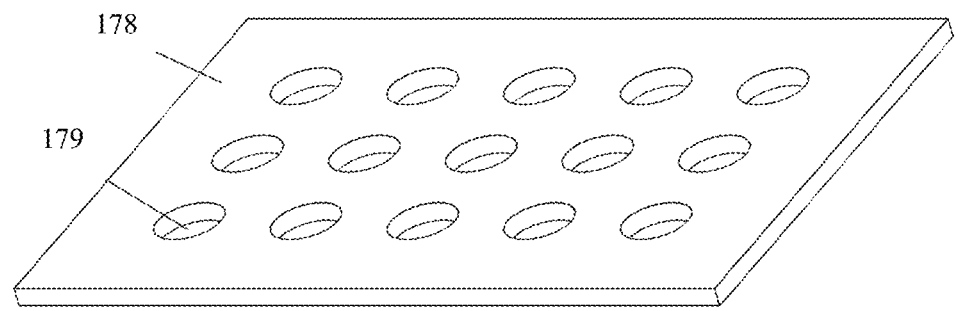
Figure 2A:
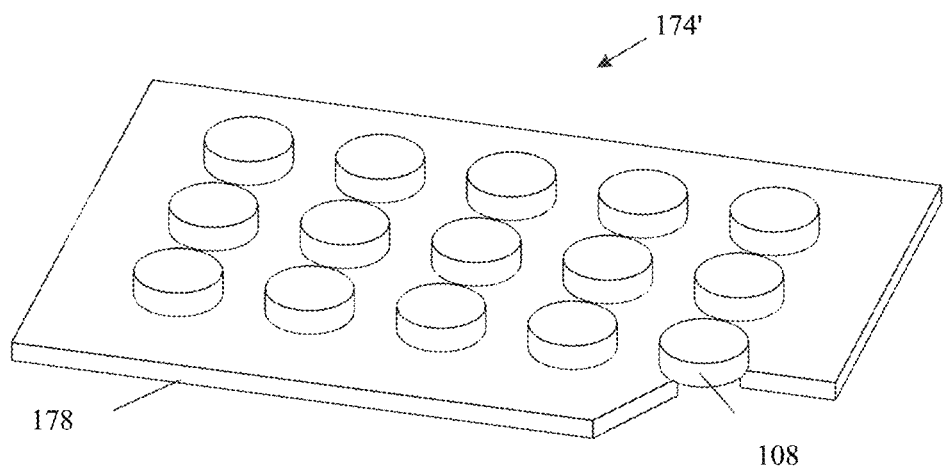
Figure 2A:
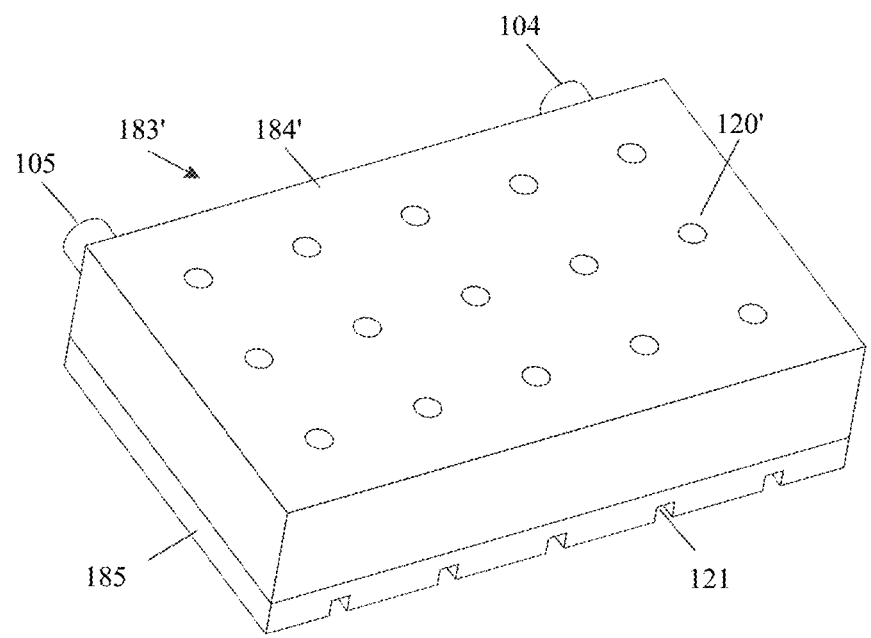
Figure 2A:
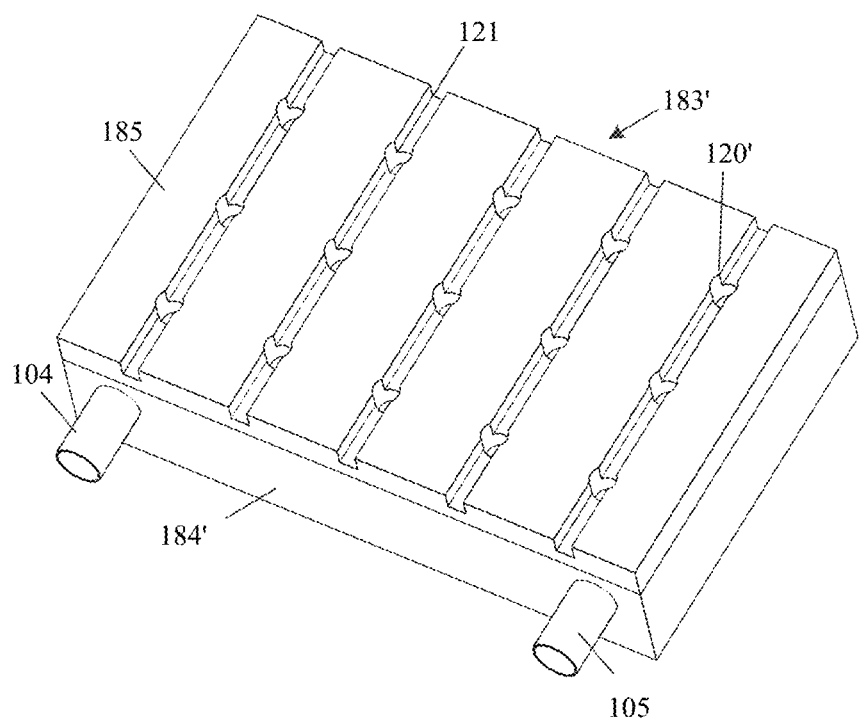
Figure 2B:
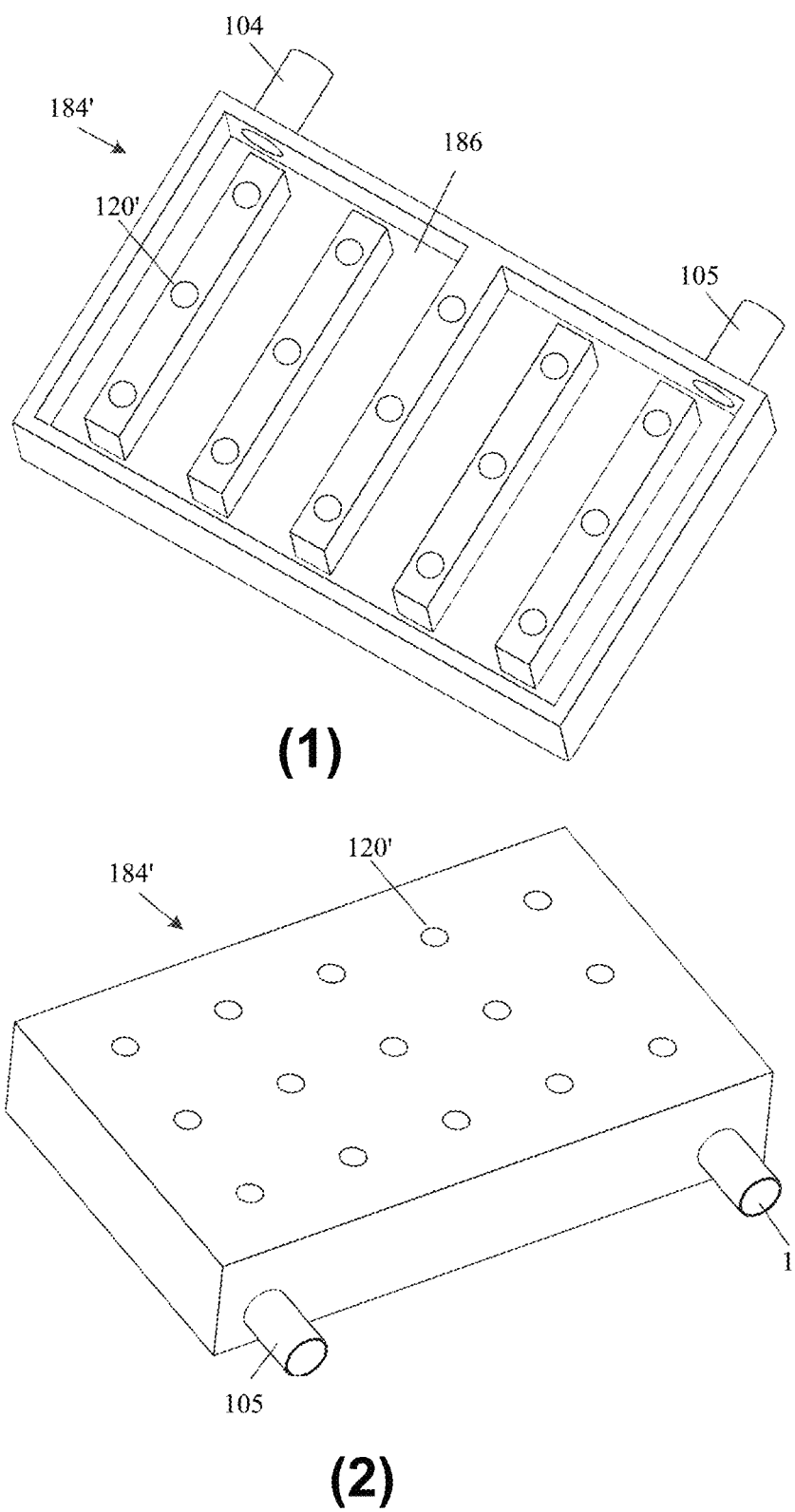
Figure 2B:
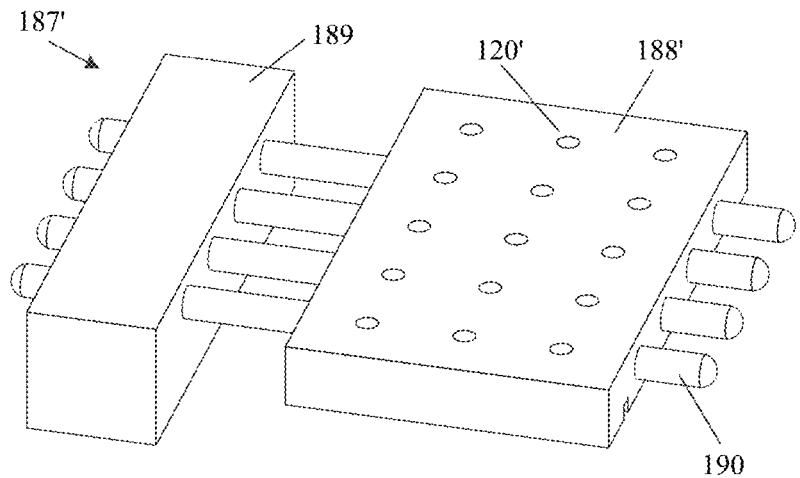
Figure 2B:
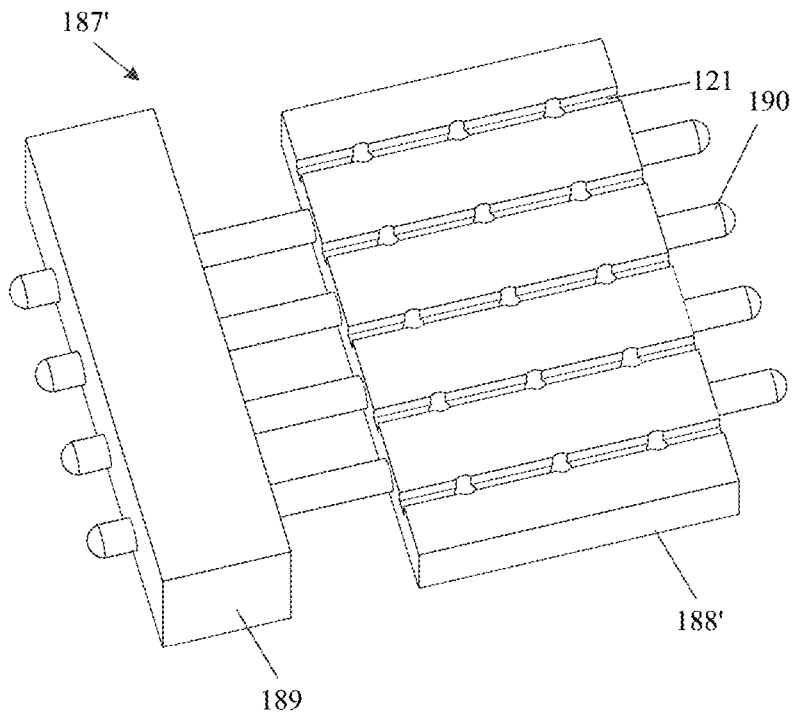
Figure 2B:
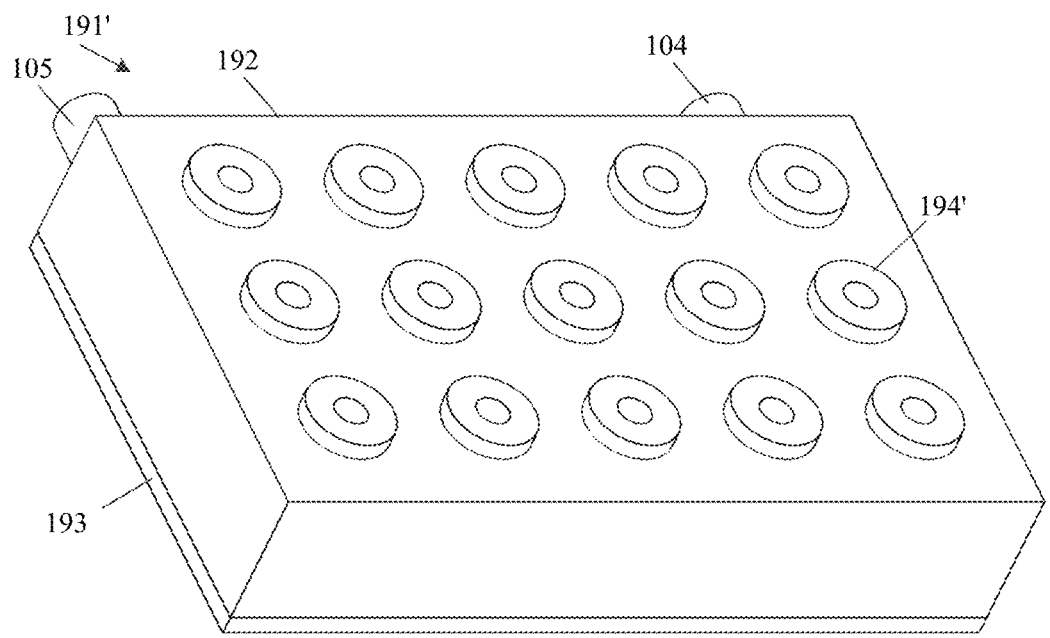
Figure 2B:
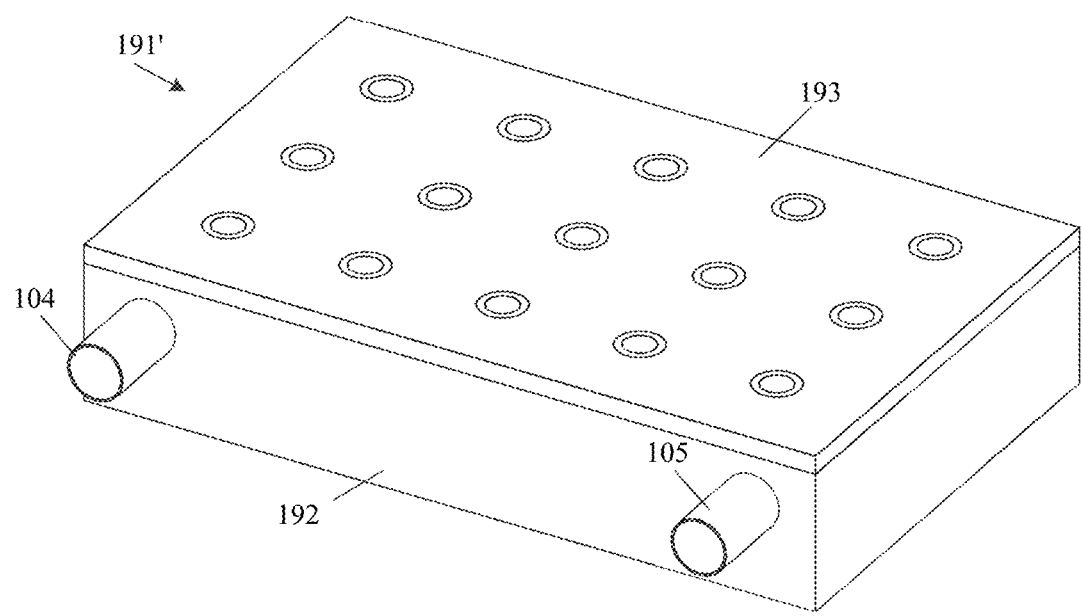
Figure 2B:
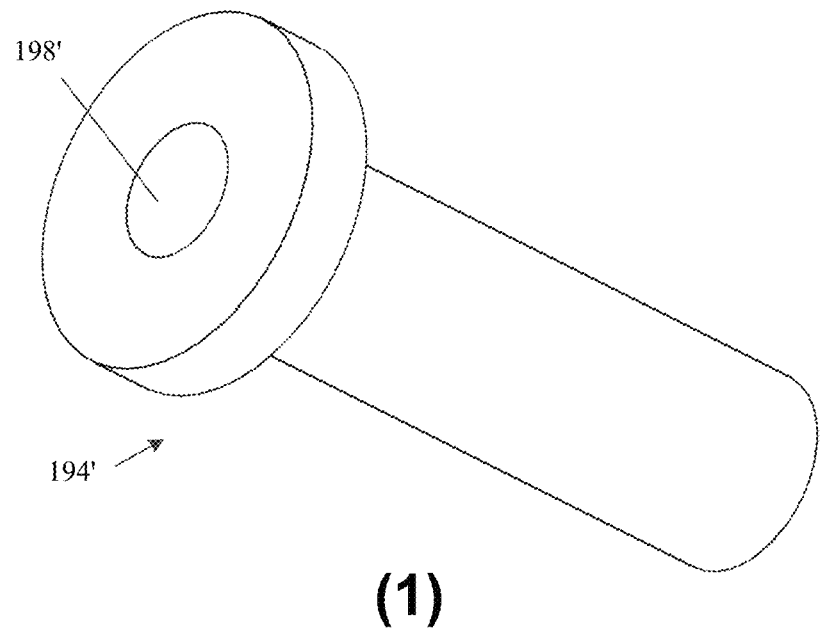
Figure 2B:
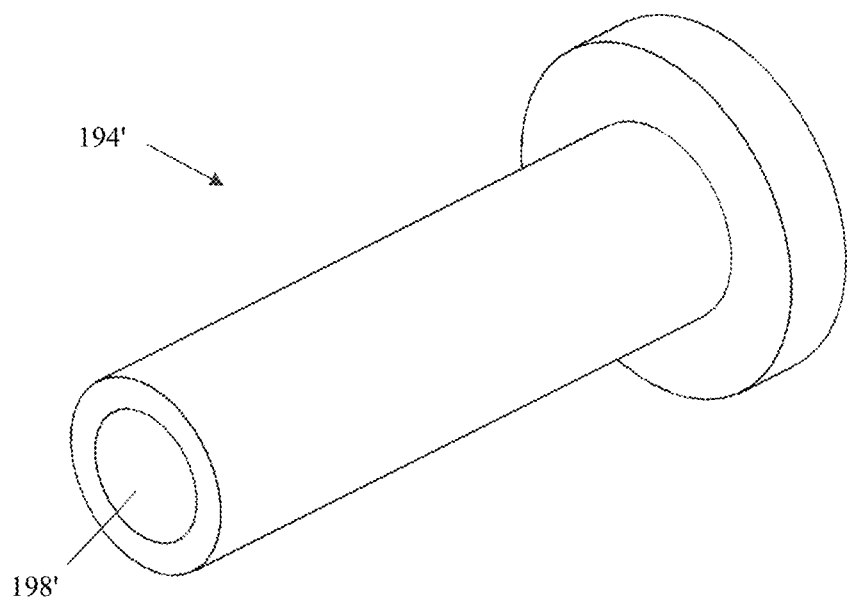
Figure 2B:
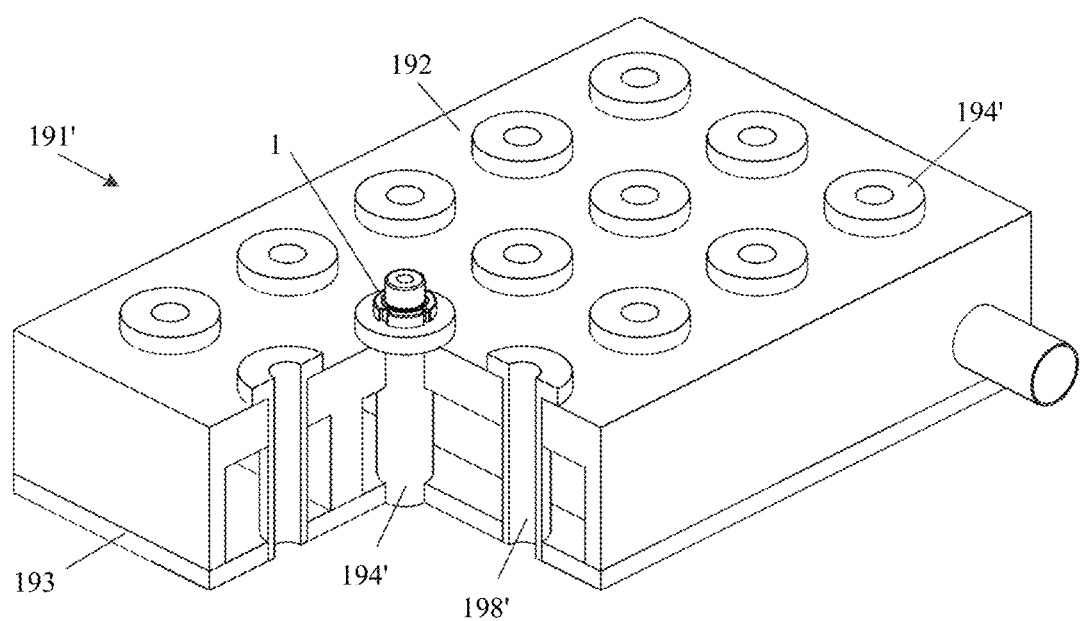

FIG. 2Z illustrates another heat sink module 183 that may be used in the laser array modules disclosed herein, in accordance with some embodiments. The heat sink module 183 is integrated with a liquid cooling layer, and includes a liquid cooling channel with an inlet 104 and an outlet 105. In some embodiments, the liquid cooling channel is a fluid channel or a series of interconnected fluid chambers created within the body of the heat sink module, and is not necessarily in the form of a circular tube embedded in the body of the heat sink module. The heat sink module 183 may replace the heat sink module 137 or 139 in the laser array module in some embodiments.

FIG. 2Z-(1) shows a perspective view of the heat sink module 183 from above, and FIG. 2Z-(2) shows a perspective view of the heat sink module 183 from below. As shown in FIG. 2Z, the heat sink module 183 includes a first portion 184 and a second portion 185 that are adhered together to form an enclosure in which a cooling liquid may circulate to cool the heat sink module 183. The inlet 104 and outlet 105 for the cooling liquid are opened in the body (side walls) of the first portion 184, to allow a cooling liquid to enter and exit the enclosure (fluid channel) created by the first portion 184 and the second portion 185 of the heat sink module 183.

As shown in FIG. 2Z-(1), an array of through-holes (e.g., stepped through-holes (to serve as the upper portions of stepped through-holes 120) are opened in the first portion 184 of the heat sink module 183 to accommodate the upper portions of an array of the laser diodes 1. As shown in FIG. 2Z-(2), an array of through-holes (to serve as the lower portions of stepped through-holes 120) are opened to accommodate the lower portions of the array of laser diodes 1. Each through-hole in the first portion 184 corresponds to a respective through-hole in the second portion 185, and the two through-holes have the same lateral position in their respective portions. In addition, as shown in FIG. 2Z-(2), linear grooves 121 are created in the surface of the second portion 185 to each link a respective row or column of through-holes in the second portion.

In some embodiments (not shown in FIG. 2Z-(1)), an array of straight through-holes are opened at corresponding positions in each of the first portion 184 of the heat sink module 183 and the second portion 185 to accommodate the lower portions of an array of the laser diodes 1. In addition, as shown in FIG. 2Z-(2), linear grooves 121 are created in the surface of the second portion 185 to each link a respective row or column of through-holes in the second portion.

FIG. 2AA shows more details of the first portion 184 of the heat sink module 183, in accordance with some embodiments. FIG. 2AA-(1) shows a perspective view of the first portion 184 from a first side, and FIG. 2AA-(2) shows a perspective view of the first portion 184 from a second side. As shown in FIG. 2AA-(1), the inside of the first portion 184 are hollowed out leaving only solid materials around locations of the stepped through holes (serving as stepped through-holes 120). For example, in some embodiments, the inside of the first portion is hollowed out, leaving a shell, and a plurality of islands and protrusions of solid materials attached to the shell. On each of the islands or protrusions, there are one or more stepped through-holes (e.g., a row or column of stepped through-holes from the array of stepped through-holes serving as stepped through-holes 120). In addition, an inlet 104 and an outlet 105 are created in the side walls of the shell, allowing a cooling fluid to enter into and exit the hollowed interior region within the first portion 184.

FIG. 2AB shows the second portion 185 of the heat sink module 183 in accordance with some embodiments. FIG. 2AB-(1) shows the second portion 185 from a first side, and FIG. 2AB-(2) shows the second portion 185 from a second side. As shown in FIG. 2AB, the second portion 185 is substantially planar, and includes an array of through-holes at locations that correspond to the array of laser diodes 1 in a laser array module, each row or column of the through-holes are linked by a respective one of the linear grooves 121.

FIG. 2AZ illustrates another heat sink module 183' that may be used in the laser array modules disclosed herein, in accordance with some embodiments. The heat sink module 183' is similar to the heat sink module 183 shown in FIG. 2Z, except that heat sink module 183' includes straight through holes instead of stepped through-holes. In FIG. 2AZ, the heat sink module 183' is integrated with a liquid cooling layer, and includes a liquid cooling channel with an inlet 104 and an outlet 105. In some embodiments, the liquid cooling channel is a fluid channel or a series of interconnected fluid chambers created within the body of the heat sink module, and is not necessarily in the form of a circular tube embedded in the body of the heat sink module. The heat sink module 183' may replace the heat sink module 137' or 139' in the laser array module in some embodiments.

FIG. 2AZ-(1) shows a perspective view of the heat sink module 183' from above, and FIG. 2AZ-(2) shows a perspective view of the heat sink module 183' from below. As shown in FIG. 2AZ, the heat sink module 183' includes a first portion 184' and a second portion 185 that are adhered together to form an enclosure in which a cooling liquid may circulate to cool the heat sink module 183. The inlet 104 and outlet 105 for the cooling liquid are opened in the body (side walls) of the first portion 184, to allow a cooling liquid to enter and exit the enclosure (fluid channel) created by the first portion 184' and the second portion 185 of the heat sink module 183'.

As shown in FIG. 2AZ-(1), an array of through-holes (e.g., straight through-holes (to serve as the upper portions of straight through-holes 120') are opened in the first portion 184' of the heat sink module 183'. As shown in FIG. 2AZ-(2), an array of through-holes (to serve as the lower portions of straight through-holes 120') are opened. Each through-hole in the first portion 184' corresponds to a respective through-hole in the second portion 185, and the two through-holes have the same lateral position in their respective portions. In addition, as shown in FIG. 2AZ-(2), linear grooves 121 are created in the surface of the second portion 185 to each link a respective row or column of through-holes in the second portion.

FIG. 2BA shows more details of the first portion 184' of the heat sink module 183', in accordance with some embodiments. FIG. 2BA-(1) shows a perspective view of the first portion 184' from a first side, and FIG. 2BA-(2) shows a perspective view of the first portion 184' from a second side. As shown in FIG. 2BA-(1), the inside of the first portion 184' are hollowed out leaving only solid materials around locations of the through holes (serving as straight through-holes 120'). For example, in some embodiments, the inside of the first portion is hollowed out, leaving a shell, and a plurality of islands and protrusions of solid materials attached to the shell. On each of the islands or protrusions, there are one or more straight through-holes (e.g., a row or column of straight through-holes from the array of straight through-holes serving as straight through-holes 120'). In addition, an inlet 104 and an outlet 105 are created in the side walls of the shell, allowing a cooling fluid to enter into and exit the hollowed interior region within the first portion 184.

As a person skilled in the art would appreciate, although the laser diodes and array pattern shown in each of laser array modules disclosed herein appear to be identical, characteristics of individual laser diodes (e.g., operating frequency, power, type, etc.) may be different for adaption in various applications. Furthermore, not all through-holes (e.g., stepped through-holes 120 or straight through-holes 120') in a particular array need to be implemented for a particular application, if a laser light source (e.g., the laser diode 1) is not needed at the locations of particular stepped through holes.

FIG. 2AC illustrates another heat sink module 187 that is integrated with a cooling module without use of a cooling liquid, in accordance with some embodiments. As shown in FIG. 2AC, the heat sink module 187 includes a first portion 188 that includes an array of stepped through holes 120 for accommodating an array of laser diodes 1 of the laser array module, and a second portion 189 of dissipating heat collected from the first portion 188. FIG. 2AC-(1) shows a perspective view of the heat sink module 187 from above, and FIG. 2AC-(2) shows a perspective view of the heat sink module 187 from below.

In the heat sink module 187, a plurality of heat conductive rods 190 (e.g., copper rods or other metal rods) are inserted into the first portion 188 of the heat sink module 187 on one end, and inserted into a heat exchanger 189 on the other end. The plurality of heat conductive rods 190 are positioned within the first portion 188 in a manner that do not touch or pass through the array of stepped through-holes 120 in the first portion 188, but are sufficiently close to the stepped through-holes 120 so as to efficiently extract heat from the stepped through-holes 120. On the back side of the first portion 188, a plurality of linear grooves 121 are created, each linking a respective row or column of stepped through-holes 120.

The heat sink module 187 shown in FIG. 2AC replaces the heat sink module (e.g., heat sink module 137 or 139) in a laser array module disclosed herein, in accordance with some embodiments. In essence, the first portion of the heat sink module 187 is used to accommodate the components of the laser array module, except for the liquid cooling tube, and the second portion 189 of the heat sink module 187 serves to dissipate heat and replaces the liquid cooling tube/liquid cooling layer of the laser array module.

FIG. 2BB illustrates another heat sink module 187' that is similar to the heat sink module 187 in FIG. 2AC, in accordance with some embodiments, except that the heat sink module 187' includes a first portion 188' with straight through-holes 120' instead of a first portion 188 with stepped through-holes 120. The heat sink module 187' shown in FIG. 2BB can replace the heat sink module (e.g., heat sink module 137' or 139') in a laser array module disclosed herein, in accordance with some embodiments. In essence, the first portion of the heat sink module 187' is used to accommodate the components of the laser array module, except for the liquid cooling tube, and the second portion 189 of the heat sink module 187' serves to dissipate heat and replaces the liquid cooling tube/liquid cooling layer of the laser array module.

FIG. 2AD illustrates another heat sink module 191 in accordance with some embodiments. The heat sink module 191 utilizes liquid cooling within an enclosure created within the heat sink module 191. In some embodiments, the heat sink module 191 replaces other heat sink modules (e.g., heat sink module 137, 139, 147, 149, 161, 162, or 166, etc.) used in the laser array modules disclosed herein.

FIG. 2AD-(1) shows a perspective view of the heat sink module 191 from above, and FIG. 2AD-(2) shows a perspective view of the heat sink module 191 from below. As shown in FIG. 2AD, the heat sink module 191 is formed by a first portion 192, and a second portion 193 that are adhered together to create an enclosure in which a cooling fluid may circulate. The cooling liquid can enter the enclosure from an inlet 104, and exit the enclosure from the outlet 105 created on the side wall(s) of the enclosure.

As shown in FIG. 2AD-(1), the first portion 192 of the heat sink module 191 includes an array of through-holes at locations corresponding to the locations of the array of laser diodes 1 in the laser array module. Within each of the through-holes 196 (see FIG. 2AE), a heat sink element 194 is inserted. The heat sink element 194 includes a stepped through-hole 198 (See FIGS. 2AF-(2) and 2AF-(3)) that serves as the stepped through-hole 120 for accommodating a respective laser diode 1. As shown in FIG. 2AD-(2), the second portion 193 of the heat sink module 191 includes an array of through holes 197 (see FIG. 2AF-(1)), and the lower portions of the heat sink elements 194 are inserted into respective through-holes 197 in the second portion 193.

FIG. 2AE illustrates the structure of the first portion 192 of the heat sink module 191 in accordance with some embodiments. FIG. 2AE-(1) shows the first portion 192 from a first side and FIG. 2AE-(2) shows the first portion 192 from the opposite side.

As shown in FIG. 2AE-(1), the inside of the first portion 192 of the heat sink module 191 includes a hollowed out space that serves as a fluid channel 195 for transporting a cooling liquid from an inlet 104 to an outlet 105 on the side wall(s) of the first portion 192. In some embodiments, the fluid channel created within the first portion 192 includes a series of interconnected linear channels that run along the rows or columns of the through-holes 196, as shown in FIG. 2AE-(1). The locations of the through-holes 196 in the first portion 192 of the heat sink module 191 correspond to the locations of the array of laser diodes 1 in the laser array module.

FIG. 2AF-(1) shows the second portion 193 of the heat sink module 191 in accordance with some embodiments. As shown in FIG. 2AF-(1), the second portion 193 of the heat sink module 191 is a substantially planar body with an array of through-holes 197 created at locations that correspond to the array of laser diodes 1 in the laser array module.

FIGS. 2AF-(2) and 2AF-(3) illustrate the heat sink element 194 in accordance with some embodiments. FIG. 2AF-(2) shows a perspective view of the heat sink element 194 from one end, and FIG. 2AF-(3) shows a perspective view of the heat sink element 194 from the opposite end. As shown in FIG. 2AF-(2), the heat sink element includes a stepped through-hole 198, where the stepped through-hole 198 serves as the stepped through-hole 120 to hold the laser diode in place. The stepped through-hole 198 includes an upper portion that is wider in diameter, and a lower portion that is narrower than the upper portion. When a laser diode 1 is inserted into the stepped through-hole 198, the support plate of the laser diode rests on the stepped surface created between the upper and lower portions of the stepped through-hole 198.

As shown in FIGS. 2AF-(2) and 2AF-(3), the heat sink element 194 consists of a top cylindrical portion and a bottom cylindrical portion that is narrower than the top cylindrical portion. A stepped surface is created between the top cylindrical portion and the bottom cylindrical portion, and when the heat sink element 194 is inserted into the first portion 192 of the heat sink module 191, the external stepped surface between the upper and lower portions of the heat sink element 191 rests against the top surface of first portion 192 around the through-hole 196. When the lower portion of the heat sink element 194 is inserted into the through-hole 197 in the second portion 193 of the heat sink module, the tip of the lower portion of the heat sink element 194 is flush against the external surface of the second portion 193.

FIG. 2AG illustrates the assembled heat sink module 191 with a cut through view at the location of a heat sink element 194. As shown in FIG. 2AG, when the first portion 192 and the second portion 193 of the heat sink module are adhered together, a chamber is created between the first portion 192 and the second portion 193. The through-holes in the first portion and the through-holes in the second portion of the heat sink module 191 are at corresponding locations, such that an axis through a through-hole in the first portion 192 and its corresponding through-hole in the second portion 193 is perpendicular to the top surface of the first portion 192 and the bottom surface of the second portion 193. The islands and protrusions within the fluid chamber are arranged such that continuous flow of the cooling liquid from the inlet 104 to the outlet 105 is realized. Furthermore, the cooling fluid would reach the region of every set of through-holes 120 (within heat sink elements 194) when flowing through the fluid chamber.

FIG. 2AG further illustrates that, a heat sink element 194 is inserted in a respective set of through-holes in the first and second portions of the heat sink module 191. The side wall of the lower portion of the heat sink element 194, the top and side walls of the first portion 192 of the heat sink module 191, and the second portion 193 of the heat sink module 191, together form a fully enclosed fluid channel through the heat sink module 191. In some embodiments, the boundaries between different components of the heat sink module 191 are sealed such that leaking of the cooling fluid is prevented.

As shown in FIG. 2AG, the laser diode 1 is inserted into the through-hole 198 in the heat sink element 194 and the support plate of the laser diode 1 is rested on the stepped surface between the upper and lower portions of the heat sink element 194.

Although not shown in FIGS. 2AF-(1) and 2AG, the bottom surface of the second portion 193 includes linear grooves that each link a respective sequence of through-holes 197, such that the conductive leads from the laser diodes 1 within the stepped through-holes 198 of the heat sink elements 194 can run within the linear grooves and eventually to the driving circuit layers on the side(s) of the heat sink module 191.

FIG. 2BC illustrates another heat sink module 191' in accordance with some embodiments. The heat sink module 191' is similar to the heat sink module 191 shown in FIG. 2AD, except that the heat sink module 191' include straight through-holes instead of stepped through holes. The heat sink module 191' utilizes liquid cooling within an enclosure created within the heat sink module 191'. In some embodiments, the heat sink module 191' replaces other heat sink modules (e.g., heat sink module 137', 139', 147', 149', 161, 162, or 166, etc.) used in the laser array modules disclosed herein.

FIG. 2BC-(1) shows a perspective view of the heat sink module 191' from above, and FIG. 2BC-(2) shows a perspective view of the heat sink module 191' from below. As shown in FIG. 2BC, the heat sink module 191' is formed by a first portion 192, and a second portion 193 that are adhered together to create an enclosure in which a cooling fluid may circulate. The cooling liquid can enter the enclosure from an inlet 104, and exit the enclosure from the outlet 105 created on the side wall(s) of the enclosure. The portions 192 and 193 are the same as those shown in FIG. 2AE.

As shown in FIG. 2BC-(1), the first portion 192 of the heat sink module 191' includes an array of through-holes at locations corresponding to the locations of the array of laser diodes 1 in the laser array module. Within each of the through-holes 196 (see FIG. 2AE), a heat sink element 194' is inserted. The heat sink element 194' includes a straight through-hole 198' (See FIGS. 2BD-(1) and 2BD-(2)) that serves as the straight through-hole 120' for accommodating a respective laser diode 1. As shown in FIG. 2BC-(2), the second portion 193 of the heat sink module 191' includes an array of through holes 197 (see FIG. 2AF-(1)), and the lower portions of the heat sink elements 194' are inserted into respective through-holes 197 in the second portion 193.

FIGS. 2BD-(1) and 2BD-(2) illustrate the heat sink element 194' in accordance with some embodiments. FIG. 2BD-(1) shows a perspective view of the heat sink element 194' from one end, and FIG. 2BD-(2) shows a perspective view of the heat sink element 194' from the opposite end. As shown in FIG. 2BD-(1), the heat sink element includes a straight through-hole 198', where the straight through-hole 198' serves as the straight through-hole 120' to hold the laser diode in place. The straight through-hole 198' includes an upper portion that is formed in a flat ring shaped collar of the element 194', and a lower portion that is formed in a long tube portion of the element 194'. When a laser diode 1 is inserted into the straight through-hole 198', the support plate of the laser diode rests on the flat ring-shaped collar of the element 194'.

As shown in FIGS. 2BD-(1) and 2BD-(2), the heat sink element 194' consists of a top cylindrical portion (a flat ring-shaped collar) and a bottom cylindrical portion that is narrower than the top cylindrical portion. The center through-holes in the top portion and the bottom portion of the element 194' have the same diameter; therefore, a straight through-hole is created between the top cylindrical portion and the bottom cylindrical portion. When the heat sink element 194' is inserted into the first portion 192 of the heat sink module 191', the external stepped surface between the upper and lower portions of the heat sink element 191' rests against the top surface of first portion 192 around the through-hole 196. When the lower portion of the heat sink element 194' is inserted into the through-hole 197 in the second portion 193 of the heat sink module, the tip of the lower portion of the heat sink element 194' is flush against the external surface of the second portion 193.

FIG. 2BE illustrates the assembled heat sink module 191' with a cut through view at the location of a heat sink element 194'. As shown in FIG. 2BE, when the first portion 192 and the second portion 193 of the heat sink module are adhered together, a chamber is created between the first portion 192 and the second portion 193. The through-holes in the first portion and the through-holes in the second portion of the heat sink module 191' are at corresponding locations, such that an axis through a through-hole in the first portion 192 and its corresponding through-hole in the second portion 193 is perpendicular to the top surface of the first portion 192 and the bottom surface of the second portion 193. The islands and protrusions within the fluid chamber are arranged such that continuous flow of the cooling liquid from the inlet 104 to the outlet 105 is realized. Furthermore, the cooling fluid would reach the region of every set of through-holes 120' (within heat sink elements 194') when flowing through the fluid chamber.

FIG. 2BE further illustrates that, a heat sink element 194' is inserted in a respective set of through-holes in the first and second portions of the heat sink module 191'. The side wall of the lower portion of the heat sink element 194', the top and side walls of the first portion 192 of the heat sink module 191, and the second portion 193 of the heat sink module 191', together form a fully enclosed fluid channel through the heat sink module 191'. In some embodiments, the boundaries between different components of the heat sink module 191' are sealed such that leaking of the cooling fluid is prevented.

As shown in FIG. 2BE, the laser diode 1 is inserted into the through-hole 198' in the heat sink element 194' and the support plate of the laser diode 1 is rested on the top surface of the flat collar of the heat sink element 194'.

Although not shown in FIGS. 2AF-(1) and 2BE, the bottom surface of the second portion 193 includes linear grooves that each link a respective sequence of through-holes 197, such that the conductive leads from the laser diodes 1 within the through-holes 198' of the heat sink elements 194' can run within the linear grooves and eventually to the driving circuit layers on the side(s) of the heat sink module 191'.

Other details of the heat sink module and its functions and positions in the laser array module are provided in other parts of this specification, and are not repeated here.

As disclosed herein, a system (e.g., a laser array module, or a partially assembled laser array module) includes at least a heat sink module (e.g., any of heat sink modules 111, 137, 139, 147, 161, 166, 183, 187, and 191, and various variations thereof as described herein) and a driving circuit module.

The heat sink module includes a respective top surface, a respective bottom surface opposite to the respective top surface of the heat sink module, and a plurality of first stepped through-holes (e.g., stepped through-holes 120) linking the respective top surface and the respective bottom surface of the heat sink module. Each first stepped through-hole has a respective cylindrical upper portion and a respective cylindrical lower portion that is narrower than the respective cylindrical upper portion of said each first stepped through-hole, e.g., as shown in FIG. 2E. The respective cylindrical upper portion and the respective cylindrical lower portion of said each first stepped through-hole (e.g., stepped through-hole 120) are joined by a respective first ring-shaped surface that is substantially perpendicular to the respective cylindrical upper and lower portions of said each first stepped through-hole, e.g., as shown in FIG. 2E. The respective bottom surface of heat sink module includes a plurality of grooves (e.g., grooves 121). Each groove passes through the respective lower portions of a respective sequence of first stepped through-holes (e.g., stepped through-holes 120) among the plurality of first stepped through-holes in the heat-sink module, e.g., as shown in FIG. 2E-(2).

The driving circuit module includes a plurality of conductive lead connectors (e.g., conductive lead connectors 114, 116), and one or more electrical driving surfaces (e.g., driving circuit layers 118, 138) that are disposed substantially perpendicular to the respective top and bottom surfaces of the heat sink module (e.g., any of heat sink module 111, 137, 139, 147, 161, 166, 183, 187, and 191, etc.), e.g., as shown in FIGS. 2B-2C, 2L-2M, 2R, 2T, and 2W.

Each conductive lead connector (e.g., conductive lead connectors 114, 116) lies at least partially within a respective one of the plurality of grooves (e.g., grooves 121) in the respective bottom surface of the heat sink module. The plurality of conductive lead connectors include a set of internal lead connectors (e.g., U-shaped conductive lead connectors 114) and a set of external lead connectors (e.g., L-shaped conductive lead connectors 116). Each of the set of internal lead connectors links at least two of the first stepped through-holes (e.g., stepped through-holes 120) in the respective sequence of first stepped through-holes passed by the respective one of the plurality of grooves in the respective bottom surface of the heat sink module, e.g., as shown in 2H, 2J, 2K, 2L, 2Q, 2U, and 2W, etc.

Each of the set of external lead connectors (e.g., L-shaped conductive lead connectors 116) links at least one of the first stepped through-holes in the respective sequence of first stepped through-holes passed by the respective one of the plurality of grooves (e.g., grooves 121) in the respective bottom surface of the heat sink module to at least one of the one or more electrical driving surfaces (e.g., driving circuit layer 118, 138) of the driving circuit module that are disposed substantially perpendicular to the respective top and bottom surfaces of the heat sink module, e.g., as shown in 2H, 2J, 2K, 2L, 2Q, 2U, and 2W, etc.

In some embodiments, the system (e.g., the laser array module) further includes a plurality of laser diodes (e.g., an array of laser diodes 1). Each of the plurality of laser diodes is disposed in a respective one of the plurality of first stepped through-holes in the heat sink module. Each laser diode includes a respective laser diode body (e.g., laser diode body 3), a respective set of conductive leads (e.g., conductive leads 4), and a respective conductive support plate (e.g., support plate 2) disposed between the respective laser diode body and the respective set of conductive leads of said each laser diode, e.g., as shown in FIG. 2A.

The respective conductive support plate (e.g., support plate 2) of each laser diode is disposed at least partially within the respective cylindrical upper portion of the respective one of the plurality of first stepped through-holes (e.g., stepped through-holes 120) in the heat sink module, and is supported by the respective first ring-shaped surface joining the respective cylindrical upper and lower portions of the respective one of the plurality of first stepped through-holes, e.g., as shown in FIGS. 2H, 2U, and 2W.

The respective set of conductive leads of each laser diode are disposed within the respective cylindrical lower portion of the respective one of the plurality of first stepped through-holes in the heat sink module, e.g., as shown in FIGS. 2H, 2U, and 2W.

In some embodiments, the driving circuit module includes a respective insulation tube (e.g., insulator tube 112) disposed within the respective cylindrical lower portion of each first stepped through-hole (e.g., stepped through-hole 120), e.g., as shown in FIGS. 2H, 2U, and 2W.

In some embodiments, each internal lead connector includes a U-shaped conductor (e.g., U-shaped conductive lead connector 114) with a first arm and a second arm connected by a linear body. Each of the first and second arms of the U-shaped conductor is disposed within a respective one of the two first stepped through-holes connected by the internal lead connector, and the linear body is disposed within the respective groove that passes through the two first stepped through-holes, e.g., as shown in FIGS. 2F, 2H, 2U, and 2W.

In some embodiments, the respective set of conductive leads of the respective laser diode disposed include a respective cathode lead, a respective anode lead, and optionally, a respective ground lead, and wherein each U-shaped conductor connects the respective cathode lead of one laser diode to the respective anode lead of another laser diode along the plurality of laser diodes.

In some embodiments, each external lead connector includes an L-shaped conductor (e.g., L-shaped conductive lead connector 116) with a first leg and a second leg, wherein first leg of the L-shaped conductor is disposed within a respective first stepped through-hole and the second leg is disposed within the respective groove that passes through the respective first stepped through-hole and conductively connected to one of the one or more electrical driving surfaces of the driving circuit module, e.g., as shown in FIGS. 2F, 2H, 2U, and 2W.

In some embodiments, each L-shaped conductor connects the respective cathode lead or anode lead of one laser diode to one of the one or more electrical driving surfaces of the driving circuit module, e.g., as shown in FIGS. 2F, 2H, 2U, and 2W.

In some embodiments, the system further includes a cooling module (e.g., cooling module 102 or a cooling module integrated with the heat sink module). In some embodiments, the cooling module (e.g., cooling module 189) includes a plurality of cooling rods (e.g., rods 190) that are disposed between the top and bottom surfaces of the heat sink module (e.g., first portion 188 of heat sink module 187), and includes a heat dissipater (e.g., second portion 189 of the heat sink module 187) that is connected to the plurality of cooling rods and disposed outside of the heat sink module (e.g., the first portion 188 of the heat sink module 187), e.g., as shown in FIG. 2AC.

In some embodiments, the heat sink module includes a plurality of interconnected channels between the top and bottom surfaces of the heat sink module, e.g., as shown in FIGS. 2AA and 2AE, etc. The plurality of interconnected channels are configured to transport a cooling liquid between an inlet and an outlet, and wherein the plurality of first stepped through-holes (e.g., stepped through-holes 120) are separated from the cooling liquid by respective metal tube (e.g., heat sink element 194) connecting the top and bottom surfaces of the heat sink module (e.g., heat sink module 191), and inner surfaces of plurality of first stepped through-holes comprises inner surfaces of the metal tubes (e.g., heat sink element 194), e.g., as shown in FIG. 2AG.

In some embodiments, the heat sink module includes a plurality of interconnected channels between the top and bottom surfaces of the heat sink module, wherein the plurality of interconnected channels are configured to transport a cooling liquid between an inlet and an outlet, and wherein the plurality of first stepped through-holes exist within rows of solid material between the top and bottom surfaces of the heat sink module (e.g., as shown in FIG. 2AA-(1)).

In some embodiments, the system further includes a cooling tube (e.g., cooling tube 103) disposed between the top and bottom surfaces of the heat sink module for transporting a cooling liquid between the top and bottom surfaces of the heat sink module, e.g., as shown in FIGS. 2B, 2L, 2N, 2O, 2P, 2Q, 2R, 2S, 2T, and 2V, etc.

In some embodiments, the heat sink module includes a plurality of channels that run parallel to the plurality of grooves in the respective bottom surface of the heat sink module, and wherein the cooling tube includes a plurality of parallel segments that are disposed within the plurality of channels, and a plurality of turning segments each connecting a respective pair of adjacent parallel segments of the cooling tube, e.g., as shown in FIGS. 2B, 2L, 2N, 2O, 2P, 2Q, 2R, 2S, 2T, and 2V, etc.

In some embodiments, the plurality of channels are open channels in the top surface of the heat sink module, e.g., as shown in FIGS. 2O, 2P, and 2Q, etc.

In some embodiments, the plurality of channels are open channels in the bottom surface of the heat sink module, e.g., as shown in FIGS. 2B, 2L, and 2N, etc.

In some embodiments, the plurality of channels are internal channels disposed between the top and bottom surfaces of the heat sink module, e.g., as shown in FIGS. 2AA and 2AE, etc.

In some embodiments, the cooling tube (e.g., cooling tube 103) passes through at least one of the one or more electrical driving surfaces (e.g., driving circuit layer 138) that are disposed substantially perpendicular to the respective top and bottom surfaces of the heat sink module, e.g., as shown in FIG. 2L.

In some embodiments, the cooling tube (e.g., cooling tube 103) does not pass through the one or more electrical driving surfaces (e.g., driving circuit layer 118) that are disposed substantially perpendicular to the respective top and bottom surfaces of the heat sink module, e.g., as shown in FIGS. 2B and 2R, etc.

In some embodiments, the system further includes a cooling module. The cooling module includes a respective first surface, a respective second surface opposite to the respective first surface of the cooling module, and one or more cooling channels embedded between the respective first surface and the respective second surface of the cooling module. For example, the cooling module can be integrated into the heat sink module, as shown in FIGS. 2AA and 2AG. In some embodiments, the respective first surface of the cooling module is disposed next to the heat sink module and is in thermal contact with the bottom surface of the heat sink module, e.g., when the cooling module is a separate layer from the heat sink module.

In some embodiments, a cooling tube is disposed between the first and second surfaces of the cooling module (e.g., cooling module 102) for transporting a cooling liquid between the first and second surfaces of the heat sink module.

In some embodiments, the one or more cooling channels include a plurality of channels that run parallel to the plurality of grooves in the respective bottom surface of the heat sink module, and the cooling tube includes a plurality of parallel segments that are disposed within the plurality of channels, and a plurality of turning segments each connecting a respective pair of adjacent parallel segments of the cooling tube, e.g., as shown in FIG. 2L.

In some embodiments, the plurality of channels are open channels in the top surface of the cooling module. In some embodiments, the plurality of channels are open channels in the bottom surface of the cooling module. In some embodiments, the plurality of channels are internal channels disposed between the top and bottom surfaces of the cooling module.

In some embodiments, the system further includes a lens support module (e.g., the lens substrate layer 110). The lens support module includes a respective top surface, a respective bottom surface opposite to the respective top surface of the lens support module, and a plurality of second stepped through-holes (e.g., stepped through-holes 119) linking the respective top surface and the respective bottom surface of the lens support module (e.g., the lens substrate layer 110), e.g., as shown in FIG. 2D. Each second stepped through-hole (e.g., stepped through-hole 119) has a respective cylindrical upper portion and a respective cylindrical lower portion that is narrower than the respective cylindrical upper portion of said each second stepped through-hole, e.g., as shown in FIG. 2D. The respective cylindrical upper portion and the respective cylindrical lower portion of said each second stepped through-hole are joined by a second ring-shaped surface that is substantially perpendicular to the respective cylindrical upper and lower portions of said each second stepped through-hole. The respective bottom surface of the lens support module is disposed on the respective top surface of the heat sink module, and the plurality of second stepped through-holes in the lens support module are aligned with the plurality of first stepped through-holes in the heat sink module, e.g., as shown in FIGS. 2C, 2H, 2M, 2T, and 2V, etc.

In some embodiments, for each laser diode that has the respective conductive support plate thereof disposed at least partially within a respective one of the plurality of first stepped through-holes in the heat sink module: the respective laser diode body of said each laser diode is disposed within the respective cylindrical lower portion of a respective one of the plurality of second stepped through-holes in the lens support module that is aligned with said respective one of the plurality of first stepped through-holes in the heat-sink module, e.g., as shown in FIGS. 2H, 2U, and 2W, etc.

In some embodiments, a respective lens (e.g., lens 108) disposed at least partially within the respective upper portion of each of the plurality of second stepped through-holes (e.g., stepped through-holes 119) in the lens support module (e.g., lens substrate layer 110), wherein the respective lens is separated from the laser diode body in the respective lower portion of said each second stepped through-hole by a respective gap, e.g., as shown in FIGS. 2H-(2), 2U, and 2W, etc.

In some embodiments, the lens support module comprises a top plate (e.g., top plate 176) and a bottom plate (e.g., bottom plate 178) bonded to the top plate. The top plate includes a plurality of first holes (e.g., through-holes 177) forming the respective cylindrical upper portions of the plurality of second stepped through-holes (e.g., stepped through-holes 119), and the bottom plate includes a plurality of second holes (e.g., through-holes 179) forming the respective cylindrical lower portions of the plurality of second stepped through-holes (e.g., stepped through-holes 119), e.g., as shown in FIG. 2X.

In some embodiments, the system further includes a lens module disposed on the top surface of the heat sink module, the lens module includes a planar surface (e.g., substrate 181) with a plurality of lens domes (e.g., lens domes 180) on the planar surface, where the plurality of lens domes are aligned with the plurality of first stepped through holes (e.g., stepped through-holes 120) in the heat sink module, e.g., as illustrated in FIG. 2Y.

In some embodiments, a system (a double-sided laser array module, or a part thereof) includes a cooling module, a first heat sink module, a first plurality of laser diodes, a first driving circuit module, a second heat sink module, a second plurality of laser diodes, and a second driving circuit module.

The cooling module has a first side and a second side opposite the first side, and a cooling mechanism disposed between the first side and the second side of the cooling module. The first heat sink module has a respective top surface, a respective bottom surface opposite the respective top surface of the first heat sink module, and a respective plurality of first through-holes (e.g., stepped through-holes 120) linking the respective top and bottom surfaces of the first heat sink module. The respective bottom surface of the heat sink module is disposed next to the first side of the cooling module.

Each of the first plurality of laser diodes includes a respective diode body, a respective set of conductive leads, and a respective support plate between the respective diode body and the respective set of conductive leads. Each of the first plurality of laser diodes is disposed at least partially within a respective one of the respective plurality of first through-holes in the first heat sink module with the respective diode body disposed next to the respective top surface of the first heat sink module and the respective set of conductive leads disposed next to the bottom surface of the first heat sink module.

The first driving circuit module includes a respective plurality of conductive lead connectors and respective one or more electrical driving surfaces. The respective one or more electrical driving surfaces of the first driving circuit module are disposed substantially perpendicular to the respective top and bottom surfaces of the first heat sink module. The respective plurality of conductive lead connectors of the first driving circuit module connect the respective set of conductive leads of the first plurality of laser diodes to the respective one or more electrical driving surfaces of the first driving circuit module.

The second heat sink module has a respective top surface, a respective bottom surface opposite the respective top surface of the second heat sink module, and a respective plurality of first through-holes (e.g., stepped through-holes 120) linking the respective top and bottom surfaces of the second heat sink module. The respective bottom surface of the heat sink module is disposed next to the second side of the cooling module.

Each of the second plurality of laser diodes includes a respective diode body, a respective set of conductive leads, and a respective support plate between the respective diode body and the respective set of conductive leads. Each of the second plurality of laser diodes is disposed at least partially within a respective one of the respective plurality of first through-holes (steppe through-holes 120) in the second heat sink module with the respective diode body disposed next to the respective top surface of the second heat sink module and the respective set of conductive leads disposed next to the bottom surface of the second heat sink module.

The second driving circuit module includes a respective plurality of conductive lead connectors and respective one or more electrical driving surfaces. The respective one or more electrical driving surfaces of the second driving circuit module are disposed substantially perpendicular to the respective top and bottom surfaces of the second heat sink module. The respective plurality of conductive lead connectors of the second driving circuit module connect the respective set of conductive leads of the second plurality of laser diodes to the respective one or more electrical driving surfaces of the second driving circuit module.

In various embodiments, the system (e.g., the double-sided laser array module 157, 162, 169, etc.) further includes the features described in other places in this specification.

In some embodiments, a system (e.g., a double-sided laser array module) includes a heat sink module (e.g., heat sink module 161, 166), a first plurality of laser diodes, a second plurality of laser diodes, and a driving circuit module. The heat sink module has a respective top surface, a respective bottom surface opposite the respective top surface of the heat sink module, a first plurality of first through-holes (e.g., stepped through-holes 120-1) linking the respective top and bottom surfaces of the heat sink module, a second plurality of second through-holes (e.g., stepped through-holes 120-2) linking the respective top and bottom surfaces of the heat sink module. The first plurality of first through-holes are arranged according to a first grid pattern and the second plurality of first through-holes are arranged according to a second grid pattern, and the first grid pattern and the second grid pattern are offset from each other, e.g., as shown in FIGS. 2T and 2V.

Each of the first plurality of laser diodes includes a respective diode body, a respective set of conductive leads, and a respective support plate between the respective diode body and the respective set of conductive leads. Each of the first plurality of laser diodes is disposed at least partially within a respective one of the first plurality of first through-holes in the heat sink module with the respective diode body disposed next to the respective top surface of the heat sink module and the respective set of conductive leads disposed next to the respective bottom surface of the heat sink module.

Each of the second plurality of laser diodes includes a respective diode body, a respective set of conductive leads, and a respective support plate between the respective diode body and the respective set of conductive leads, wherein each of the second plurality of laser diodes is disposed at least partially within a respective one of the second plurality of first through-holes in the heat sink module with the respective diode body disposed next to the respective bottom surface of the heat sink module and the respective set of conductive leads disposed next to the respective top surface of the heat sink module.

The driving circuit module (e.g., the module including driving circuit layers 118, conductive lead connectors 114 and 116, and insulator tubes 112) includes a respective plurality of conductive lead connectors and respective one or more electrical driving surfaces. The respective one or more electrical driving surfaces of the driving circuit module are disposed substantially perpendicular to the respective top and bottom surfaces of the heat sink module. A first subset of conductive lead connectors among the respective plurality of conductive lead connectors of the driving circuit module connect the respective set of conductive leads of the first plurality of laser diodes to the respective one or more electrical driving surfaces of the first driving circuit module. A second subset of conductive lead connectors among the respective plurality of conductive lead connectors of the driving circuit module connect the respective set of conductive leads of the second plurality of laser diodes to the respective one or more electrical driving surfaces of the driving circuit module.

In various embodiments, the system (e.g., the double-sided laser array module 162, 169, etc.) further includes the features described in other places in this specification.

In some embodiments, instead of stepped through-holes, straight through-holes with no steps along the body of the through-holes are used in the heat sink module and/or the lens array support module. As described in Figures AI-BC, the various combinations of stepped through-holes and straight through holes in the heat sink module and the lens array support substrate give rise to different configurations of the laser array module. In some embodiments, a system includes a heat sink module (e.g., any the heat sink modules shown in FIGS. 2B-2C, 2H, 2L-2Q, and 2Z, 2AC, 2AD, 2AH, 2AI, 2AM-2AS, 2AT-2AX, 2AZ, 2BB, 2BC, and variations thereof as described herein), and a driving circuit module. The heat sink module includes a respective top surface, a respective bottom surface opposite to the respective top surface of the heat sink module, and a plurality of first through-holes linking the respective top surface and the respective bottom surface of the heat sink module, and the respective bottom surface of heat sink module includes a plurality of grooves, wherein each groove passes through the respective lower portions of a respective sequence of first through-holes among the plurality of first through-holes in the heat-sink module. The driving circuit module includes a plurality of conductive lead connectors, and one or more electrical driving surfaces that are disposed substantially perpendicular to the respective top and bottom surfaces of the heat sink module, each conductive lead connector lies at least partially within a respective one of the plurality of grooves in the respective bottom surface of the heat sink module, the plurality of conductive lead connectors include a set of internal lead connectors and a set of external lead connectors, each of the set of internal lead connectors links at least two of the first through-holes in the respective sequence of first through-holes passed by the respective one of the plurality of grooves in the respective bottom surface of the heat sink module, and each of the set of external lead connectors links at least one of the first through-holes in the respective sequence of first through-holes passed by the respective one of the plurality of grooves in the respective bottom surface of the heat sink module to at least one of the one or more electrical driving surfaces of the driving circuit module that are disposed substantially perpendicular to the respective top and bottom surfaces of the heat sink module.

In some embodiments, the system further includes a plurality of laser diodes, where each of the plurality of laser diodes is disposed in a respective one of the plurality of first through-holes in the heat sink module, said each laser diode includes a respective laser diode body, a respective set of conductive leads, and a respective conductive support plate disposed between the respective laser diode body and the respective set of conductive leads of said each laser diode, the respective conductive support plate of said each laser diode is disposed on the top surface of the heat sink module, and the respective set of conductive leads of said each laser diode are disposed within the respective one of the plurality of first through-holes in the heat sink module.

In some embodiments, the driving circuit module includes a respective insulation tube disposed within each first through-hole.

In some embodiments, each internal lead connector includes a U-shaped conductor with a first arm and a second arm connected by a linear body, wherein each of the first and second arms of the U-shaped conductor is disposed within a respective one of the two first through-holes connected by the internal lead connector, and the linear body is disposed within the respective groove that passes through the two first through-holes.

In some embodiments, the respective set of conductive leads of the respective laser diode disposed include a respective cathode lead and a respective anode lead, and wherein each U-shaped conductor connects the respective cathode lead of one laser diode to the respective anode lead of another laser diode along the plurality of laser diodes.

In some embodiments, each external lead connector includes an L-shaped conductor with a first leg and a second leg, wherein first leg of the L-shaped conductor is disposed within a respective first through-hole and the second leg is disposed within the respective groove that passes through the respective first through-hole and conductively connected to at least one of the one or more electrical driving surfaces of the driving circuit module.

In some embodiments, each L-shaped conductor connects the respective cathode lead or anode lead of one laser diode to at least one of the one or more electrical driving surfaces of the driving circuit module.

In some embodiments, the system further includes a cooling module, wherein the cooling module includes a plurality of cooling rods that are disposed between the top and bottom surfaces of the heat sink module, and includes a heat dissipater that is connected to the plurality of cooling rods and disposed outside of the heat sink module.

In some embodiments, the heat sink module includes a plurality of interconnected channels between the top and bottom surfaces of the heat sink module, wherein the plurality of interconnected channels are configured to transport a cooling liquid between an inlet and an outlet, and wherein the plurality of first through-holes are separated from the cooling liquid by respective metal tube connecting the top and bottom surfaces of the heat sink module, and inner surfaces of plurality of first through-holes comprises inner surfaces of the metal tubes.

In some embodiments, the system includes a cooling tube disposed between the top and bottom surfaces of the heat sink module for transporting a cooling liquid between the top and bottom surfaces of the heat sink module.

In some embodiments, the heat sink module includes a plurality of channels that run parallel to the plurality of grooves in the respective bottom surface of the heat sink module, and wherein the cooling tube includes a plurality of parallel segments that are disposed within the plurality of channels, and a plurality of turning segments each connecting a respective pair of adjacent parallel segments of the cooling tube. In some embodiments, the plurality of channels are open channels in the top surface of the heat sink module. In some embodiments, the plurality of channels are open channels in the bottom surface of the heat sink module. In some embodiments, the plurality of channels are internal channels disposed between the top and bottom surfaces of the heat sink module.

In some embodiments, the heat sink module includes a plurality of interconnected channels between the top and bottom surfaces of the heat sink module, wherein the plurality of interconnected channels are configured to transport a cooling liquid between an inlet and an outlet, and wherein the plurality of first through-holes exist within rows of solid material between the top and bottom surfaces of the heat sink module.

In some embodiments, the cooling tube passes through at least one of the one or more electrical driving surfaces that are disposed substantially perpendicular to the respective top and bottom surfaces of the heat sink module.

In some embodiments, the cooling tube does not pass through the one or more electrical driving surfaces that are disposed substantially perpendicular to the respective top and bottom surfaces of the heat sink module.

In some embodiments, the system includes a cooling module, wherein the cooling module includes a respective first surface, a respective second surface opposite to the respective first surface of the cooling module, and one or more cooling channels embedded between the respective first surface and the respective second surface of the cooling module, and the respective first surface of the cooling module is disposed next to the heat sink module and is in thermal contact with the bottom surface of the heat sink module. In some embodiments, the system includes a cooling tube disposed between the first and second surfaces of the cooling module for transporting a cooling liquid between the first and second surfaces of the heat sink module.

In some embodiments, the one or more cooling channels include a plurality of channels that run parallel to the plurality of grooves in the respective bottom surface of the heat sink module, and wherein the cooling tube includes a plurality of parallel segments that are disposed within the plurality of channels, and a plurality of turning segments each connecting a respective pair of adjacent parallel segments of the cooling tube. In some embodiments, the plurality of channels are open channels in the top surface of the cooling module. In some embodiments, the plurality of channels are open channels in the bottom surface of the cooling module. In some embodiments, the plurality of channels are internal channels disposed between the top and bottom surfaces of the cooling module.

In some embodiments, the system includes a lens support module (e.g., any the lens array substrate layers shown in FIGS. 2B-2D, 2H, 2L-2M, and 2X-2Y, and variations thereof as described herein), wherein: the lens support module includes a respective top surface, a respective bottom surface opposite to the respective top surface of the lens support module, and a plurality of second through-holes linking the respective top surface and the respective bottom surface of the lens support module, and the respective bottom surface of the lens support module is disposed above the top surface of the heat sink module, and the plurality of second through-holes in the lens support module are aligned with the plurality of first through-holes in the heat sink module.

In some embodiments, each laser diode has the respective laser diode body thereof disposed at least partially within a respective lower portion of a respective one of the plurality of second through-holes in the lens support module.

In some embodiments, a respective lens disposed at least partially within a respective upper portion of each of the plurality of second through-holes in the lens support module, wherein the respective lens is separated from the laser diode body in the respective lower portion of said each second through-hole by a respective gap.

In some embodiments, the lens support module comprises a top plate and a bottom plate bonded to the top plate, and wherein the top plate includes a plurality of first holes forming the respective cylindrical upper portions of the plurality of second through-holes, and the bottom plate includes a plurality of second holes forming the respective cylindrical lower portions of the plurality of second through-holes.

In some embodiments, the system includes a lens module disposed above the top surface of the heat sink module, the lens module includes a planar surface with a plurality of lens domes on the planar surface, wherein the plurality of lens domes are aligned with the plurality of first through holes in the heat sink module.

In some embodiments, the first through-holes are straight through-holes with no steps along the respective bodies of the first through-holes. In some embodiments, the second through-holes are straight through-holes with no steps along the respective bodies of the second through-holes. In some embodiments, the diameter of each first through-hole is smaller than the diameter of the support plate of a corresponding laser diode that has its conductive leads disposed within said each first through-hole. In some embodiments, the diameter of each second through-hole is larger than the diameter of the support plate of said corresponding laser diode.

In the above detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are only used to distinguish one element from another. For example, a first lens array could be termed a second lens array, and, similarly, a second lens array could be termed a first array, without departing from the scope of the various described embodiments. The first lens array and the second lens array are both lens arrays, but they are not the same lens arrays, unless the context clearly indicates otherwise.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The use of terminology such as "front," "back," "top," "bottom," "left," "right," "over," "above," and "below" throughout the specification and claims is for describing the relative positions of various components of the system(s) and relative positions of various parts of the various components described herein. Similarly, the use of any horizontal or vertical terms throughout the specification and claims is for describing the relative orientations of various components of the system(s) and the relative orientations of various parts of the various components described herein. Except where a relative orientation or position set forth below is explicitly stated in the description for a particular component, system, or device, the use of such terminology does not imply any particular positions or orientations of the system, device, component or part(s) thereof, relative to (1) the direction of the Earth's gravitational force, (2) the Earth ground surface or ground plane, (3) a direction that the system(s), device(s), or particular component(s) thereof may have in actual manufacturing, usage, or transportation; or (4) a surface that the system(s), device(s), or particular component(s) thereof may be disposed on during actual manufacturing, usage, or transportation.

A number of embodiments of the invention have been described. Nevertheless, it will be understood that various modifications may be made without departing from the spirit and scope of the inventions. For example, some processing steps may be carried out in a different order, modified, or omitted. The layout and configuration of the vibrating elements, electrodes, and electrical connections, may be varied.

The foregoing description has been provided with reference to specific embodiments. However, the illustrative discussions above are not intended to be exhaustive or to be limiting to the precise forms disclosed. Many modifications and variations are possible in view of the above teachings. The embodiments were chosen and described in order to best explain the principles disclosed and their practical applications, to thereby enable others to best utilize the disclosure and various embodiments with various modifications as are suited to the particular use contemplated.

The invention claimed is:

1. A system, comprising:
a heat sink module, wherein:
the heat sink module includes a respective top surface, a respective bottom surface opposite to the respective top surface of the heat sink module, and a plurality of first through-holes linking the respective top surface and the respective bottom surface of the heat sink module, and
the respective bottom surface of the heat sink module includes a plurality of grooves, wherein each groove passes through respective lower portions of a respective sequence of first through-holes among the plurality of first through-holes in the heat-sink module; and
a driving circuit module, wherein:
the driving circuit module includes a plurality of conductive connectors, and one or more electrical driving surfaces that are disposed substantially perpendicular to the respective top and bottom surfaces of the heat sink module, each conductive connector lies at least partially within a respective one of the plurality of grooves in the respective bottom surface of the heat sink module,
the plurality of conductive connectors include a set of internal connectors and a set of external connectors,
each of the set of internal connectors links at least two of the first through-holes in the respective sequence of first through-holes passed by the respective one of the plurality of grooves in the respective bottom surface of the heat sink module, and
each of the set of external connectors links at least one of the first through-holes in the respective sequence of first through-holes passed by the respective one of the plurality of grooves in the respective bottom surface of the heat sink module to at least one of the one or more electrical driving surfaces of the driving circuit module that are disposed substantially perpendicular to the respective top and bottom surfaces of the heat sink module.

2. The system of claim 1, including:
a plurality of laser diodes, wherein:
each of the plurality of laser diodes is disposed at least partially within a respective one of the plurality of first through-holes in the heat sink module,
said each laser diode includes a respective laser diode body, a respective set of conductive leads, and a respective support plate disposed between the respective laser diode body and the respective set of conductive leads of said each laser diode,
the respective set of conductive leads of said each laser diode are disposed within the respective one of the plurality of first through-holes in the heat sink module.

3. The system of claim 2, wherein the respective support plate of each laser diode is disposed on the top surface of the heat sink module.

4. The system of claim 3, wherein the plurality of first through-holes are straight through-holes with uniform widths.

5. The system of claim 2, wherein the respective support plate of each laser diode is disposed partially within a respective one of the plurality of first through-holes in the heat sink module.

6. The system of claim 2, further including:
a lens support module, wherein:
the lens support module includes a respective top surface, a respective bottom surface opposite to the respective top surface of the lens support module, and a plurality of second through-holes linking the respective top surface and the respective bottom surface of the lens support module, and
the respective bottom surface of the lens support module is disposed above the top surface of the heat sink module, and the plurality of second through-holes in the lens support module are aligned with the plurality of first through-holes in the heat sink module.

7. The system of claim 6, wherein, each laser diode has the respective laser diode body thereof disposed at least partially within a respective lower portion of a respective one of the plurality of second through-holes in the lens support module.

8. The system of claim 6, wherein the lens support module comprises a top plate and a bottom plate bonded to the top plate, and wherein the top plate includes a plurality of first holes forming the respective cylindrical upper portions of the plurality of second through-holes, and the bottom plate includes a plurality of second holes forming the respective cylindrical lower portions of the plurality of second through-holes.

9. The system of claim 6, further including:
a lens module disposed above the top surface of the heat sink module, the lens module includes a planar surface with a plurality of lens domes on the planar surface, wherein the plurality of lens domes are aligned with the plurality of first through holes in the heat sink module.

10. The system of claim 1, wherein each internal connector includes a U-shaped conductor with a first arm and a second arm connected by a linear body, wherein each of the first and second arms of the U-shaped conductor is disposed within a respective one of the two first through-holes connected by the internal connector, and the linear body is disposed within the respective groove that passes through the two first through-holes.

11. The system of claim 1, further including:
a cooling module, wherein the cooling module includes a plurality of cooling rods that are disposed between the top and bottom surfaces of the heat sink module, and includes a heat dissipater that is connected to the plurality of cooling rods and disposed outside of the heat sink module.

12. The system of claim 1, wherein the heat sink module includes a plurality of interconnected channels between the top and bottom surfaces of the heat sink module, wherein the plurality of interconnected channels are configured to transport a cooling liquid between an inlet and an outlet, and wherein the plurality of first through-holes are separated from the cooling liquid by respective metal tube connecting the top and bottom surfaces of the heat sink module, and inner surfaces of plurality of first through-holes comprises inner surfaces of the metal tubes.

13. The system of claim 1, wherein the heat sink module includes a plurality of interconnected channels between the top and bottom surfaces of the heat sink module, wherein the plurality of interconnected channels are configured to transport a cooling liquid between an inlet and an outlet, and wherein the plurality of first through-holes exist within rows of solid material between the top and bottom surfaces of the heat sink module.

14. The system of claim 1, further including:
a cooling tube disposed between the top and bottom surfaces of the heat sink module for transporting a cooling liquid between the top and bottom surfaces of the heat sink module.

15. The system of claim 14, wherein the heat sink module includes a plurality of channels that run parallel to the plurality of grooves in the respective bottom surface of the heat sink module, and wherein the cooling tube includes a plurality of parallel segments that are disposed within the plurality of channels, and a plurality of turning segments each connecting a respective pair of adjacent parallel segments of the cooling tube.

16. The system of claim 15, wherein the plurality of channels are open channels in the top surface of the heat sink module.

17. The system of claim 15, wherein the plurality of channels are open channels in the bottom surface of the heat sink module.

18. The system of claim 15, wherein the plurality of channels are internal channels disposed between the top and bottom surfaces of the heat sink module.

19. The system of claim 14, wherein the cooling tube passes through at least one of the one or more electrical driving surfaces that are disposed substantially perpendicular to the respective top and bottom surfaces of the heat sink module.

20. The system of claim 14, wherein the cooling tube does not pass through the one or more electrical driving surfaces that are disposed substantially perpendicular to the respective top and bottom surfaces of the heat sink module.

21. The system of claim 1, further including:
 a cooling module, wherein:
  the cooling module includes a respective first surface, a respective second surface opposite to the respective first surface of the cooling module, and one or more cooling channels embedded between the respective first surface and the respective second surface of the cooling module, and
  the respective first surface of the cooling module is disposed next to the heat sink module and is in thermal contact with the bottom surface of the heat sink module.

22. The system of claim 21, further including:
 a cooling tube disposed between the first and second surfaces of the cooling module for transporting a cooling liquid between the first and second surfaces of the heat sink module.

\* \* \* \* \*